United States Patent
Gray et al.

(10) Patent No.: US 11,822,358 B2
(45) Date of Patent: Nov. 21, 2023

(54) DRIVE-SENSE CIRCUIT TO DETERMINE EFFECTS OF DIFFERENT ELECTRICAL CHARACTERISTICS ON LOAD

(71) Applicant: SigmaSense, LLC., Wilmington, DE (US)

(72) Inventors: Patrick Troy Gray, Cedar Park, TX (US); Michael Shawn Gray, Dripping Springs, TX (US); Daniel Keith Van Ostrand, Leander, TX (US); Richard Stuart Seger, Jr., Belton, TX (US); Timothy W. Markison, Mesa, AZ (US)

(73) Assignee: SigmaSense, LLC., Wilmington, DE (US)

( * ) Notice: Subject to any disclaimer, the term of this patent is extended or adjusted under 35 U.S.C. 154(b) by 139 days.

(21) Appl. No.: 17/448,647

(22) Filed: Sep. 23, 2021

(65) Prior Publication Data
US 2022/0011794 A1    Jan. 13, 2022

Related U.S. Application Data

(63) Continuation-in-part of application No. 17/301,346, filed on Mar. 31, 2021, now Pat. No. 11,513,543, (Continued)

(51) Int. Cl.
  *G11C 7/00*    (2006.01)
  *G05F 1/46*    (2006.01)
  (Continued)

(52) U.S. Cl.
  CPC ............... *G05F 1/46* (2013.01); *G01D 5/14* (2013.01); *G11C 16/26* (2013.01)

(58) Field of Classification Search
  CPC ....... G11C 7/1051; G11C 7/22; G11C 7/1072; G11C 7/1006; G11C 7/1066
  (Continued)

(56) References Cited

U.S. PATENT DOCUMENTS 5,828,601 A * 10/1998 Hollmer ............ G11C 11/5628
                                                      365/210.15
6,107,882 A *  8/2000 Gabara ............... H03F 3/45237
                                                         330/253
(Continued)

FOREIGN PATENT DOCUMENTS

CN     103995626 A     8/2014
CN     104182105 A    12/2014
(Continued)

OTHER PUBLICATIONS

Baker; How delta-sigma ADCs work. Part 1; Analog Applications Journal; Oct. 1, 2011; 6 pgs.
(Continued)

*Primary Examiner* — Son T Dinh
(74) *Attorney, Agent, or Firm* — GARLICK & MARKISON; H. Shannon Tyson

(57) ABSTRACT

A drive-sense circuit module (DSC) includes at least one regulated source circuit coupled to a load, and to a loop correction circuit. The regulated source circuit generates a power signal, which has a regulated characteristic and a controlled characteristic. At least one reference circuit applies a reference signal to the loop correction circuit that establishes a reference value of the controlled characteristic. The loop correction circuit senses an effect of one or more load characteristics on a sensed value of the controlled characteristic of the power signal, and generates a comparison signal based on the sensed value and the reference value of the controlled characteristic. A regulation signal is generated based on the comparison signal, and used to regulate the regulated characteristic of the power signal. A control module, including a processor, controls the regulated source circuit and the loop correction circuit to iterate through a
(Continued)

plurality of different regulated characteristics and different controlled characteristics.

20 Claims, 56 Drawing Sheets

Related U.S. Application Data which is a continuation-in-part of application No. 16/113,379, filed on Aug. 27, 2018, now Pat. No. 11,099,032.

(51) Int. Cl.
    *G01D 5/14*           (2006.01)
    *G11C 16/26*         (2006.01)

(58) Field of Classification Search
    USPC .................................... 365/189.14, 189.07
    See application file for complete search history.

(56) References Cited

U.S. PATENT DOCUMENTS

| | | |
|---|---|---|
| 6,218,972 B1 | 4/2001 | Groshong |
| 6,665,013 B1 | 12/2003 | Fossum et al. |
| 7,528,755 B2 | 5/2009 | Hammerschmidt |
| 8,031,094 B2 | 10/2011 | Hotelling |
| 8,089,289 B1 | 1/2012 | Kremin et al. |
| 8,279,180 B2 | 10/2012 | Hotelling et al. |
| 8,537,110 B2 | 9/2013 | Kruglick |
| 8,547,114 B2 | 10/2013 | Kremin |
| 8,587,535 B2 | 11/2013 | Oda et al. |
| 8,625,726 B2 | 1/2014 | Kuan |
| 8,657,681 B2 | 2/2014 | Kim |
| 8,966,400 B2 | 2/2015 | Yeap |
| 8,982,097 B1 | 3/2015 | Kuzo et al. |
| 9,081,437 B2 | 7/2015 | Oda |
| 9,201,547 B2 | 12/2015 | Elias |
| 10,007,335 B2 | 6/2018 | Lee |
| 2011/0063154 A1 | 3/2011 | Hotelling et al. |
| 2011/0298745 A1 | 12/2011 | Souchkov |
| 2012/0278031 A1 | 11/2012 | Oda |
| 2013/0278447 A1 | 10/2013 | Kremin |
| 2013/0307616 A1 | 11/2013 | Berchtold |
| 2014/0327644 A1 | 11/2014 | Mohindra |
| 2015/0091847 A1 | 4/2015 | Chang |
| 2015/0346889 A1 | 12/2015 | Chen |
| 2016/0162002 A1 | 6/2016 | Liang |
| 2016/0188049 A1 | 6/2016 | Yang et al. |
| 2018/0157354 A1 | 6/2018 | Blondin et al. |
| 2018/0275824 A1 | 9/2018 | Li |

FOREIGN PATENT DOCUMENTS

| | | |
|---|---|---|
| JP | 59135685 A | 8/1984 |
| KR | 102015002202 A | 1/2015 |

OTHER PUBLICATIONS

Brian Pisani, "Digital Filter Types in Delta-Sigma ADCs", Application Report SBAA230, May 2017, pp. 1-8, Texas Instruments Incorporated, Dallas, Texas.

International Search Authority; International Search Report and Written Opinion; Application No. PCT/US2019/048081; dated Dec. 12, 2019; 8 pgs.

\* cited by examiner computing device 12 computing device 18 computing subsystem 25 computing subsystem 25

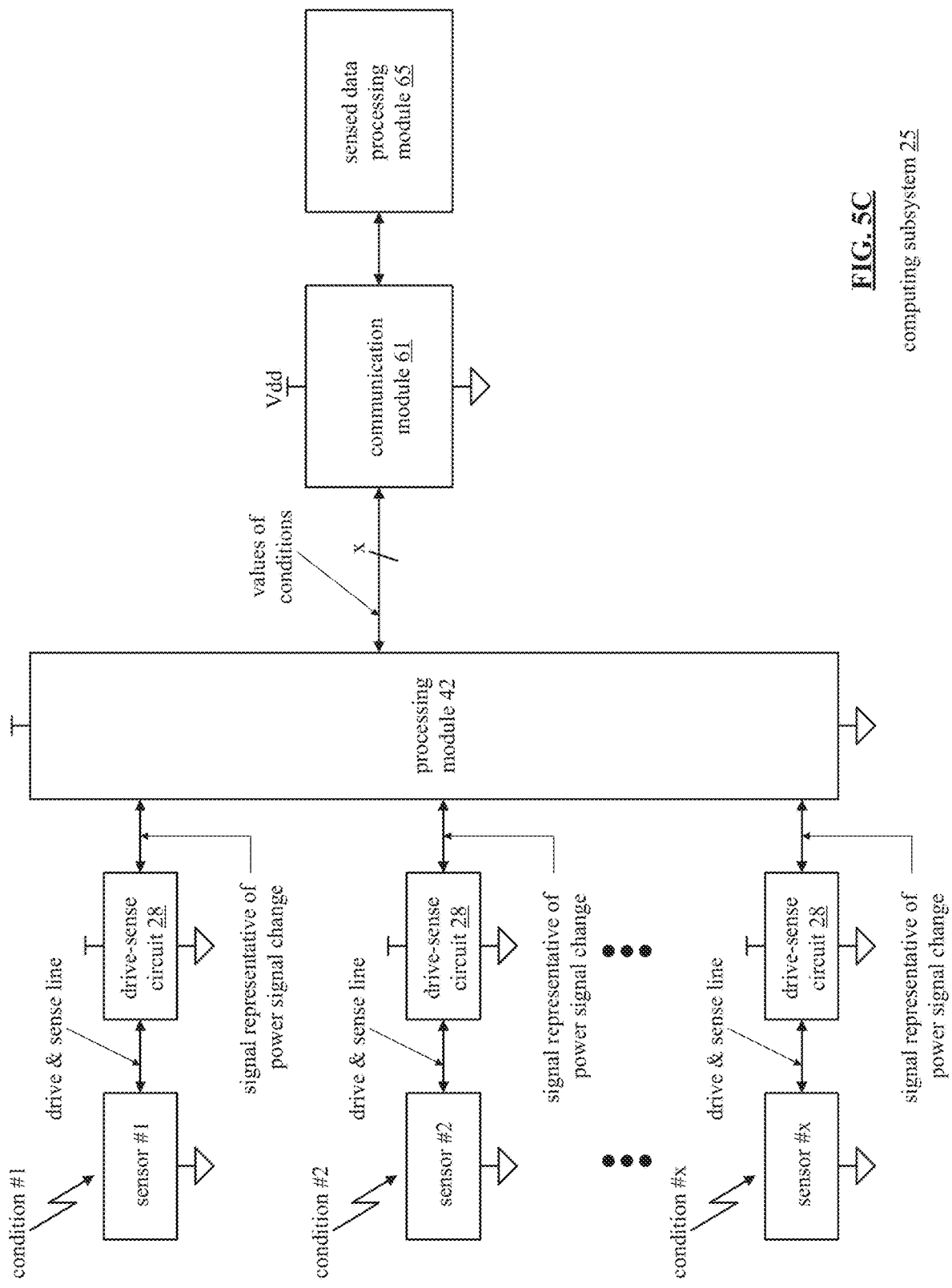

computing subsystem 25

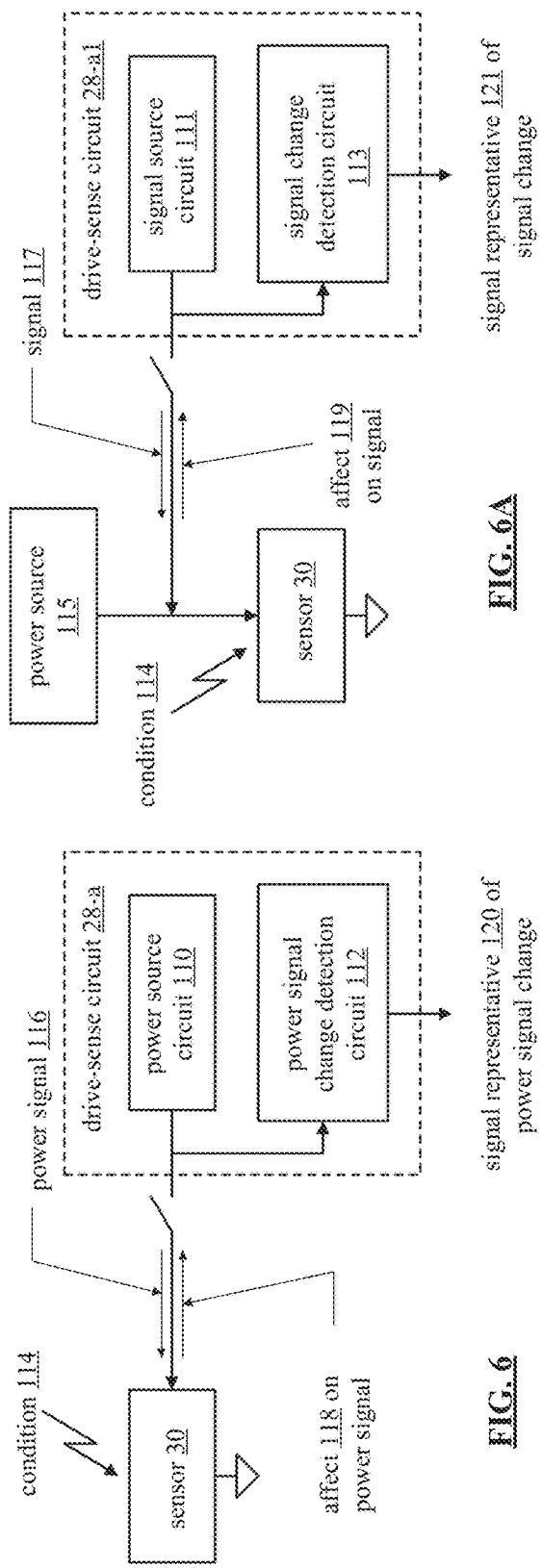
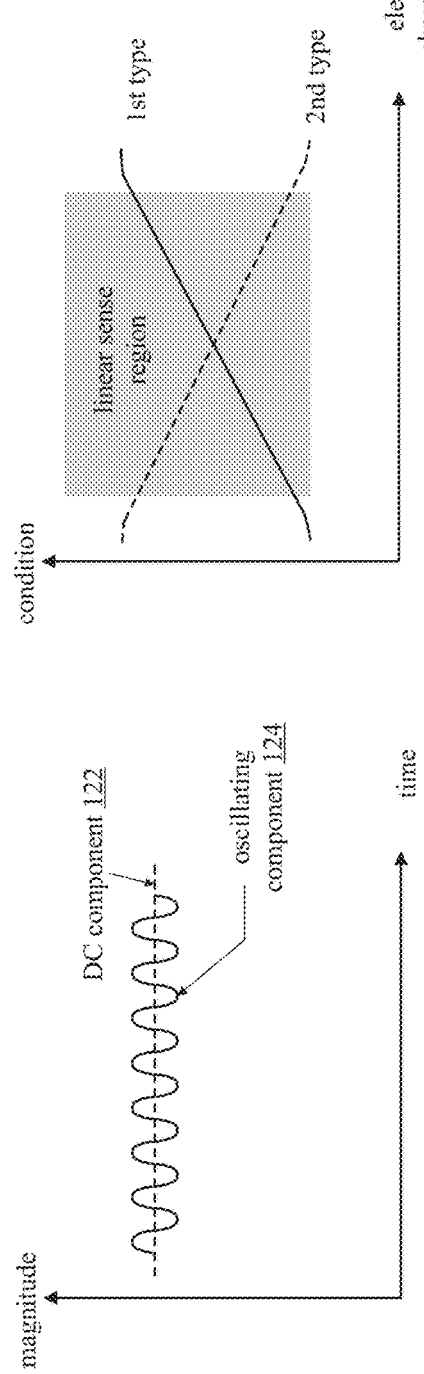

power signal graph power signal graph power signal graph power signal graph drive-sense circuit 28 drive-sense circuit 28 drive-sense circuit 28-f1 drive-sense circuit 28-g1 drive-sense circuit 28-g2 drive-sense circuit 28-h1 drive-sense circuit 28-b2 drive-sense circuit 28-i1

DRIVE-SENSE CIRCUIT TO DETERMINE EFFECTS OF DIFFERENT ELECTRICAL CHARACTERISTICS ON LOAD

CROSS-REFERENCE TO RELATED APPLICATIONS

The present U.S. Utility patent application claims priority pursuant to 35 U.S.C. § 120 as a continuation-in-part of U.S. Utility application Ser. No. 17/301,346, entitled "IMPEDANCE DETECT DRIVE SENSE CIRCUIT," filed Mar. 31, 2021, which is a continuation-in-part of U.S. Utility application Ser. No. 16/113,379, entitled "DRIVE SENSE CIRCUIT WITH DRIVE-SENSE LINE," filed Aug. 27, 2018, now issued as U.S. Pat. No. 11,099,032 on Aug. 24, 2021, which are hereby incorporated herein by reference in their entirety and made part of the present U.S. Utility patent application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to data communication systems and more particularly to sensed data collection and/or communication.

Description of Related Art

Sensors are used in a wide variety of applications ranging from in-home automation, to industrial systems, to health care, to transportation, and so on. For example, sensors are placed in bodies, automobiles, airplanes, boats, ships, trucks, motorcycles, cell phones, televisions, touch-screens, industrial plants, appliances, motors, checkout counters, etc. for the variety of applications.

In general, a sensor converts a physical quantity into an electrical or optical signal. For example, a sensor converts a physical phenomenon, such as a biological condition, a chemical condition, an electric condition, an electromagnetic condition, a temperature, a magnetic condition, mechanical motion (position, velocity, acceleration, force, pressure), an optical condition, and/or a radioactivity condition, into an electrical signal.

A sensor includes a transducer, which functions to convert one form of energy (e.g., force) into another form of energy (e.g., electrical signal). There are a variety of transducers to support the various applications of sensors. For example, a transducer is a capacitor, a piezoelectric transducer, a piezoresistive transducer, a thermal transducer, a thermalcouple, a photoconductive transducer such as a photoresistor, a photodiode, and/or phototransistor.

A sensor circuit is coupled to a sensor to provide the sensor with power and to receive the signal representing the physical phenomenon from the sensor. The sensor circuit includes at least three electrical connections to the sensor: one for a power supply; another for a common voltage reference (e.g., ground); and a third for receiving the signal representing the physical phenomenon. The signal representing the physical phenomenon will vary from the power supply voltage to ground as the physical phenomenon changes from one extreme to another (for the range of sensing the physical phenomenon).

The sensor circuits provide the received sensor signals to one or more computing devices for processing. A computing device is known to communicate data, process data, and/or store data. The computing device may be a cellular phone, a laptop, a tablet, a personal computer (PC), a work station, a video game device, a server, and/or a data center that support millions of web searches, stock trades, or on-line purchases every hour.

The computing device processes the sensor signals for a variety of applications. For example, the computing device processes sensor signals to determine temperatures of a variety of items in a refrigerated truck during transit. As another example, the computing device processes the sensor signals to determine a touch on a touch screen. As yet another example, the computing device processes the sensor signals to determine various data points in a production line of a product.

BRIEF DESCRIPTION OF THE SEVERAL VIEWS OF THE DRAWING(S)

FIG. 5C is a schematic block diagram of another embodiment of a computing subsystem in accordance with the present invention;

FIG. 6 is a schematic block diagram of an embodiment of a drive sense circuit in accordance with the present invention;

FIG. 6A is a schematic block diagram of another embodiment of a drive sense circuit in accordance with the present invention;

FIG. 7 is an example of a power signal graph in accordance with the present invention;

FIG. 8 is an example of a sensor graph in accordance with the present invention;

Figure 58:
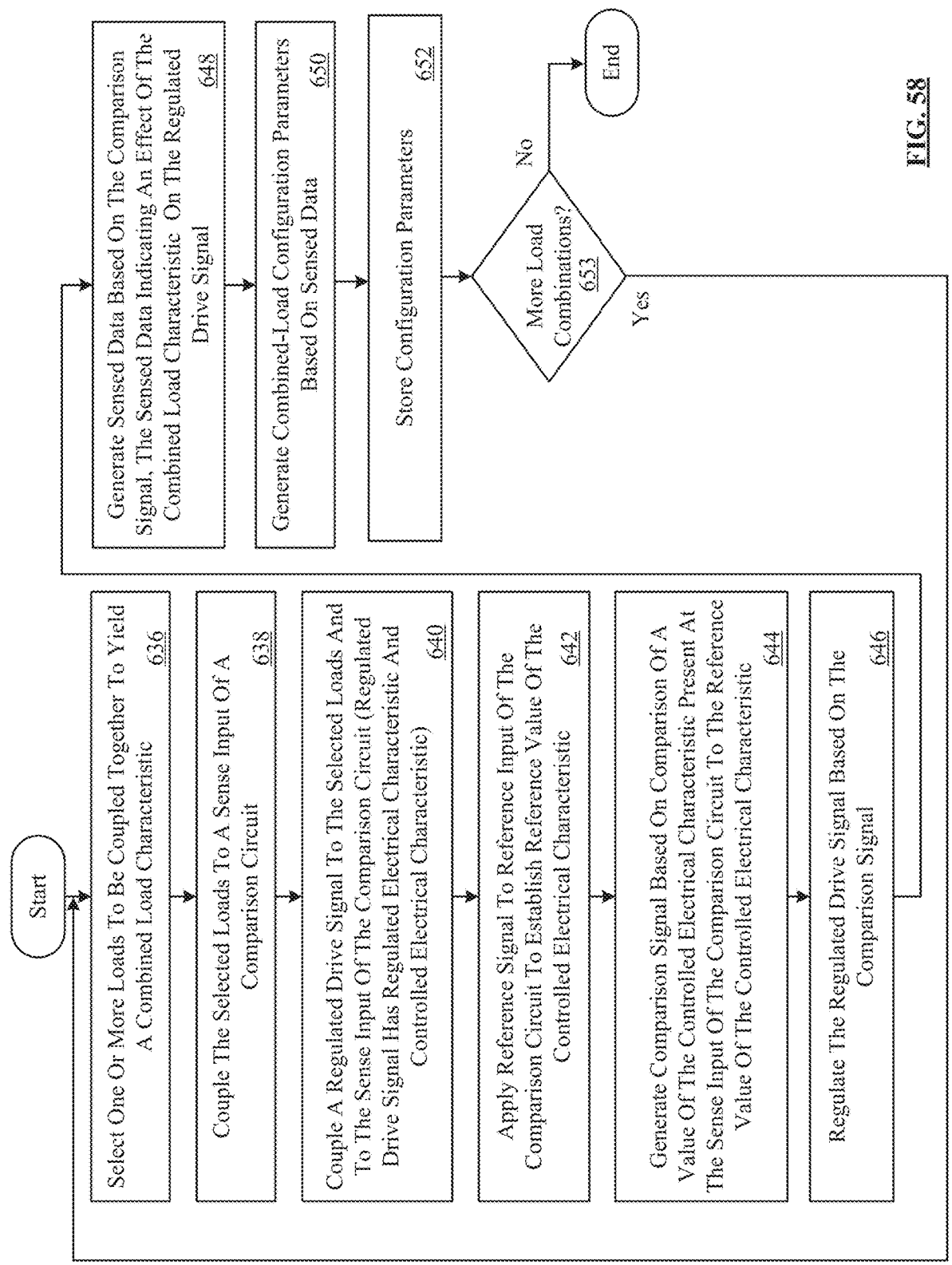
Figure 59:
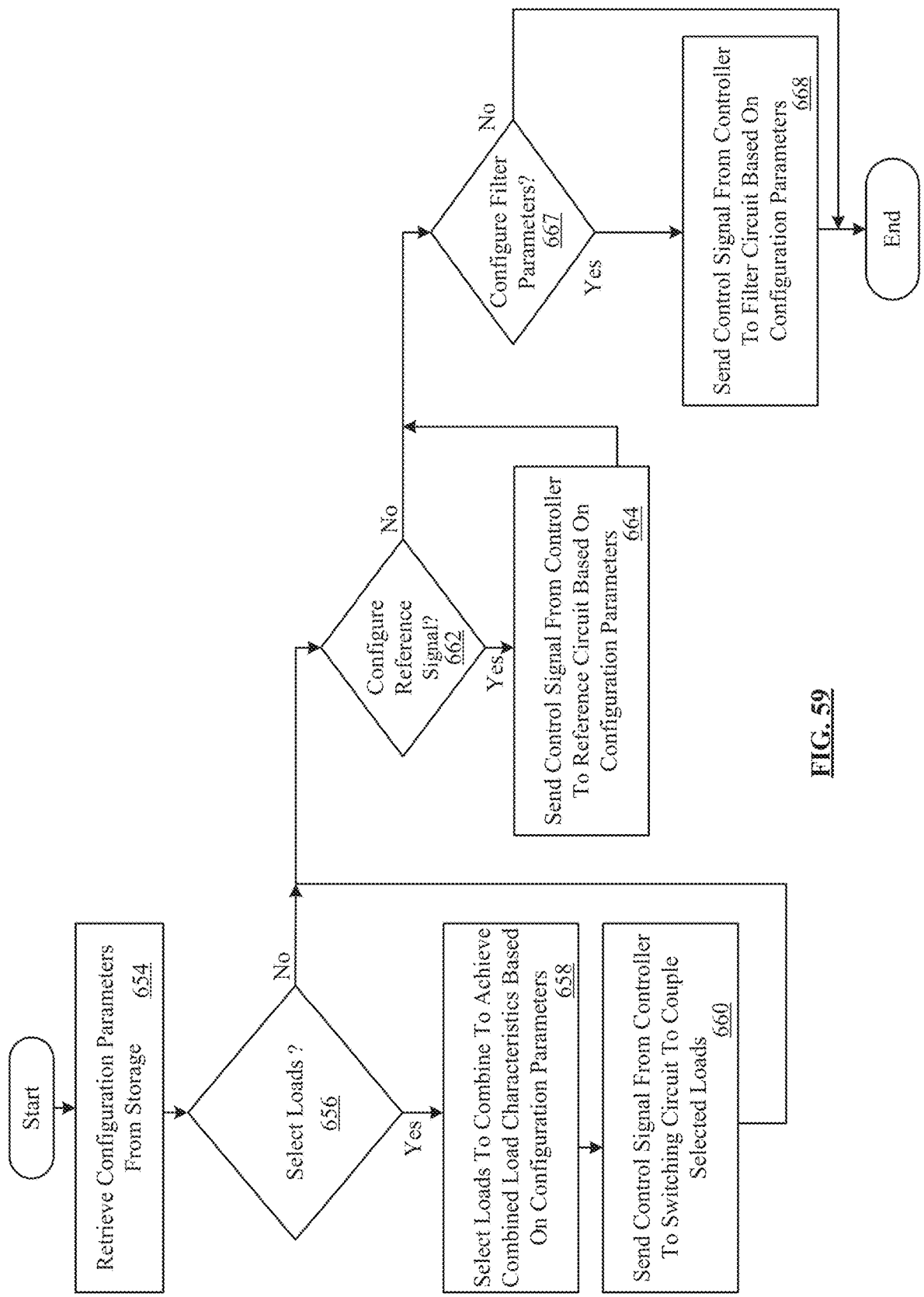

FIG. 58 is a flow chart illustrating a method of combining multiple load signals to generate configuration parameters reflecting combined load characteristics, in accordance with various embodiments of the present invention; and FIG. 59 is a flow chart illustrating a method of configuring a load and/or a drive sense circuit module based on previously characterized load combinations, in accordance with various embodiments of the present invention.

DETAILED DESCRIPTION OF THE INVENTION

Figure 1:
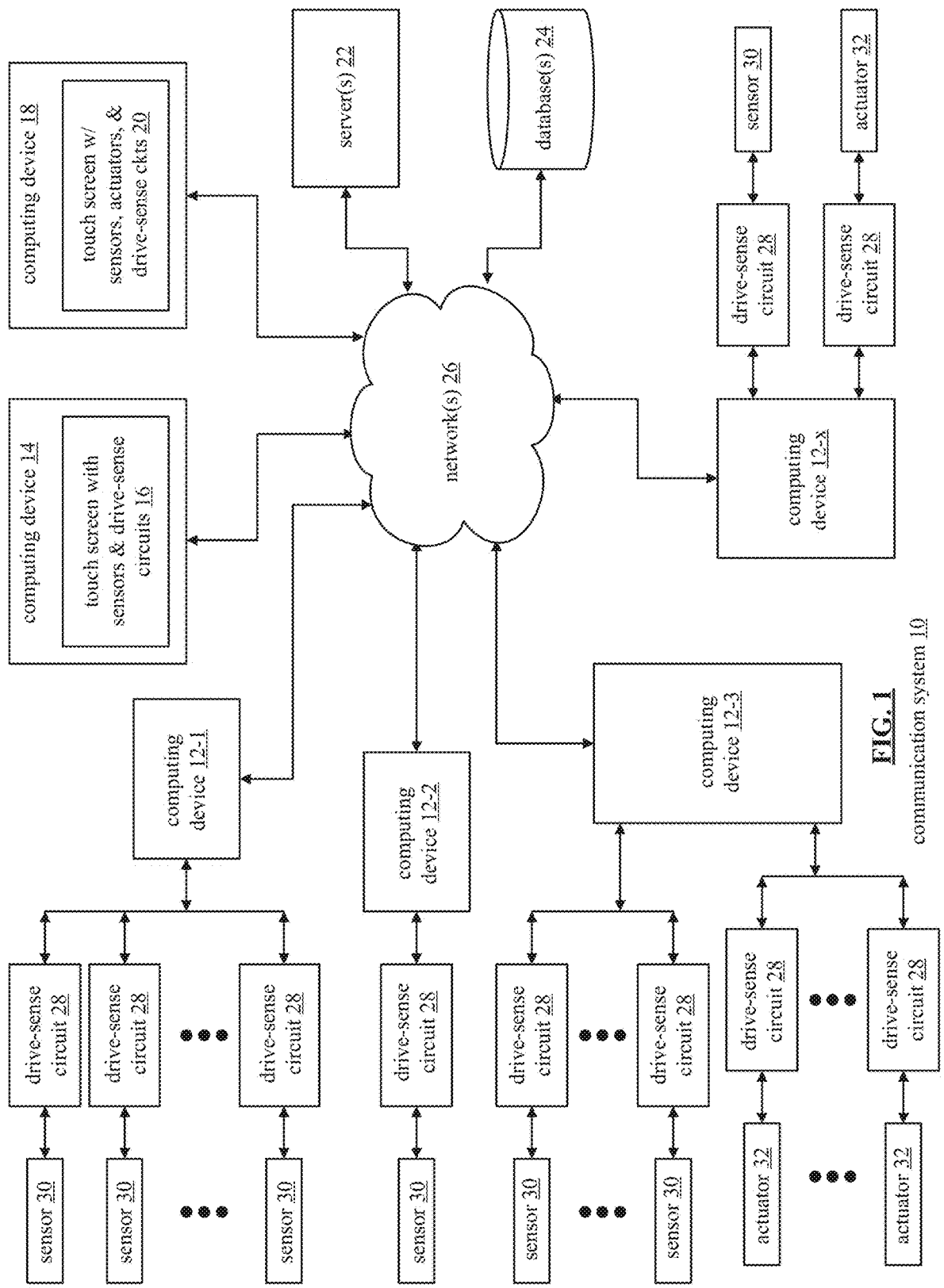
FIG. 1 is a schematic block diagram of an embodiment of a communication system in accordance with the present invention.

FIG. 1 is a schematic block diagram of an embodiment of a communication system 10 that includes a plurality of computing. devices 12-10, one or more servers 22, one or more databases 24, one or more networks 26, a plurality of drive-sense circuits 28, a plurality of sensors 30, and a plurality of actuators 32. Computing devices 14 include a touch screen 16 with sensors and drive-sensor circuits and computing devices 18 include a touch and tactile screen 20 that includes sensors, actuators, and drive-sense circuits.

A sensor 30 functions to convert a physical input into an electrical output and/or an optical output. The physical input of a sensor may be one of a variety of physical input conditions. For example, the physical condition includes one or more of, but is not limited to, acoustic waves (e.g., amplitude, phase, polarization, spectrum, and/or wave velocity); a biological and/or chemical condition (e.g., fluid concentration, level, composition, etc.); an electric condition (e.g., charge, voltage, current, conductivity, permittivity, eclectic field, which includes amplitude, phase, and/or polarization); a magnetic condition (e.g., flux, permeability, magnetic field, which amplitude, phase, and/or polarization); an optical condition (e.g., refractive index, reflectivity, absorption, etc.); a thermal condition (e.g., temperature, flux, specific heat, thermal conductivity, etc.); and a mechanical condition (e.g., position, velocity, acceleration, force, strain, stress, pressure, torque, etc.). For example, piezoelectric sensor converts force or pressure into an electric signal. As another example, a microphone converts audible acoustic waves into electrical signals.

There are a variety of types of sensors to sense the various types of physical conditions. Sensor types include, but are not limited to, capacitor sensors, inductive sensors, accelerometers, piezoelectric sensors, light sensors, magnetic field sensors, ultrasonic sensors, temperature sensors, infrared (IR) sensors, touch sensors, proximity sensors, pressure sensors, level sensors, smoke sensors, and gas sensors. In many ways, sensors function as the interface between the physical world and the digital world by converting real world conditions into digital signals that are then processed by computing devices for a vast number of applications including, but not limited to, medical applications, production automation applications, home environment control, public safety, and so on.

The various types of sensors have a variety of sensor characteristics that are factors in providing power to the sensors, receiving signals from the sensors, and/or interpreting the signals from the sensors. The sensor characteristics include resistance, reactance, power requirements, sensitivity, range, stability, repeatability, linearity, error, response time, and/or frequency response. For example, the resistance, reactance, and/or power requirements are factors in determining drive circuit requirements. As another example, sensitivity, stability, and/or linear are factors for interpreting the measure of the physical condition based on the received electrical and/or optical signal (e.g., measure of temperature, pressure, etc.).

An actuator 32 converts an electrical input into a physical output. The physical output of an actuator may be one of a variety of physical output conditions. For example, the physical output condition includes one or more of, but is not limited to, acoustic waves (e.g., amplitude, phase, polarization, spectrum, and/or wave velocity); a magnetic condition (e.g., flux, permeability, magnetic field, which amplitude, phase, and/or polarization); a thermal condition (e.g., temperature, flux, specific heat, thermal conductivity, etc.); and a mechanical condition (e.g., position, velocity, acceleration, force, strain, stress, pressure, torque, etc.). As an example, a piezoelectric actuator converts voltage into force or pressure. As another example, a speaker converts electrical signals into audible acoustic waves.

An actuator 32 may be one of a variety of actuators. For example, an actuator 32 is one of a comb drive, a digital micro-mirror device, an electric motor, an electroactive polymer, a hydraulic cylinder, a piezoelectric actuator, a pneumatic actuator, a screw jack, a servomechanism, a solenoid, a stepper motor, a shape-memory allow, a thermal bimorph, and a hydraulic actuator.

The various types of actuators have a variety of actuators characteristics that are factors in providing power to the actuator and sending signals to the actuators for desired performance. The actuator characteristics include resistance, reactance, power requirements, sensitivity, range, stability, repeatability, linearity, error, response time, and/or frequency response. For example, the resistance, reactance, and power requirements are factors in determining drive circuit requirements. As another example, sensitivity, stability, and/or linear are factors for generating the signaling to send to the actuator to obtain the desired physical output condition.

The computing devices 12, 14, and 18 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. The computing devices 12, 14, and 18 will be discussed in greater detail with reference to one or more of FIGS. 2-4.

A server 22 is a special type of computing device that is optimized for processing large amounts of data requests in parallel. A server 22 includes similar components to that of the computing devices 12, 14, and/or 18 with more robust processing modules, more main memory, and/or more hard drive memory (e.g., solid state, hard drives, etc.). Further, a server 22 is typically accessed remotely; as such it does not generally include user input devices and/or user output devices. In addition, a server may be a standalone separate computing device and/or may be a cloud computing device.

A database 24 is a special type of computing device that is optimized for large scale data storage and retrieval. A database 24 includes similar components to that of the computing devices 12, 14, and/or 18 with more hard drive memory (e.g., solid state, hard drives, etc.) and potentially with more processing modules and/or main memory. Further, a database 24 is typically accessed remotely; as such it does not generally include user input devices and/or user output devices. In addition, a database 24 may be a standalone separate computing device and/or may be a cloud computing device.

The network 26 includes one more local area networks (LAN) and/or one or more wide area networks WAN), which may be a public network and/or a private network. A LAN may be a wireless-LAN (e.g., Wi-Fi access point, Bluetooth, ZigBee, etc.) and/or a wired network (e.g., Firewire, Ethernet, etc.). A WAN may be a wired and/or wireless WAN. For example, a LAN may be a personal home or business's wireless network and a WAN is the Internet, cellular telephone infrastructure, and/or satellite communication infrastructure.

In an example of operation, computing device 12-1 communicates with a plurality of drive-sense circuits 28, which, in turn, communicate with a plurality of sensors 30. The sensors 30 and/or the drive-sense circuits 28 are within the computing device 12-1 and/or external to it. For example, the sensors 30 may be external to the computing device 12-1 and the drive-sense circuits are within the computing device 12-1. As another example, both the sensors 30 and the drive-sense circuits 28 are external to the computing device 12-1. When the drive-sense circuits 28 are external to the computing device, they are coupled to the computing device 12-1 via wired and/or wireless communication links as will be discussed in greater detail with reference to one or more of FIGS. 5A-5C.

The computing device 12-1 communicates with the drive-sense circuits 28 to; (a) turn them on, (b) obtain data from the sensors (individually and/or collectively), (c) instruct the drive sense circuit on how to communicate the sensed data to the computing device 12-1, (d) provide signaling attributes (e.g., DC level, AC level, frequency, power level, regulated current signal, regulated voltage signal, regulation of an impedance, frequency patterns for various sensors, different frequencies for different sensing applications, etc.) to use with the sensors, and/or (e) provide other commands and/or instructions.

As a specific example, the sensors 30 are distributed along a pipeline to measure flow rate and/or pressure within a section of the pipeline. The drive-sense circuits 28 have their own power source (e.g., battery, power supply, etc.) and are proximally located to their respective sensors 30. At desired time intervals (milliseconds, seconds, minutes, hours, etc.), the drive-sense circuits 28 provide a regulated source signal or a power signal to the sensors 30. An electrical characteristic of the sensor 30 affects the regulated source signal or power signal, which is reflective of the condition (e.g., the flow rate and/or the pressure) that sensor is sensing.

The drive-sense circuits 28 detect the effects on the regulated source signal or power signals as a result of the electrical characteristics of the sensors. The drive-sense circuits 28 then generate signals representative of change to the regulated source signal or power signal based on the detected effects on the power signals. The changes to the regulated source signals or power signals are representative of the conditions being sensed by the sensors 30.

The drive-sense circuits 28 provide the representative signals of the conditions to the computing device 12-1. A representative signal may be an analog signal or a digital signal. In either case, the computing device 12-1 interprets the representative signals to determine the pressure and/or flow rate at each sensor location along the pipeline. The computing device may then provide this information to the server 22, the database 24, and/or to another computing device for storing and/or further processing.

As another example of operation, computing device 12-2 is coupled to a drive-sense circuit 28, which is, in turn, coupled to a senor 30. The sensor 30 and/or the drive-sense circuit 28 may be internal and/or external to the computing device 12-2. In this example, the sensor 30 is sensing a condition that is particular to the computing device 12-2. For example, the sensor 30 may be a temperature sensor, an ambient light sensor, an ambient noise sensor, etc. As described above, when instructed by the computing device 12-2 (which may be a default setting for continuous sensing or at regular intervals), the drive-sense circuit 28 provides the regulated source signal or power signal to the sensor 30 and detects an effect to the regulated source signal or power signal based on an electrical characteristic of the sensor. The drive-sense circuit generates a representative signal of the affect and sends it to the computing device 12-2.

In another example of operation, computing device 12-3 is coupled to a plurality of drive-sense circuits 28 that are coupled to a plurality of sensors 30 and is coupled to a plurality of drive-sense circuits 28 that are coupled to a plurality of actuators 32. The general functionality of the drive-sense circuits 28 coupled to the sensors 30 is in accordance with the above description.

Since an actuator 32 is essentially an inverse of a sensor in that an actuator converts an electrical signal into a physical condition, while a sensor converts a physical condition into an electrical signal, the drive-sense circuits 28 can be used to power actuators 32. Thus, in this example, the computing device 12-3 provides actuation signals to the drive-sense circuits 28 for the actuators 32. The drive-sense circuits modulate the actuation signals on to power signals or regulated control signals, which are provided to the actuators 32. The actuators 32 are powered from the power signals or regulated control signals and produce the desired physical condition from the modulated actuation signals.

As another example of operation, computing device 12-x is coupled to a drive-sense circuit 28 that is coupled to a sensor 30 and is coupled to a drive-sense circuit 28 that is coupled to an actuator 32. In this example, the sensor 30 and the actuator 32 are for use by the computing device 12-x. For example, the sensor 30 may be a piezoelectric microphone and the actuator 32 may be a piezoelectric speaker.

Figure 2:
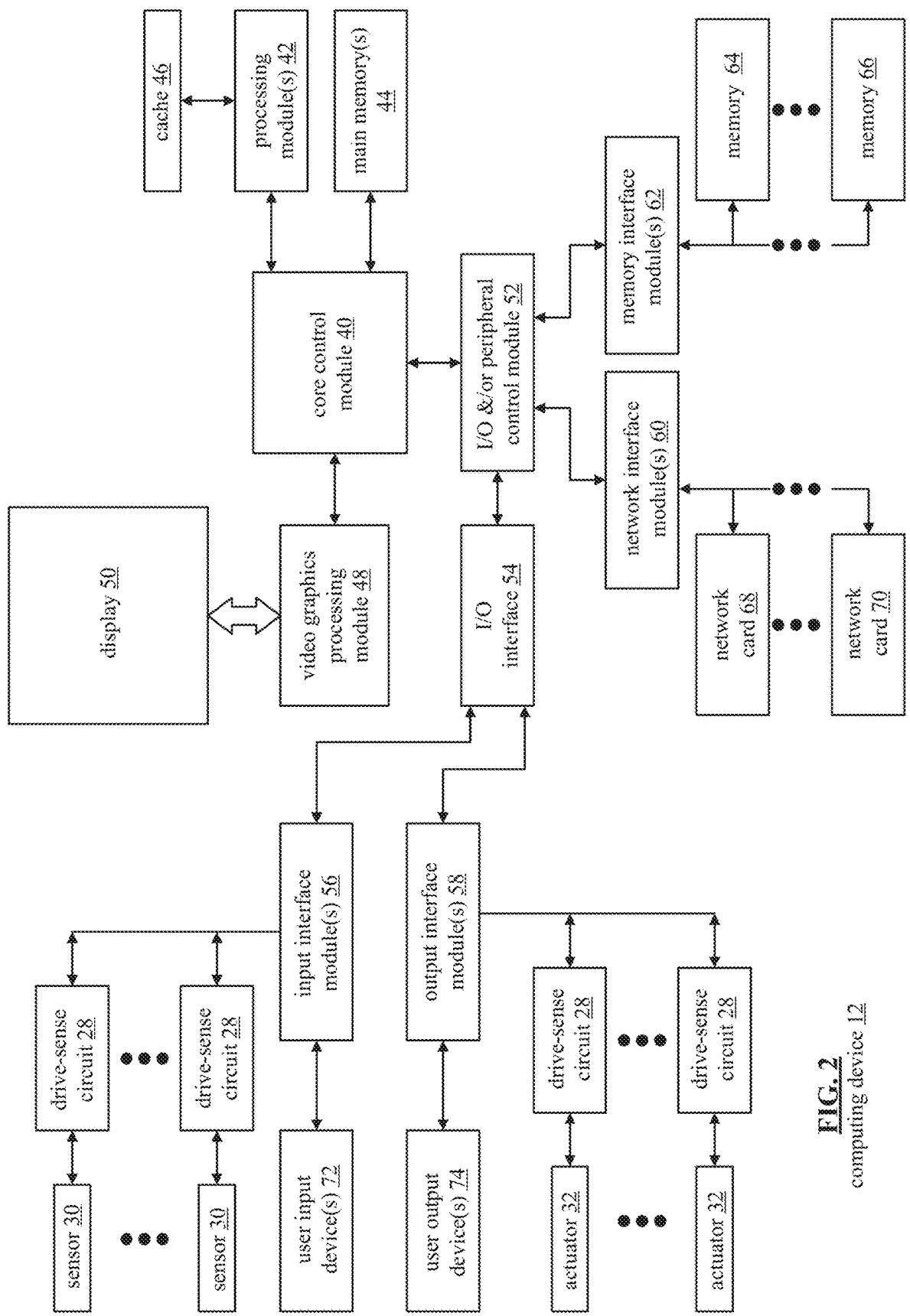
FIG. 2 is a schematic block diagram of an embodiment of a computing device in accordance with the present invention.

FIG. 2 is a schematic block diagram of an embodiment of a computing device 12 (e.g., any one of 12-1 through 12-x). The computing device 12 includes a core control module 40, one or more processing modules 42, one or more main memories 44, cache memory 46, a video graphics processing module 48, a display 50, an Input-Output (I/O) peripheral control module 52, one or more input interface modules 56, one or more output interface modules 58, one or more network interface modules 60, and one or more memory interface modules 62. A processing module 42 is described in greater detail at the end of the detailed description of the invention section and, in an alternative embodiment, has a direction connection to the main memory 44. In an alternate embodiment, the core control module 40 and the I/O and/or peripheral control module 52 are one module, such as a chipset, a quick path interconnect (QPI), and/or an ultra-path interconnect (UPI).

Each of the main memories 44 includes one or more Random Access Memory (RAM) integrated circuits, or chips. For example, a main memory 44 includes four DDR4 (4$^{th}$ generation of double data rate) RAM chips, each running at a rate of 2,400 MHz. In general, the main memory 44 stores data and operational instructions most relevant to the processing module 42. For example, the core control module 40 coordinates the transfer of data and/or operational instructions from the main memory 44 and the memory 64-66. The data and/or operational instructions retrieve from memory 64-66 are the data and/or operational instructions requested by the processing module or will most likely be needed by the processing module. When the processing module is done with the data and/or operational instructions in main memory, the core control module 40 coordinates sending updated data to the memory 64-66 for storage.

The memory 64-66 includes one or more hard drives, one or more solid state memory chips, and/or one or more other large capacity storage devices that, in comparison to cache memory and main memory devices, is/are relatively inexpensive with respect to cost per amount of data stored. The memory 64-66 is coupled to the core control module 40 via the I/O and/or peripheral control module 52 and via one or more memory interface modules 62. In an embodiment, the I/O and/or peripheral control module 52 includes one or more Peripheral Component Interface (PCI) buses to which peripheral components connect to the core control module 40. A memory interface module 62 includes a software driver and a hardware connector for coupling a memory device to the I/O and/or peripheral control module 52. For example, a memory interface 62 is in accordance with a Serial Advanced Technology Attachment (SATA) port.

The core control module 40 coordinates data communications between the processing module(s) 42 and the network(s) 26 via the I/O and/or peripheral control module 52, the network interface module(s) 60, and a network card 68 or 70. A network card 68 or 70 includes a wireless communication unit or a wired communication unit. A wireless communication unit includes a wireless local area network (WLAN) communication device, a cellular communication device, a Bluetooth device, and/or a ZigBee communication device. A wired communication unit includes a Gigabit LAN connection, a Firewire connection, and/or a proprietary computer wired connection. A network interface module 60 includes a software driver and a hardware connector for coupling the network card to the I/O and/or peripheral control module 52. For example, the network interface module 60 is in accordance with one or more versions of IEEE 802.11, cellular telephone protocols, 10/100/1000 Gigabit LAN protocols, etc.

The core control module 40 coordinates data communications between the processing module(s) 42 and input device(s) 72 via the input interface module(s) 56 and the I/O and/or peripheral control module 52. An input device 72 includes a keypad, a keyboard, control switches, a touchpad, a microphone, a camera, etc. An input interface module 56 includes a software driver and a hardware connector for coupling an input device to the I/O and/or peripheral control module 52. In an embodiment, an input interface module 56 is in accordance with one or more Universal Serial Bus (USB) protocols.

The core control module 40 coordinates data communications between the processing module(s) 42 and output device(s) 74 via the output interface module(s) 58 and the I/O and/or peripheral control module 52. An output device 74 includes a speaker, etc. An output interface module 58 includes a software driver and a hardware connector for coupling an output device to the I/O and/or peripheral control module 52. In an embodiment, an output interface module 56 is in accordance with one or more audio codec protocols.

The processing module 42 communicates directly with a video graphics processing module 48 to display data on the display 50. The display 50 includes an LED (light emitting diode) display, an LCD (liquid crystal display), and/or other type of display technology. The display has a resolution, an aspect ratio, and other features that affect the quality of the display. The video graphics processing module 48 receives data from the processing module 42, processes the data to produce rendered data in accordance with the characteristics of the display, and provides the rendered data to the display 50.

FIG. 2 further illustrates sensors 30 and actuators 32 coupled to drive-sense circuits 28, which are coupled to the input interface module 56 (e.g., USB port). Alternatively, one or more of the drive-sense circuits 28 is coupled to the computing device via a wireless network card (e.g., WLAN) or a wired network card (e.g., Gigabit LAN). While not shown, the computing device 12 further includes a BIOS (Basic Input Output System) memory coupled to the core control module 40.

Figure 3:
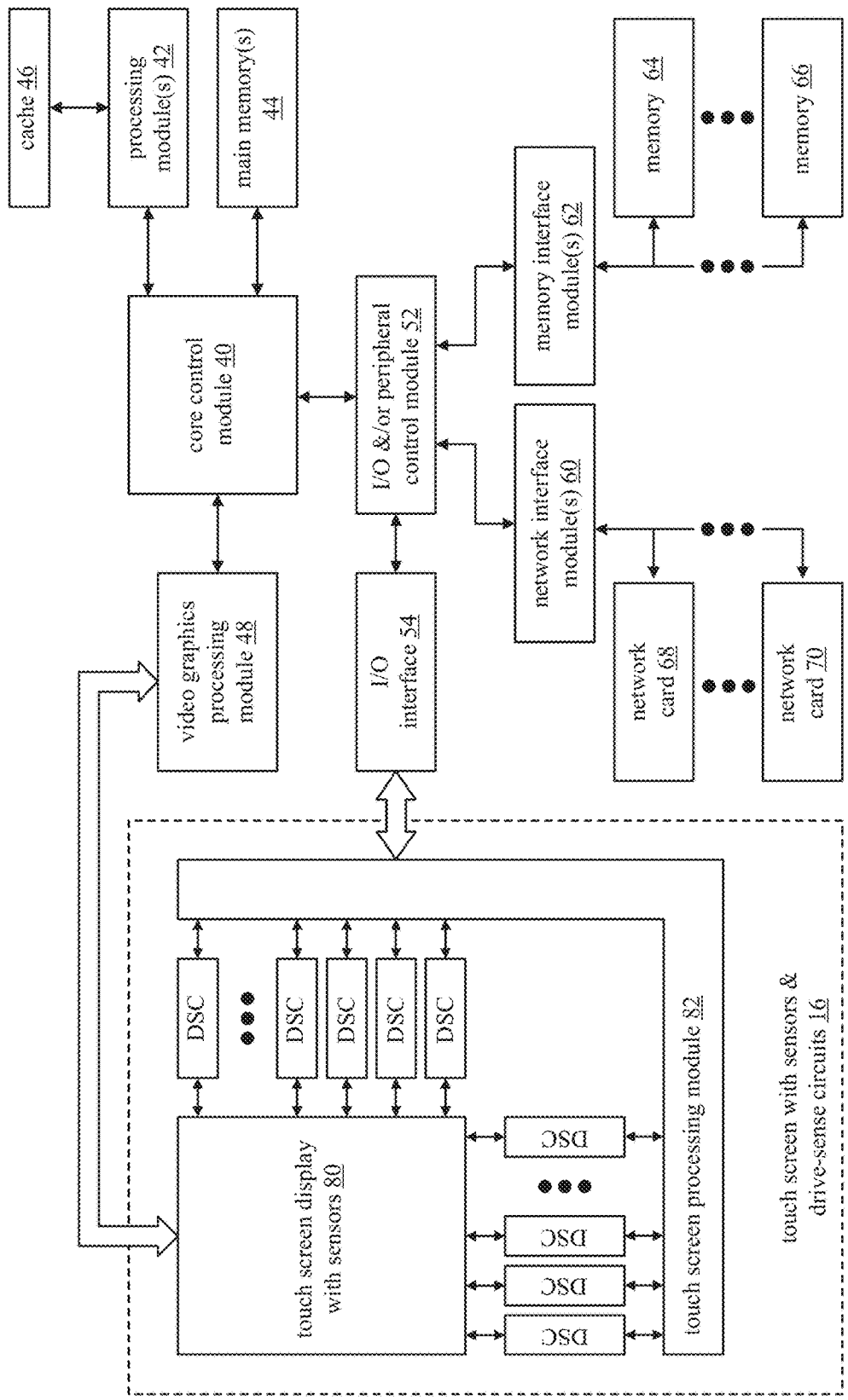
FIG. 3 is a schematic block diagram of another embodiment of a computing device in accordance with the present invention.

FIG. 3 is a schematic block diagram of another embodiment of a computing device 14 that includes a core control module 40, one or more processing modules 42, one or more main memories 44, cache memory 46, a video graphics processing module 48, a touch screen 16, an Input-Output (I/O) peripheral control module 52, one or more input interface modules 56, one or more output interface modules 58, one or more network interface modules 60, and one or more memory interface modules 62. The touch screen 16 includes a touch screen display 80, a plurality of sensors 30, a plurality of drive-sense circuits (DSC), and a touch screen processing module 82.

Computing device 14 operates similarly to computing device 12 of FIG. 2 with the addition of a touch screen as an input device. The touch screen includes a plurality of sensors (e.g., electrodes, capacitor sensing cells, capacitor sensors, inductive sensor, etc.) to detect a proximal touch of the screen. For example, when one or more fingers touches the screen, capacitance of sensors proximal to the touch(es) are affected (e.g., impedance changes). The drive-sense circuits (DSC) coupled to the affected sensors detect the change and provide a representation of the change to the touch screen processing module 82, which may be a separate processing module or integrated into the processing module 42.

The touch screen processing module 82 processes the representative signals from the drive-sense circuits (DSC) to determine the location of the touch(es). This information is inputted to the processing module 42 for processing as an input. For example, a touch represents a selection of a button on screen, a scroll function, a zoom in-out function, etc.

Figure 4:
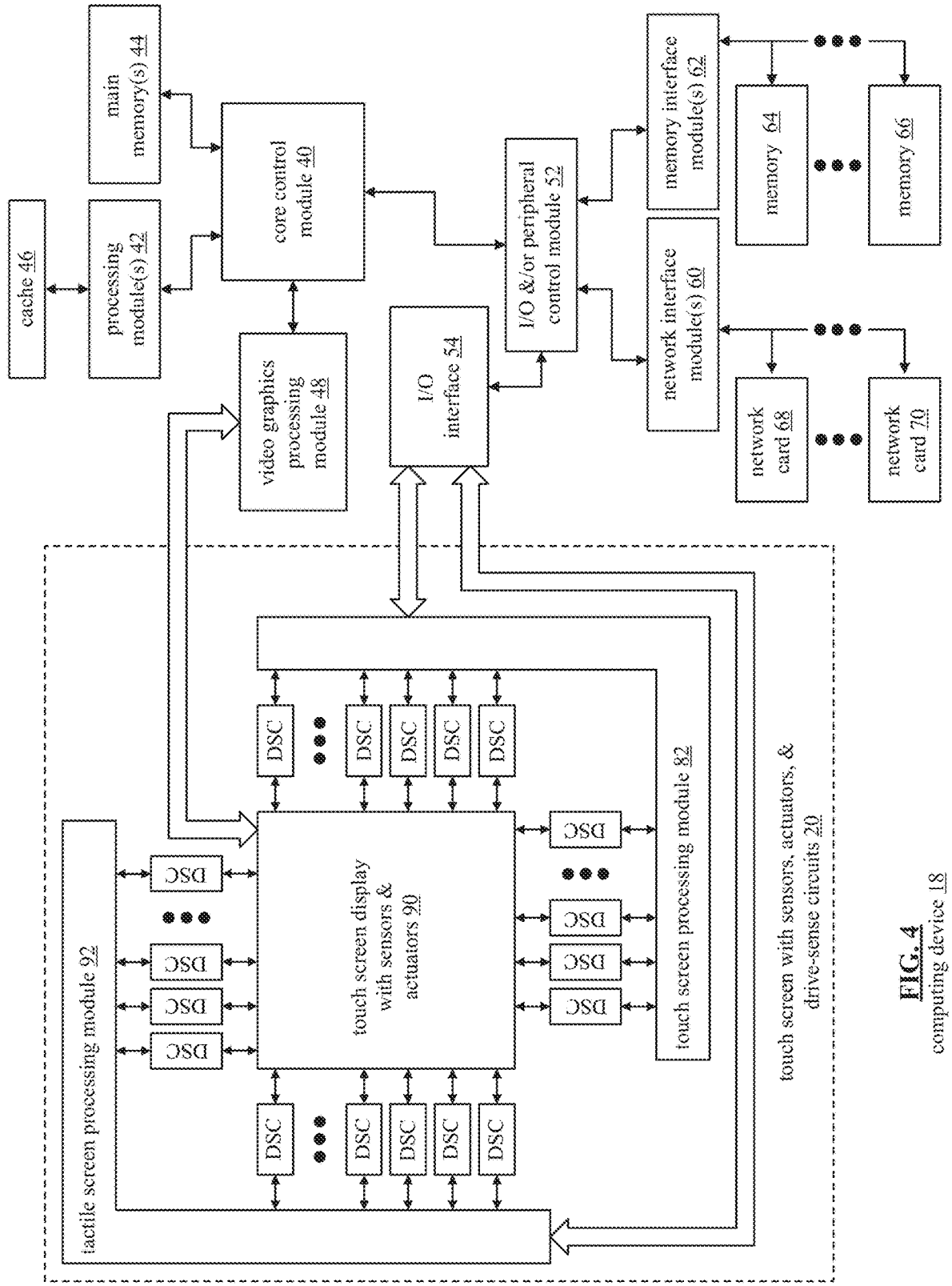
FIG. 4 is a schematic block diagram of another embodiment of a computing device in accordance with the present invention.

FIG. 4 is a schematic block diagram of another embodiment of a computing device 18 that includes a core control module 40, one or more processing modules 42, one or more main memories 44, cache memory 46, a video graphics processing module 48, a touch and tactile screen 20, an Input-Output (I/O) peripheral control module 52, one or more input interface modules 56, one or more output interface modules 58, one or more network interface modules 60, and one or more memory interface modules 62. The touch and tactile screen 20 includes a touch and tactile screen display 90, a plurality of sensors 30, a plurality of actuators 32, a plurality of drive-sense circuits (DSC), a touch screen processing module 82, and a tactile screen processing module 92.

Computing device 18 operates similarly to computing device 14 of FIG. 3 with the addition of a tactile aspect to the screen 20 as an output device. The tactile portion of the screen 20 includes the plurality of actuators (e.g., piezoelectric transducers to create vibrations, solenoids to create movement, etc.) to provide a tactile feel to the screen 20. To do so, the processing module creates tactile data, which is provided to the appropriate drive-sense circuits (DSC) via the tactile screen processing module 92, which may be a stand-alone processing module or integrated into processing module 42. The drive-sense circuits (DSC) convert the tactile data into drive-actuate signals and provide them to the appropriate actuators to create the desired tactile feel on the screen 20.

Figure 5A:
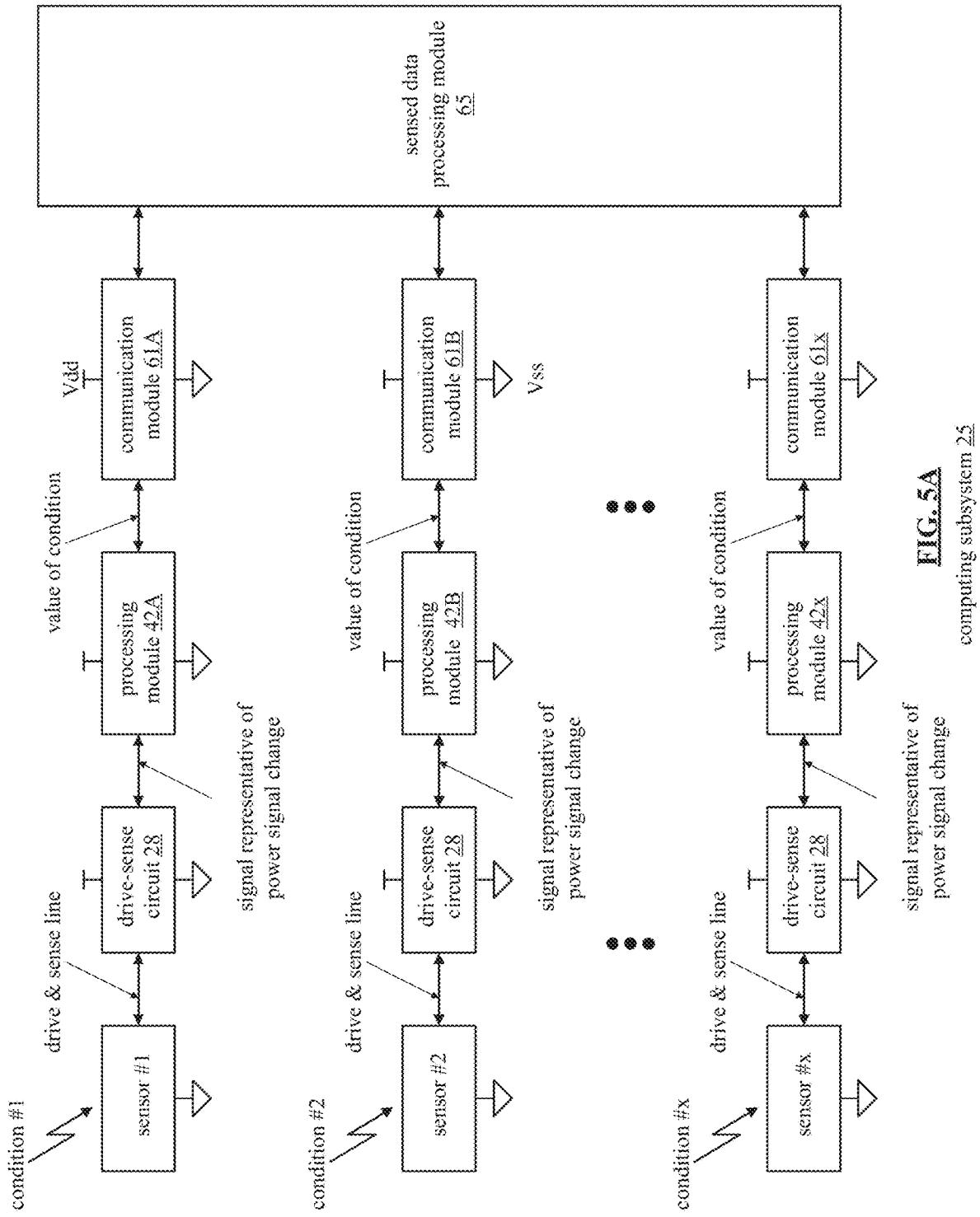
FIG. 5A is a schematic plot diagram of a computing subsystem in accordance with the present invention.

FIG. 5A is a schematic plot diagram of a computing subsystem 25 that includes a sensed data processing module 65, a plurality of communication modules 61A-x, a plurality of processing modules 42A-x, a plurality of drive sense circuits 28, and a plurality of sensors 1-x, which may be sensors 30 of FIG. 1. The sensed data processing module 65 is one or more processing modules within one or more servers 22 and/or one or more processing modules in one or more computing devices that are different than the computing devices in which processing modules 42A-x reside.

A drive-sense circuit 28 (or multiple drive-sense circuits), a processing module (e.g., 41A), and a communication module (e.g., 61A) are within a common computing device. Each grouping of a drive-sense circuit(s), processing module, and communication module is in a separate computing device. A communication module 61A-x is constructed in accordance with one or more wired communication protocol and/or one or more wireless communication protocols that is/are in accordance with the one or more of the Open System Interconnection (OSI) model, the Transmission Control Protocol/Internet Protocol (TCP/IP) model, and other communication protocol module.

In an example of operation, a processing module (e.g., 42A) provides a control signal to its corresponding drive-sense circuit 28. The processing module 42A may generate the control signal, receive it from the sensed data processing module 65, or receive an indication from the sensed data processing module 65 to generate the control signal. The control signal enables the drive-sense circuit 28 to provide a drive signal to its corresponding sensor. The control signal may further include a reference signal having one or more frequency components to facilitate creation of the drive signal and/or interpreting a sensed signal received from the sensor.

Based on the control signal, the drive-sense circuit 28 provides the drive signal to its corresponding sensor (e.g., 1) on a drive and sense line. While receiving the drive signal (e.g., a power signal, a regulated source signal, etc.), the sensor senses a physical condition 1-x (e.g., acoustic waves, a biological condition, a chemical condition, an electric condition, a magnetic condition, an optical condition, a thermal condition, and/or a mechanical condition). As a result of the physical condition, an electrical characteristic (e.g., impedance, voltage, current, capacitance, inductance, resistance, reactance, etc.) of the sensor changes, which affects the drive signal. Note that if the sensor is an optical sensor, it converts a sensed optical condition into an electrical characteristic.

The drive-sense circuit 28 detects the effect on the drive signal via the drive and sense line and processes the affect to produce a signal representative of power change, which may be an analog or digital signal. The processing module 42A receives the signal representative of power change, interprets it, and generates a value representing the sensed physical condition. For example, if the sensor is sensing pressure, the value representing the sensed physical condition is a measure of pressure (e.g., x PSI (pounds per square inch)).

In accordance with a sensed data process function (e.g., algorithm, application, etc.), the sensed data processing module 65 gathers the values representing the sensed physical conditions from the processing modules. Since the sensors 1-x may be the same type of sensor (e.g., a pressure sensor), may each be different sensors, or a combination thereof; the sensed physical conditions may be the same, may each be different, or a combination thereof. The sensed data processing module 65 processes the gathered values to produce one or more desired results. For example, if the computing subsystem 25 is monitoring pressure along a pipeline, the processing of the gathered values indicates that the pressures are all within normal limits or that one or more of the sensed pressures is not within normal limits.

As another example, if the computing subsystem 25 is used in a manufacturing facility, the sensors are sensing a variety of physical conditions, such as acoustic waves (e.g., for sound proofing, sound generation, ultrasound monitoring, etc.), a biological condition (e.g., a bacterial contamination, etc.) a chemical condition (e.g., composition, gas concentration, etc.), an electric condition (e.g., current levels, voltage levels, electro-magnetic interference, etc.), a magnetic condition (e.g., induced current, magnetic field strength, magnetic field orientation, etc.), an optical condition (e.g., ambient light, infrared, etc.), a thermal condition (e.g., temperature, etc.), and/or a mechanical condition (e.g., physical position, force, pressure, acceleration, etc.).

The computing subsystem 25 may further include one or more actuators in place of one or more of the sensors and/or in addition to the sensors. When the computing subsystem 25 includes an actuator, the corresponding processing module provides an actuation control signal to the corresponding drive-sense circuit 28. The actuation control signal enables the drive-sense circuit 28 to provide a drive signal to the actuator via a drive and actuate line (e.g., similar to the drive and sense line, but for the actuator). The drive signal includes one or more frequency components and/or amplitude components to facilitate a desired actuation of the actuator.

In addition, the computing subsystem 25 may include an actuator and sensor working in concert. For example, the sensor is sensing the physical condition of the actuator. In this example, a drive-sense circuit provides a drive signal to the actuator and another drive sense signal provides the same drive signal, or a scaled version of it, to the sensor. This allows the sensor to provide near immediate and continuous sensing of the actuator's physical condition. This further allows for the sensor to operate at a first frequency and the actuator to operate at a second frequency.

In an embodiment, the computing subsystem is a standalone system for a wide variety of applications (e.g., manufacturing, pipelines, testing, monitoring, security, etc.). In another embodiment, the computing subsystem 25 is one subsystem of a plurality of subsystems forming a larger system. For example, different subsystems are employed based on geographic location. As a specific example, the computing subsystem 25 is deployed in one section of a factory and another computing subsystem is deployed in another part of the factory. As another example, different subsystems are employed based function of the subsystems. As a specific example, one subsystem monitors a city's traffic light operation and another subsystem monitors the city's sewage treatment plants.

Regardless of the use and/or deployment of the computing system, the physical conditions it is sensing, and/or the physical conditions it is actuating, each sensor and each actuator (if included) is driven and sensed by a single line as opposed to separate drive and sense lines. This provides many advantages including, but not limited to, lower power requirements, better ability to drive high impedance sensors, lower line to line interference, and/or concurrent sensing functions.

Figure 5B:
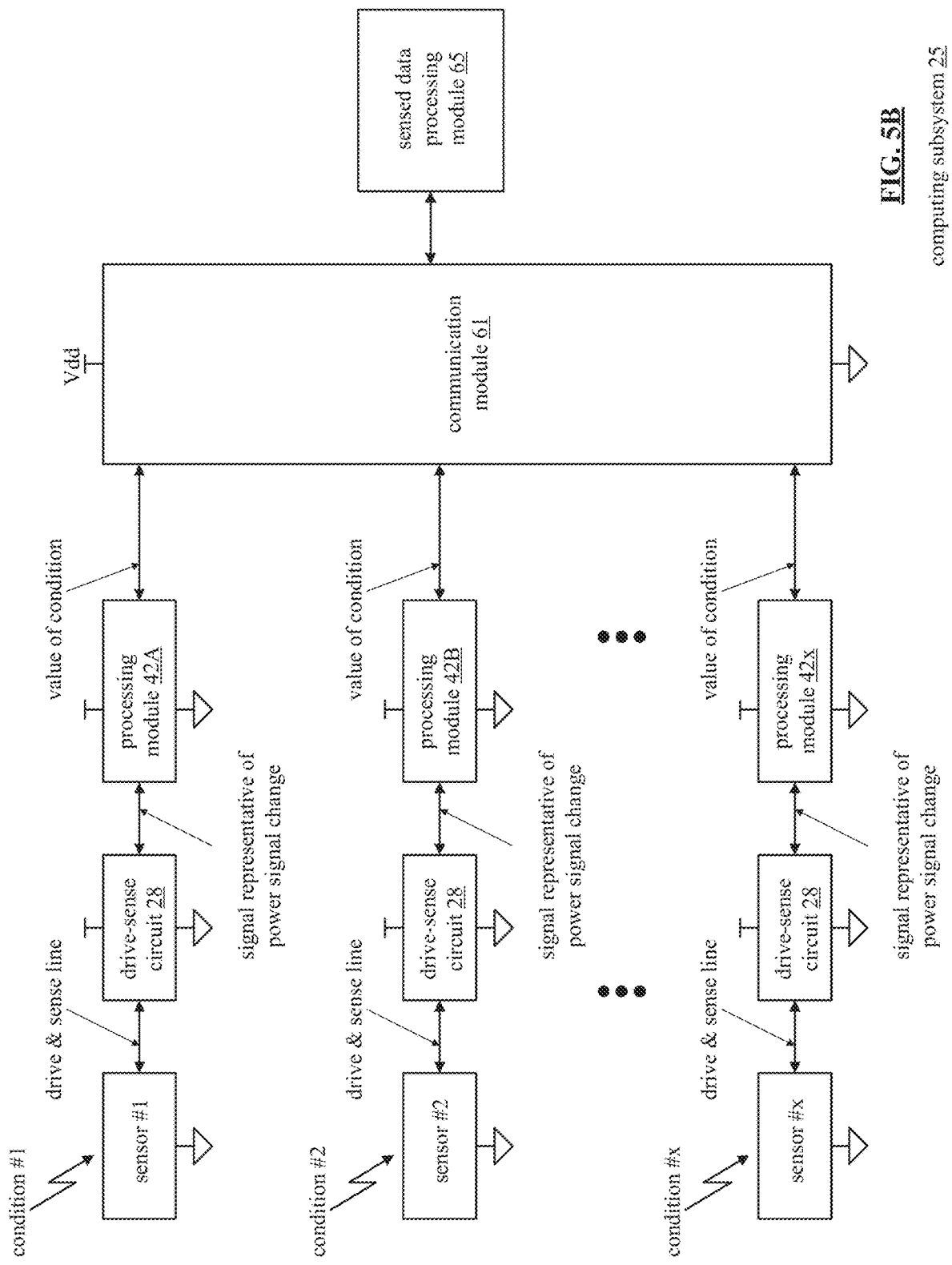
FIG. 5B is a schematic block diagram of another embodiment of a computing subsystem in accordance with the present invention.

FIG. 5B is a schematic block diagram of another embodiment of a computing subsystem 25 that includes a sensed data processing module 65, a communication module 61, a plurality of processing modules 42A-x, a plurality of drive sense circuits 28, and a plurality of sensors 1-x, which may be sensors 30 of FIG. 1. The sensed data processing module 65 is one or more processing modules within one or more servers 22 and/or one or more processing modules in one or more computing devices, devices, in which processing modules 42A-x reside.

In an embodiment, the drive-sense circuits 28, the processing modules, and the communication module are within a common computing device. For example, the computing device includes a central processing unit that includes a plurality of processing modules. The functionality and operation of the sensed data processing module 65, the communication module 61, the processing modules 42A-x, the drive sense circuits 28, and the sensors 1-x are as discussed with reference to FIG. 5A.

FIG. 5C is a schematic block diagram of another embodiment of a computing subsystem 25 that includes a sensed data processing module 65, a communication module 61, a processing module 42, a plurality of drive sense circuits 28, and a plurality of sensors 1-x, which may be sensors 30 of FIG. 1. The sensed data processing module 65 is one or more processing modules within one or more servers 22 and/or one or more processing modules in one or more computing devices that are different than the computing device in which the processing module 42 resides.

In an embodiment, the drive-sense circuits 28, the processing module, and the communication module are within a common computing device. The functionality and operation of the sensed data processing module 65, the communication module 61, the processing module 42, the drive sense circuits 28, and the sensors 1-x are as discussed with reference to FIG. 5A.

Figure 5D:
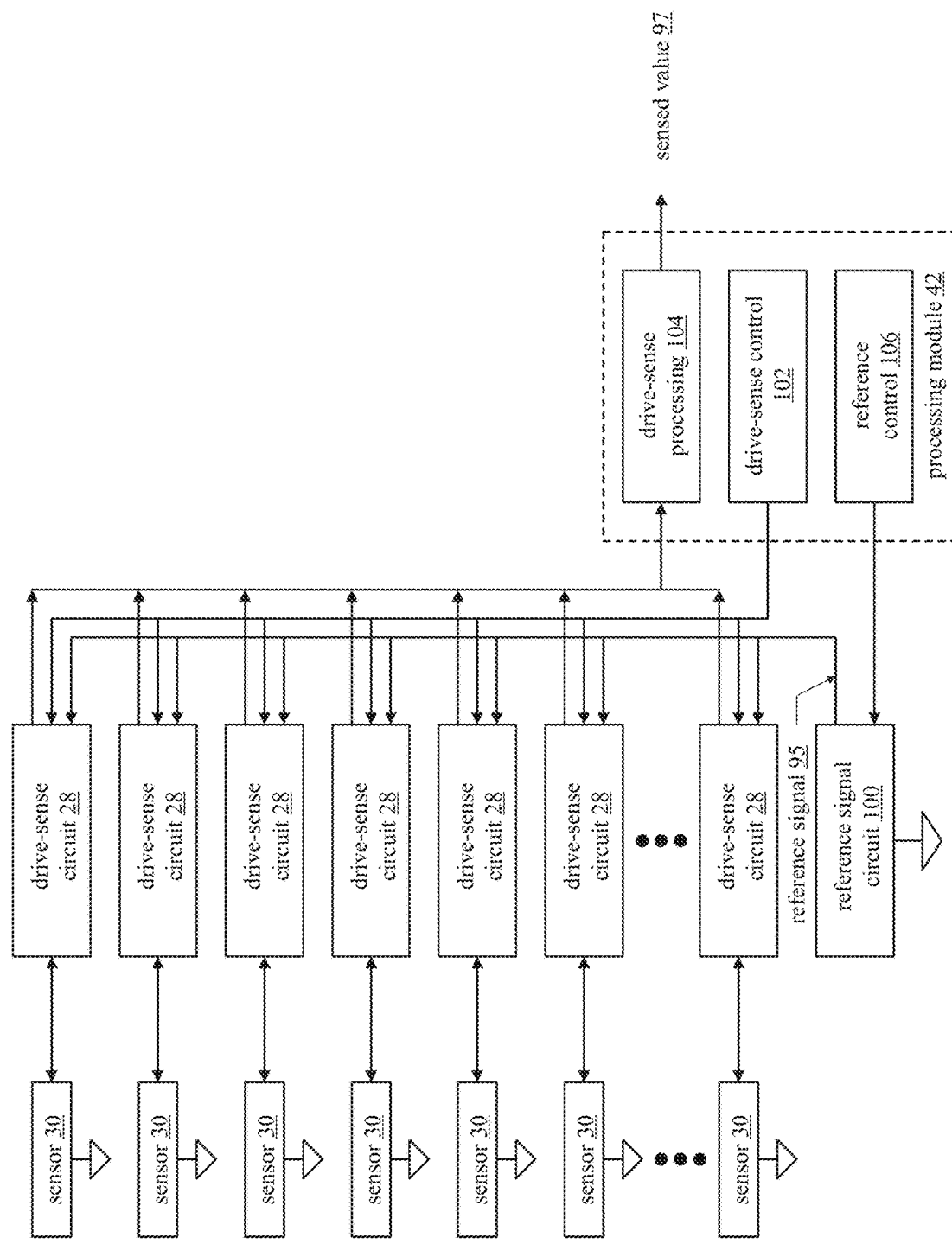
FIG. 5D is a schematic block diagram of another embodiment of a computing subsystem in accordance with the present invention.

FIG. 5D is a schematic block diagram of another embodiment of a computing subsystem 25 that includes a processing module 42, a reference signal circuit 100, a plurality of drive sense circuits 28, and a plurality of sensors 30. The processing module 42 includes a drive-sense processing block 104, a drive-sense control block 102, and a reference control block 106. Each block 102-106 of the processing module 42 may be implemented via separate modules of the processing module, may be a combination of software and hardware within the processing module, and/or may be field programmable modules within the processing module 42.

In an example of operation, the drive-sense control block 104 generates one or more control signals to activate one or more of the drive-sense circuits 28. For example, the drive-sense control block 102 generates a control signal that enables of the drive-sense circuits 28 for a given period of time (e.g., 1 second, 1 minute, etc.). As another example, the drive-sense control block 102 generates control signals to sequentially enable the drive-sense circuits 28. As yet another example, the drive-sense control block 102 generates a series of control signals to periodically enable the drive-sense circuits 28 (e.g., enabled once every second, every minute, every hour, etc.).

Continuing with the example of operation, the reference control block 106 generates a reference control signal that it provides to the reference signal circuit 100. The reference signal circuit 100 generates, in accordance with the control signal, one or more reference signals for the drive-sense circuits 28. For example, the control signal is an enable signal, which, in response, the reference signal circuit 100 generates a pre-programmed reference signal that it provides to the drive-sense circuits 28. In another example, the reference signal circuit 100 generates a unique reference signal for each of the drive-sense circuits 28. In yet another example, the reference signal circuit 100 generates a first unique reference signal for each of the drive-sense circuits 28 in a first group and generates a second unique reference signal for each of the drive-sense circuits 28 in a second group.

The reference signal circuit 100 may be implemented in a variety of ways. For example, the reference signal circuit 100 includes a DC (direct current) voltage generator, an AC voltage generator, and a voltage combining circuit. The DC voltage generator generates a DC voltage at a first level and the AC voltage generator generates an AC voltage at a second level, which is less than or equal to the first level. The voltage combining circuit combines the DC and AC voltages to produce the reference signal. As examples, the reference signal circuit 100 generates a reference signal similar to the signals shown in FIG. 7, which will be subsequently discussed.

As another example, the reference signal circuit 100 includes a DC current generator, an AC current generator, and a current combining circuit. The DC current generator generates a DC current at a first current level and the AC current generator generates an AC current at a second current level, which is less than or equal to the first current level. The current combining circuit combines the DC and AC currents to produce the reference signal.

Returning to the example of operation, the reference signal circuit 100 provides the reference signal, or signals, to the drive-sense circuits 28. When a drive-sense circuit 28 is enabled via a control signal from the drive sense control block 102, it provides a drive signal to its corresponding sensor 30. As a result of a physical condition, an electrical characteristic of the sensor is changed, which affects the drive signal. Based on the detected effect on the drive signal and the reference signal, the drive-sense circuit 28 generates a signal representative of the effect on the drive signal.

The drive-sense circuit provides the signal representative of the effect on the drive signal to the drive-sense processing block 104. The drive-sense processing block 104 processes the representative signal to produce a sensed value 97 of the physical condition (e.g., a digital value that represents a specific temperature, a specific pressure level, etc.). The processing module 42 provides the sensed value 97 to another application running on the computing device, to another computing device, and/or to a server 22.

Figure 5E:
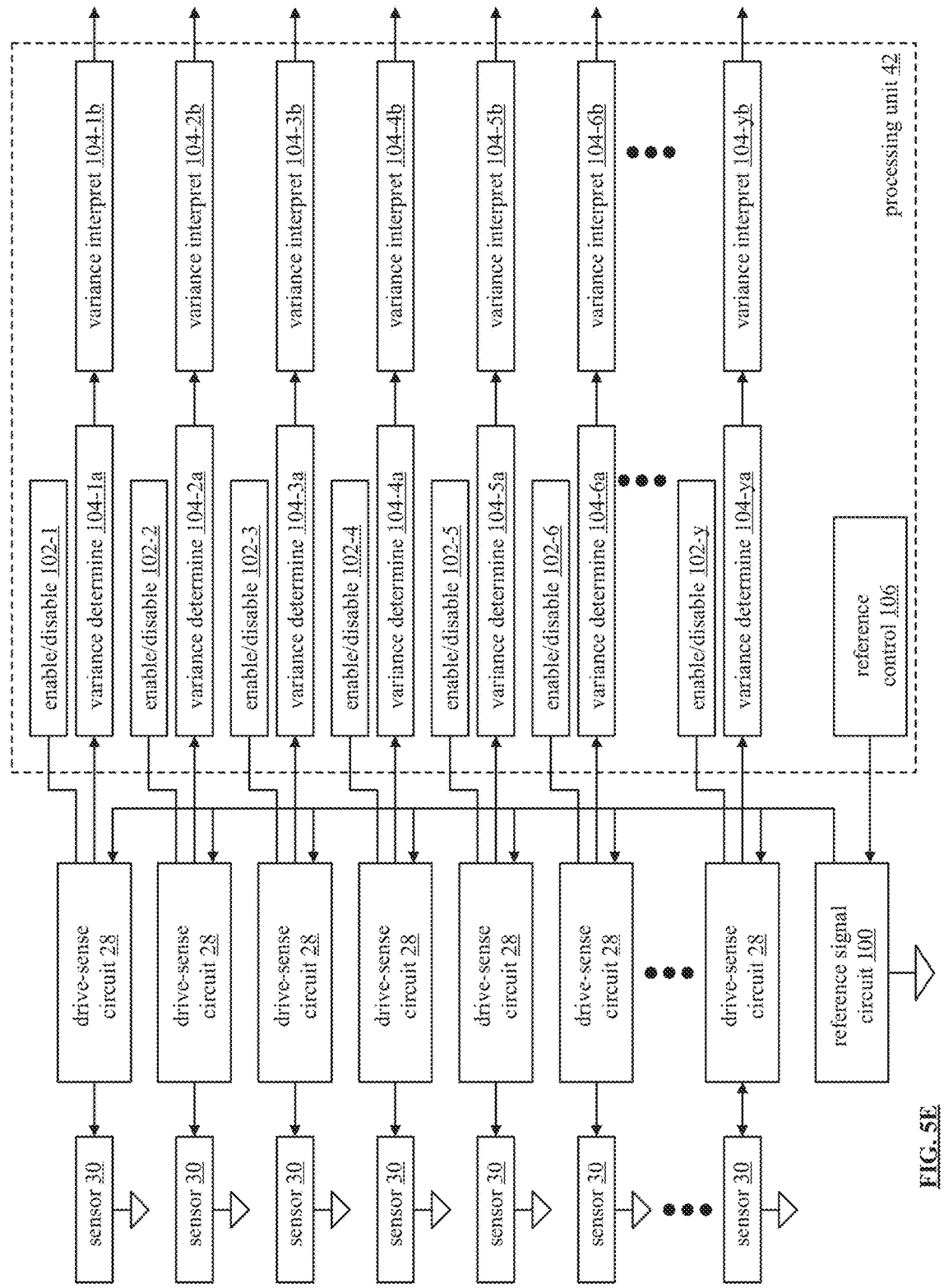
FIG. 5E is a schematic block diagram of another embodiment of a computing subsystem in accordance with the present invention.

FIG. 5E is a schematic block diagram of another embodiment of a computing subsystem 25 that includes a processing module 42, a plurality of drive sense circuits 28, and a plurality of sensors 30. This embodiment is similar to the embodiment of FIG. 5D with the functionality of the drive-sense processing block 104, a drive-sense control block 102, and a reference control block 106 shown in greater detail. For instance, the drive-sense control block 102 includes individual enable/disable blocks 102-1 through 102-$y$. An enable/disable block functions to enable or disable a corresponding drive-sense circuit in a manner as discussed above with reference to FIG. 5D.

The drive-sense processing block 104 includes variance determining modules 104-1$a$ through $y$ and variance interpreting modules 104-2$a$ through $y$. For example, variance determining module 104-1$a$ receives, from the corresponding drive-sense circuit 28, a signal representative of a physical condition sensed by a sensor. The variance determining module 104-1$a$ functions to determine a difference from the signal representing the sensed physical condition with a signal representing a known, or reference, physical condition. The variance interpreting module 104-1$b$ interprets the difference to determine a specific value for the sensed physical condition.

As a specific example, the variance determining module 104-1$a$ receives a digital signal of 1001 0110 (150 in decimal) that is representative of a sensed physical condition (e.g., temperature) sensed by a sensor from the corresponding drive-sense circuit 28. With 8-bits, there are $2^8$ (256) possible signals representing the sensed physical condition. Assume that the units for temperature is Celsius and a digital value of 0100 0000 (64 in decimal) represents the known value for 25 degree Celsius. The variance determining module 104-$b1$ determines the difference between the digital signal representing the sensed value (e.g., 1001 0110, 150 in decimal) and the known signal value of (e.g., 0100 0000, 64 in decimal), which is 0011 0000 (86 in decimal). The variance determining module 104-$b1$ then determines the sensed value based on the difference and the known value. In this example, the sensed value equals 25+86*(100/256) =25+33.6=58.6 degrees Celsius.

FIG. 6 is a schematic block diagram of a drive sense-circuit 28-$a$ coupled to a sensor 30. The drive-sense circuit 28 includes a power source circuit 110 and a power signal change detection circuit 112. The sensor 30 includes one or more transducers that have varying electrical characteristics (e.g., capacitance, inductance, impedance, current, voltage, etc.) based on varying physical conditions 114 (e.g., pressure, temperature, biological, chemical, etc.), or vice versa (e.g., an actuator).

The power source circuit 110 is operably coupled to the sensor 30 and, when enabled (e.g., from a control signal from the processing module 42, power is applied, a switch is closed, a reference signal is received, etc.) provides a power signal 116 to the sensor 30. The power source circuit 110 may be a voltage supply circuit (e.g., a battery, a linear regulator, an unregulated DC-to-DC converter, etc.) to produce a voltage-based power signal, a current supply circuit (e.g., a current source circuit, a current mirror circuit, etc.) to produce a current-based power signal, or a circuit that provide a desired power level to the sensor and substantially matches impedance of the sensor. The power source circuit 110 generates the power signal 116 to include a DC (direct current) component and/or an oscillating component.

When receiving the power signal 116 and when exposed to a condition 114, an electrical characteristic of the sensor affects 118 the power signal. When the power signal change detection circuit 112 is enabled, it detects the affect 118 on the power signal as a result of the electrical characteristic of the sensor. For example, the power signal is a 1.5 voltage signal and, under a first condition, the sensor draws 1 milliamp of current, which corresponds to an impedance of 1.5 K Ohms. Under a second conditions, the power signal remains at 1.5 volts and the current increases to 1.5 milliamps. As such, from condition 1 to condition 2, the impedance of the sensor changed from 1.5 K Ohms to 1 K Ohms. The power signal change detection circuit 112 determines this change and generates a representative signal 120 of the change to the power signal.

As another example, the power signal is a 1.5 voltage signal and, under a first condition, the sensor draws 1 milliamp of current, which corresponds to an impedance of 1.5 K Ohms. Under a second conditions, the power signal drops to 1.3 volts and the current increases to 1.3 milliamps. As such, from condition 1 to condition 2, the impedance of the sensor changed from 1.5 K Ohms to 1 K Ohms. The power signal change detection circuit 112 determines this change and generates a representative signal 120 of the change to the power signal.

The power signal 116 includes a DC component 122 and/or an oscillating component 124 as shown in FIG. 7. The oscillating component 124 includes a sinusoidal signal, a square wave signal, a triangular wave signal, a multiple level signal (e.g., has varying magnitude over time with respect to the DC component), and/or a polygonal signal (e.g., has a symmetrical or asymmetrical polygonal shape with respect to the DC component). Note that the power signal is shown without affect from the sensor as the result of a condition or changing condition.

In an embodiment, power generating circuit 110 varies frequency of the oscillating component 124 of the power signal 116 so that it can be tuned to the impedance of the sensor and/or to be off-set in frequency from other power signals in a system. For example, a capacitance sensor's impedance decreases with frequency. As such, if the frequency of the oscillating component is too high with respect to the capacitance, the capacitor looks like a short and variances in capacitances will be missed. Similarly, if the frequency of the oscillating component is too low with respect to the capacitance, the capacitor looks like an open and variances in capacitances will be missed.

In an embodiment, the power generating circuit 110 varies magnitude of the DC component 122 and/or the oscillating component 124 to improve resolution of sensing and/or to adjust power consumption of sensing. In addition, the power generating circuit 110 generates the drive signal 110 such that the magnitude of the oscillating component 124 is less than magnitude of the DC component 122.

FIG. 6A is a schematic block diagram of a drive center circuit 28-$a$1 coupled to a sensor 30. The drive sense-sense circuit 28-$a$1 includes a signal source circuit 111, a signal change detection circuit 113, and a power source 115. The power source 115 (e.g., a battery, a power supply, a current source, etc.) generates a voltage and/or current that is combined with a signal 117, which is produced by the signal source circuit 111. The combined signal is supplied to the sensor 30.

The signal source circuit 111 may be a voltage supply circuit (e.g., a battery, a linear regulator, an unregulated DC-to-DC converter, etc.) to produce a voltage-based signal 117, a current supply circuit (e.g., a current source circuit, a current mirror circuit, etc.) to produce a current-based signal 117, or a circuit that provide a desired power level to the sensor and substantially matches impedance of the sensor. The signal source circuit 111 generates the signal 117 to include a DC (direct current) component and/or an oscillating component.

When receiving the combined signal (e.g., signal 117 and power from the power source) and when exposed to a condition 114, an electrical characteristic of the sensor affects 119 the signal. When the signal change detection circuit 113 is enabled, it detects the affect 119 on the signal as a result of the electrical characteristic of the sensor.

FIG. 8 is an example of a sensor graph that plots an electrical characteristic versus a condition. The sensor has a substantially linear region in which an incremental change in a condition produces a corresponding incremental change in the electrical characteristic. The graph shows two types of electrical characteristics: one that increases as the condition increases and the other that decreases and the condition increases. As an example of the first type, impedance of a temperature sensor increases and the temperature increases. As an example of a second type, a capacitance touch sensor decreases in capacitance as a touch is sensed.

Figure 9:
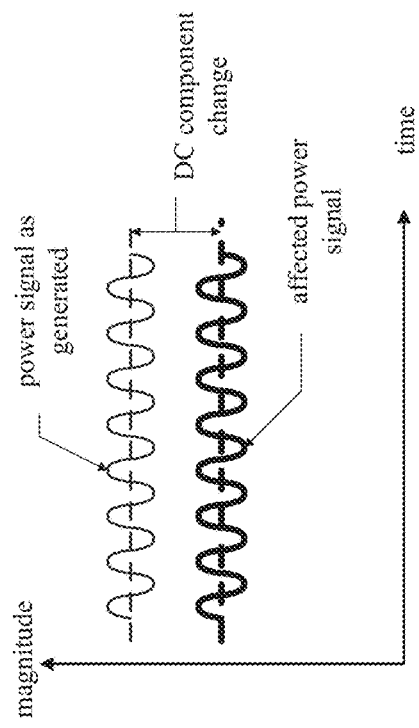
FIG. 9 is a schematic block diagram of another example of a power signal graph in accordance with the present invention.

FIG. 9 is a schematic block diagram of another example of a power signal graph in which the electrical characteristic or change in electrical characteristic of the sensor is affecting the power signal. In this example, the effect of the electrical characteristic or change in electrical characteristic of the sensor reduced the DC component but had little to no effect on the oscillating component. For example, the electrical characteristic is resistance. In this example, the resistance or change in resistance of the sensor decreased the power signal, inferring an increase in resistance for a relatively constant current.

Figure 10:
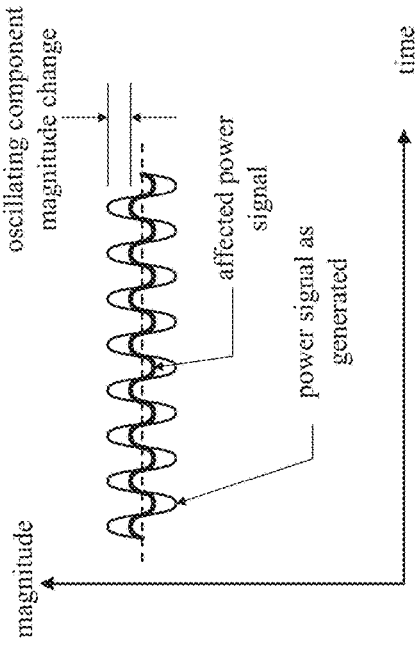
FIG. 10 is a schematic block diagram of another example of a power signal graph in accordance with the present invention.

FIG. 10 is a schematic block diagram of another example of a power signal graph in which the electrical characteristic or change in electrical characteristic of the sensor is affecting the power signal. In this example, the effect of the electrical characteristic or change in electrical characteristic of the sensor reduced magnitude of the oscillating component but had little to no effect on the DC component. For example, the electrical characteristic is impedance of a capacitor and/or an inductor. In this example, the impedance or change in impedance of the sensor decreased the magnitude of the oscillating signal component, inferring an increase in impedance for a relatively constant current.

Figure 11A:
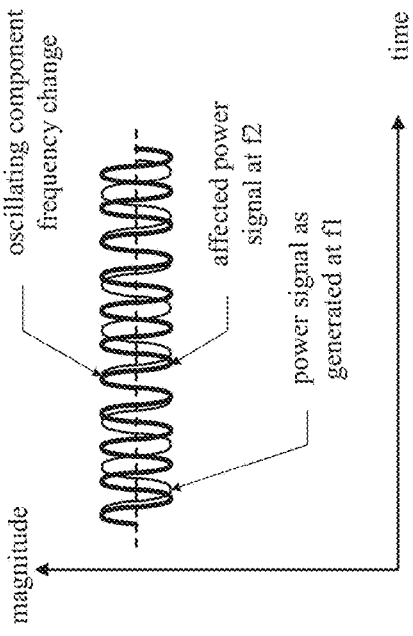
FIG. 11A is a schematic block diagram of another example of a power signal graph in accordance with the present invention.
Figure 11:
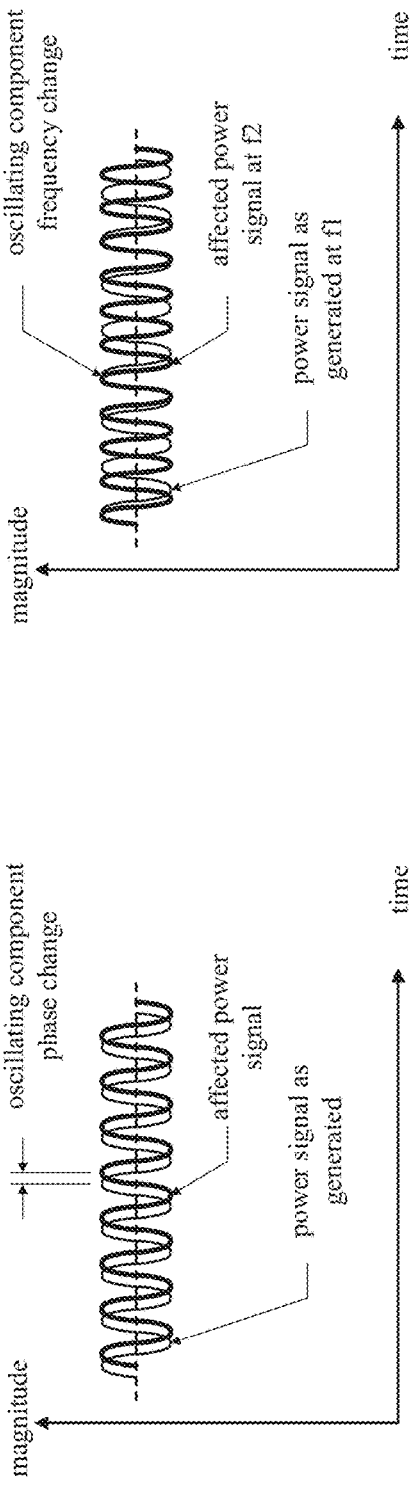
FIG. 11 is a schematic block diagram of another example of a power signal graph in accordance with the present invention.

FIG. 11 is a schematic block diagram of another example of a power signal graph in which the electrical characteristic or change in electrical characteristic of the sensor is affecting the power signal. In this example, the effect of the electrical characteristic or change in electrical characteristic of the sensor shifted frequency of the oscillating component but had little to no effect on the DC component. For example, the electrical characteristic is reactance of a capacitor and/or an inductor. In this example, the reactance or change in reactance of the sensor shifted frequency of the oscillating signal component, inferring an increase in reactance (e.g., sensor is functioning as an integrator or phase shift circuit).

FIG. 11A is a schematic block diagram of another example of a power signal graph in which the electrical characteristic or change in electrical characteristic of the sensor is affecting the power signal. In this example, the effect of the electrical characteristic or change in electrical characteristic of the sensor changes the frequency of the oscillating component but had little to no effect on the DC component. For example, the sensor includes two transducers that oscillate at different frequencies. The first transducer receives the power signal at a frequency of $f_1$ and converts it into a first physical condition. The second transducer is stimulated by the first physical condition to create an electrical signal at a different frequency $f_2$. In this example, the first and second transducers of the sensor change the frequency of the oscillating signal component, which allows for more granular sensing and/or a broader range of sensing.

Figure 12:
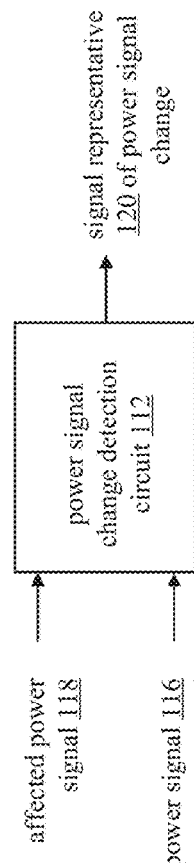
FIG. 12 is a schematic block diagram of an embodiment of a power signal change detection circuit in accordance with the present invention.

FIG. 12 is a schematic block diagram of an embodiment of a power signal change detection circuit 112 receiving the affected power signal 118 and the power signal 116 as generated to produce, therefrom, the signal representative 120 of the power signal change. The affect 118 on the power signal is the result of an electrical characteristic and/or change in the electrical characteristic of a sensor; a few examples of the affects are shown in FIGS. 8-11A.

In an embodiment, the power signal change detection circuit 112 detect a change in the DC component 122 and/or the oscillating component 124 of the power signal 116. The power signal change detection circuit 112 then generates the signal representative 120 of the change to the power signal based on the change to the power signal. For example, the change to the power signal results from the impedance of the sensor and/or a change in impedance of the sensor. The representative signal 120 is reflective of the change in the power signal and/or in the change in the sensor's impedance.

In an embodiment, the power signal change detection circuit 112 is operable to detect a change to the oscillating component at a frequency, which may be a phase shift, frequency change, and/or change in magnitude of the oscillating component. The power signal change detection circuit 112 is also operable to generate the signal representative of the change to the power signal based on the change to the oscillating component at the frequency. The power signal change detection circuit 112 is further operable to provide feedback to the power source circuit 110 regarding the oscillating component. The feedback allows the power source circuit 110 to regulate the oscillating component at the desired frequency, phase, and/or magnitude.

Figure 13:
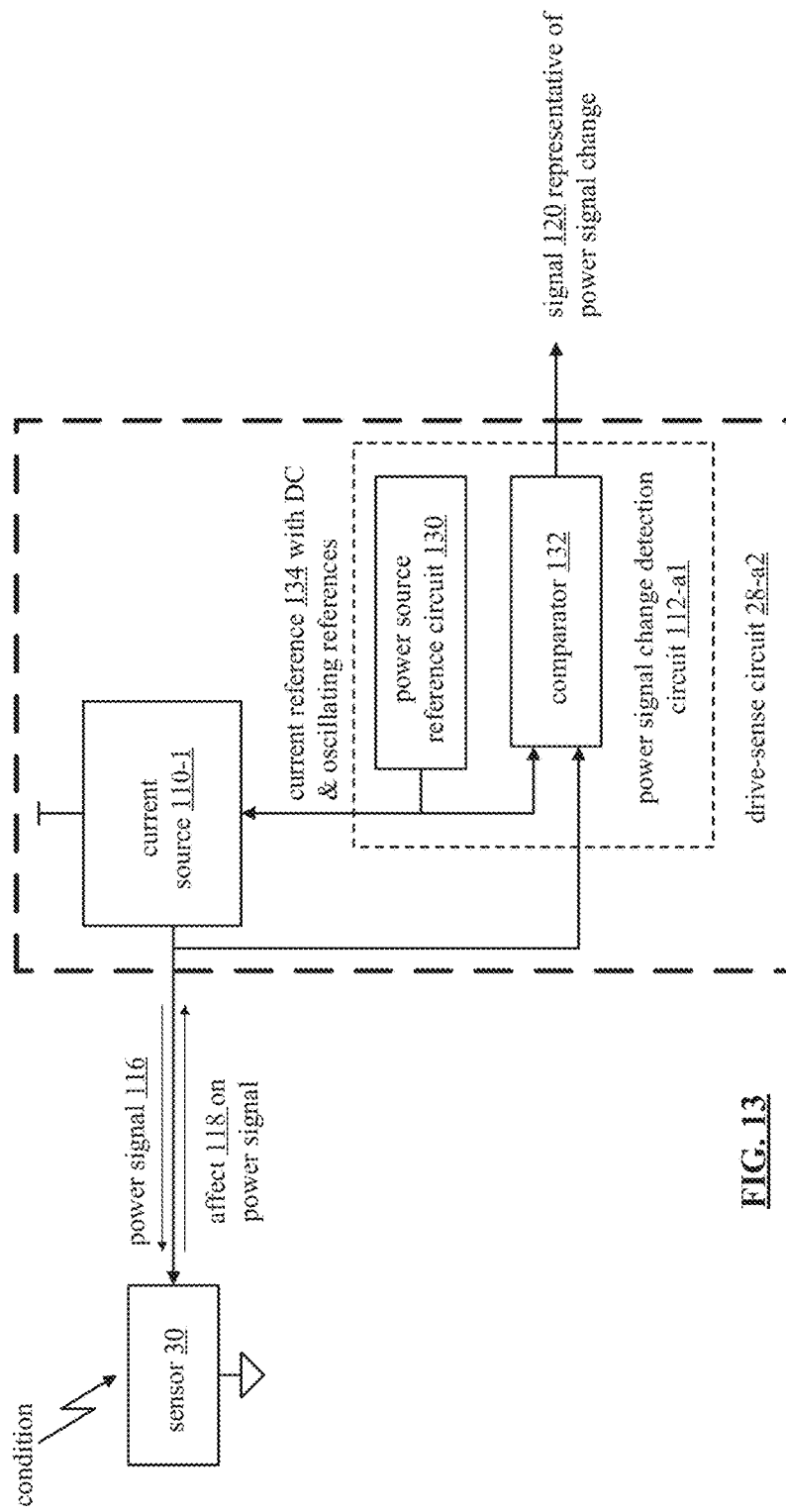
FIG. 13 is a schematic block diagram of another embodiment of a drive sense circuit in accordance with the present invention.

FIG. 13 is a schematic block diagram of another embodiment of a drive sense circuit 28-a2 that includes a current source 110-1 and a power signal change detection circuit 112-a1. The power signal change detection circuit 112-a1 includes a power source reference circuit 130 and a comparator 132. The current source 110-1 may be an independent current source, a dependent current source, a current mirror circuit, etc.

In an example of operation, the power source reference circuit 130 provides a current reference 134 with DC and oscillating components to the current source 110-1. The current source generates a current as the power signal 116 based on the current reference 134. An electrical characteristic of the sensor 30 has an effect on the current power signal 116. For example, if the impedance of the sensor decreases and the current power signal 116 remains substantially unchanged, the voltage across the sensor is decreased.

The comparator 132 compares the current reference 134 with the affected power signal 118 to produce the signal 120 that is representative of the change to the power signal. For example, the current reference signal 134 corresponds to a given current (I) times a given impedance (Z). The current reference generates the power signal to produce the given current (I). If the impedance of the sensor 30 substantially matches the given impedance (Z), then the comparator's output is reflective of the impedances substantially matching. If the impedance of the sensor 30 is greater than the given impedance (Z), then the comparator's output is indicative of how much greater the impedance of the sensor 30 is than that of the given impedance (Z). If the impedance of the sensor 30 is less than the given impedance (Z), then the comparator's output is indicative of how much less the impedance of the sensor 30 is than that of the given impedance (Z).

Figure 14:
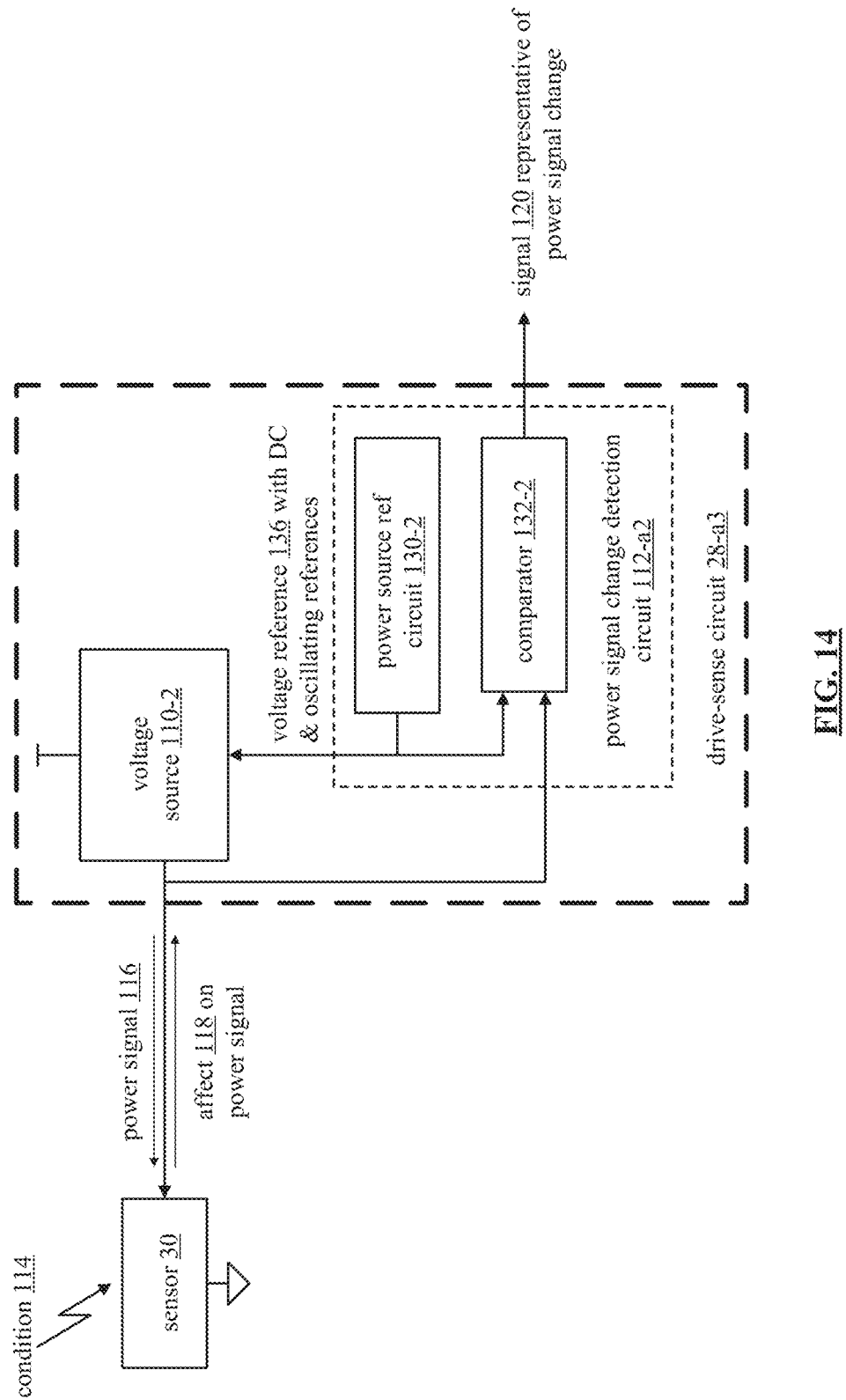
FIG. 14 is a schematic block diagram of another embodiment of a drive sense circuit in accordance with the present invention.

FIG. 14 is a schematic block diagram of another embodiment of a drive sense circuit 28-a3 that includes a voltage source 110-2 and a power signal change detection circuit 112-a2. The power signal change detection circuit 112-a2 includes a power source reference circuit 130-2 and a comparator 132-2. The voltage source 110-2 may be a battery, a linear regulator, a DC-DC converter, etc.

In an example of operation, the power source reference circuit 130-2 provides a voltage reference 136 with DC and oscillating components to the voltage source 110-2. The voltage source generates a voltage as the power signal 116 based on the voltage reference 136. An electrical characteristic of the sensor 30 has an effect on the voltage power signal 116. For example, if the impedance of the sensor decreases and the voltage power signal 116 remains substantially unchanged, the current through the sensor is increased.

The comparator 132 compares the voltage reference 136 with the affected power signal 118 to produce the signal 120 that is representative of the change to the power signal. For example, the voltage reference signal 134 corresponds to a given voltage (V) divided by a given impedance (Z). The voltage reference generates the power signal to produce the given voltage (V). If the impedance of the sensor 30 substantially matches the given impedance (Z), then the comparator's output is reflective of the impedances substantially matching. If the impedance of the sensor 30 is greater than the given impedance (Z), then the comparator's output is indicative of how much greater the impedance of the sensor 30 is than that of the given impedance (Z). If the impedance of the sensor 30 is less than the given impedance (Z), then the comparator's output is indicative of how much less the impedance of the sensor 30 is than that of the given impedance (Z).

Figure 15:
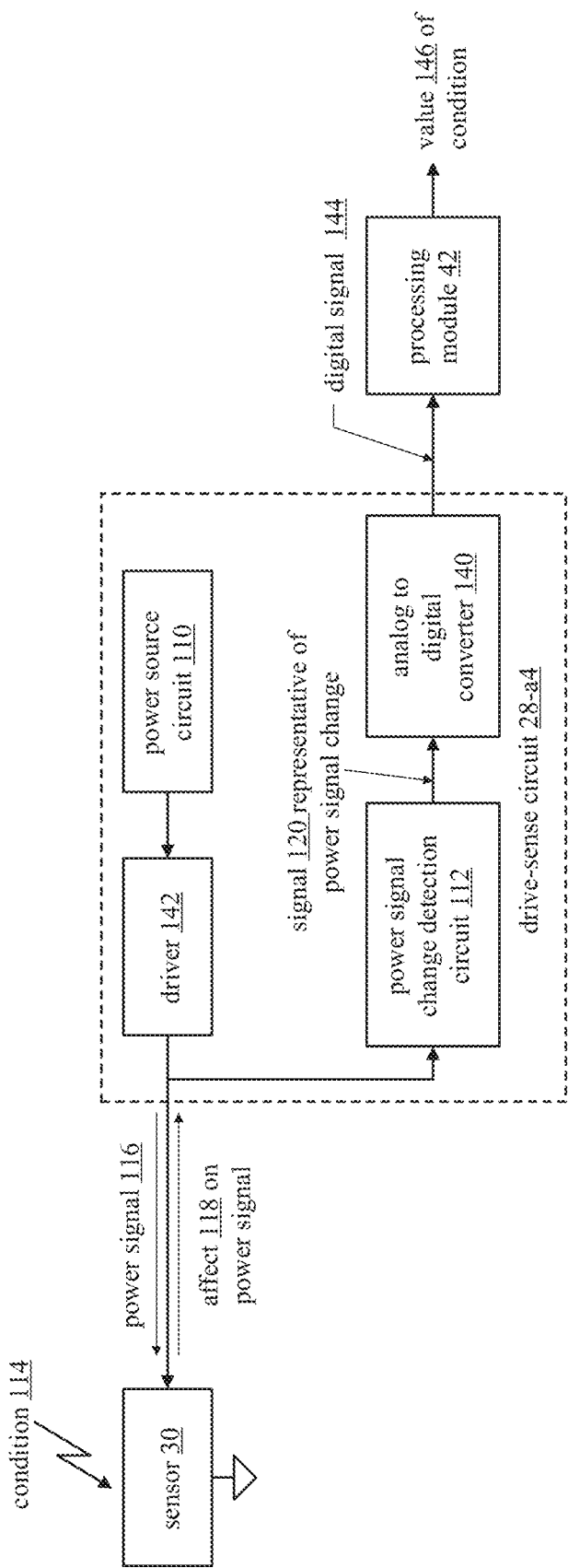
FIG. 15 is a schematic block diagram of another embodiment of a drive sense circuit in accordance with the present invention.

FIG. 15 is a schematic block diagram of another embodiment of a drive sense circuit 28-a4 that includes the power source circuit 110, the power signal change detection circuit 112, an analog to digital converter 140, and a driver 142. The power source circuit 110 and the power signal change detection circuit 112 function as previously discussed with reference to FIG. 13 to produce a signal 120 that is representative of a power signal change.

In this embodiment, the power source circuit 110 provides its output to the driver 142, which functions to increase the power (e.g., increase voltage and/or current) of the power signal produced by the power source circuit 110. The driver 142 provides the power signal 116 to the sensor 30. With a driver, which may be a power amplifier, a low impedance sensor 30 may be used of specific types for sensing applications.

The analog to digital converter 140 converts the signal 120 that represents the power signal change into a digital signal 144. The digital signal 144 is provided to the processing module 42 via a connection between the drive-sense circuit and the processing module. The processing module converts the digital signal into a relative value of the condition to which the sensor is exposed. The connection between the drive-sense circuit 28-a4 and the processing module 42 depends on whether the drive-sense circuit is internal or external to the computing device of the processing module. If internal, then the drive-sense circuit is connected to the processing module via a PCI bus or the like. If the drive-sense circuit is external to the processing module, then the connection is a USB connection, a Bluetooth connection, a WLAN connection, an internet connection, and/or a WAN connection.

Figure 16:
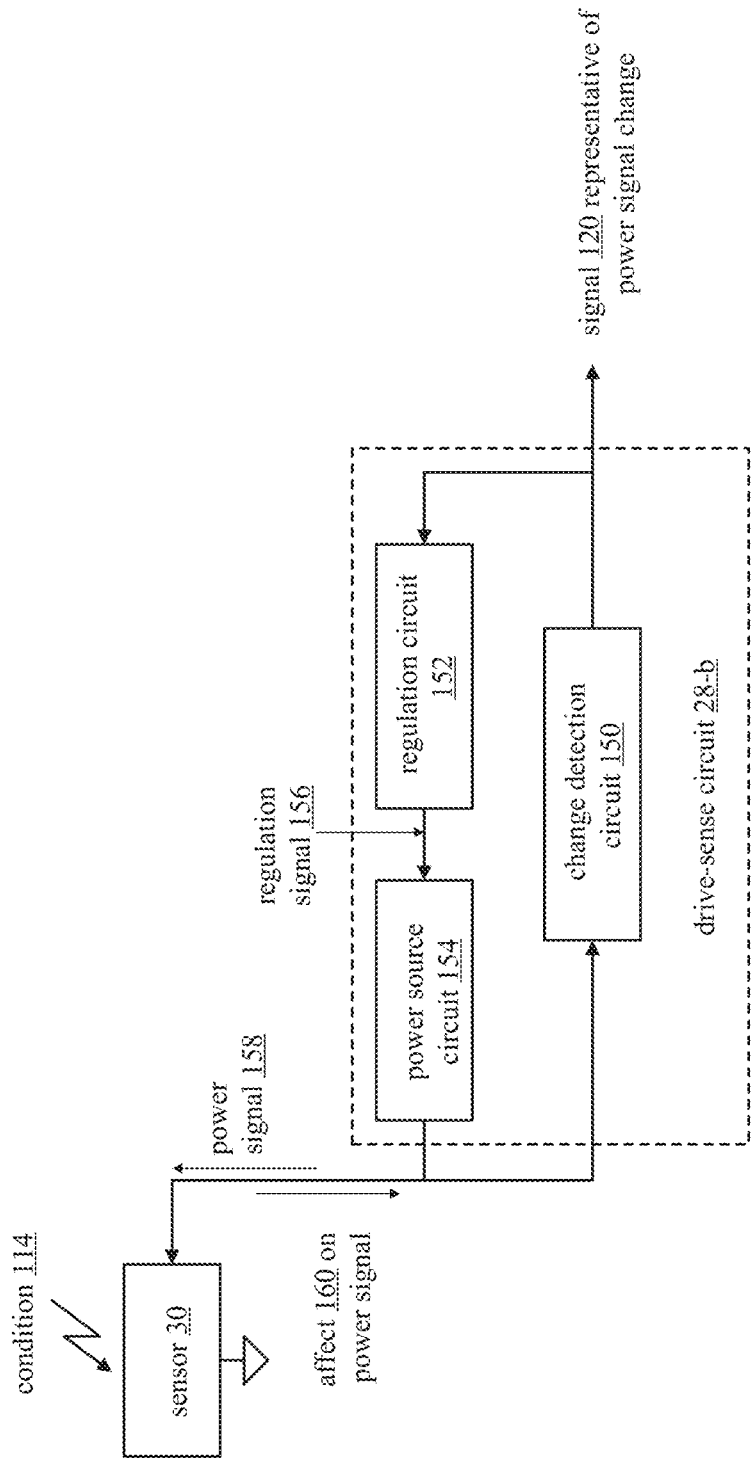
FIG. 16 is a schematic block diagram of another embodiment of a drive sense circuit in accordance with the present invention.

FIG. 16 is a schematic block diagram of another embodiment of a drive sense circuit 28-b includes a change detection circuit 150, a regulation circuit 152, and a power source circuit 154. The drive-sense circuit 28-b is coupled to the sensor 30, which includes a transducer that has varying electrical characteristics (e.g., capacitance, inductance, impedance, current, voltage, etc.) based on varying physical conditions 114 (e.g., pressure, temperature, biological, chemical, etc.).

The power source circuit 154 is operably coupled to the sensor 30 and, when enabled (e.g., from a control signal from the processing module 42, power is applied, a switch is closed, a reference signal is received, etc.) provides a power signal 158 to the sensor 30. The power source circuit 154 may be a voltage supply circuit (e.g., a battery, a linear regulator, an unregulated DC-to-DC converter, etc.) to produce a voltage-based power signal or a current supply circuit (e.g., a current source circuit, a current mirror circuit, etc.) to produce a current-based power signal. The power source circuit 154 generates the power signal 158 to include a DC (direct current) component and an oscillating component.

When receiving the power signal 158 and when exposed to a condition 114, an electrical characteristic of the sensor affects 160 the power signal. When the change detection circuit 150 is enabled, it detects the affect 160 on the power signal as a result of the electrical characteristic of the sensor 30. The change detection circuit 150 is further operable to generate a signal 120 that is representative of change to the power signal based on the detected effect on the power signal.

The regulation circuit 152, when its enabled, generates regulation signal 156 to regulate the DC component to a desired DC level and/or regulate the oscillating component to a desired oscillating level (e.g., magnitude, phase, and/or frequency) based on the signal 120 that is representative of the change to the power signal. The power source circuit 154 utilizes the regulation signal 156 to keep the power signal at a desired setting 158 regardless of the electrical characteristic of the sensor. In this manner, the amount of regulation is indicative of the affect the electrical characteristic had on the power signal.

In an example, the power source circuit 158 is a DC-DC converter operable to provide a regulated power signal having DC and AC components. The change detection circuit 150 is a comparator and the regulation circuit 152 is a pulse width modulator to produce the regulation signal 156. The comparator compares the power signal 158, which is affected by the sensor, with a reference signal that includes DC and AC components. When the electrical characteristics is at a first level (e.g., a first impedance), the power signal is regulated to provide a voltage and current such that the power signal substantially resembles the reference signal.

When the electrical characteristics changes to a second level (e.g., a second impedance), the change detection circuit 150 detects a change in the DC and/or AC component of the power signal 158 and generates the representative signal 120, which indicates the changes. The regulation circuit 152 detects the change in the representative signal 120 and creates the regulation signal to substantially remove the effect on the power signal. The regulation of the power signal 158 may be done by regulating the magnitude of the DC and/or AC components, by adjusting the frequency of AC component, and/or by adjusting the phase of the AC component.

Figure 17:
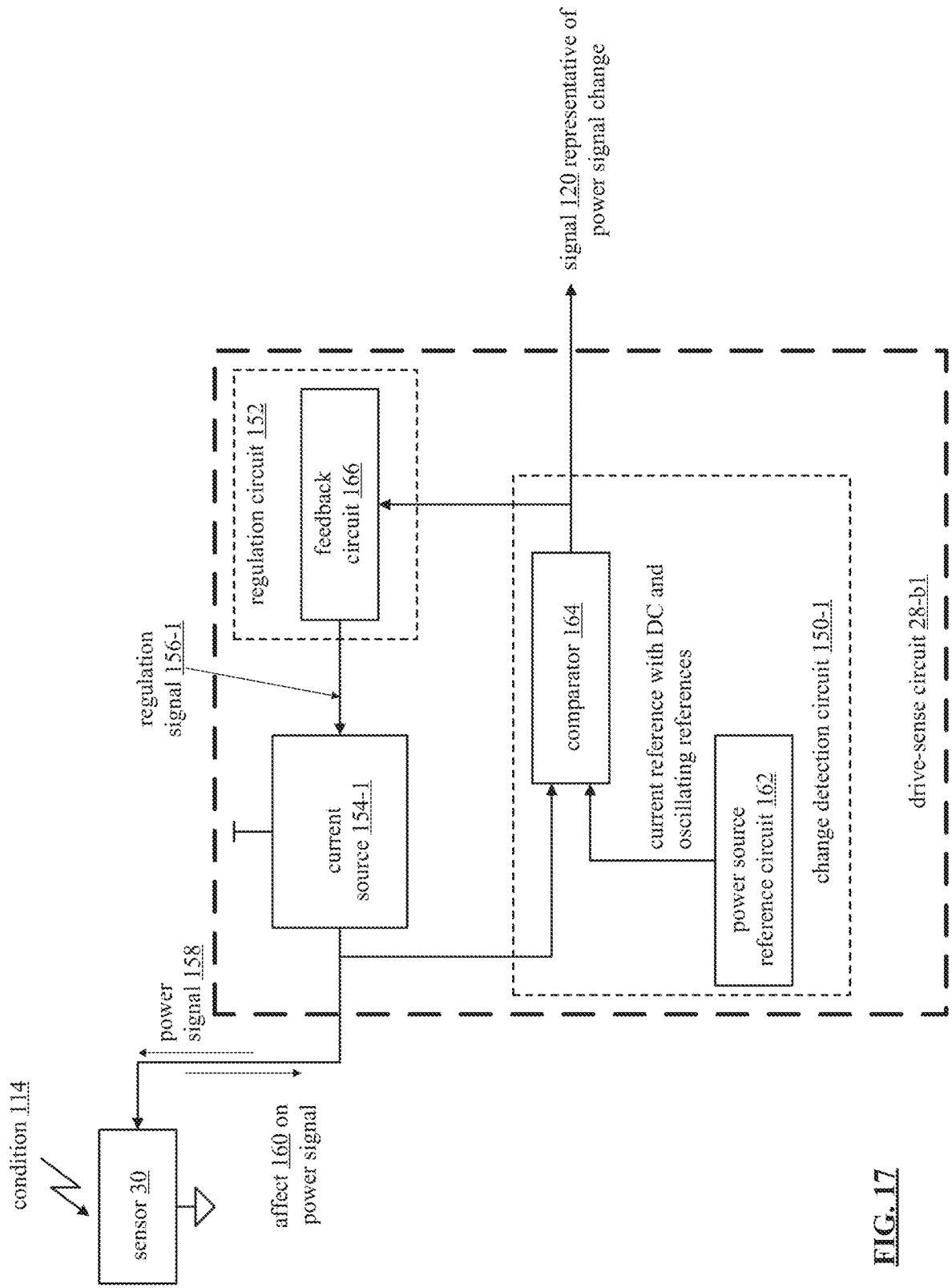
FIG. 17 is a schematic block diagram of another embodiment of a drive sense circuit in accordance with the present invention.

FIG. 17 is a schematic block diagram of another embodiment of a drive sense circuit 28-b1 that includes a current source 154-1 and a change detection circuit 150-1. The change detection circuit 150-1 includes a power source reference circuit 162 and a comparator 164. The current source 154-1 may be an independent current source, a dependent current source, a current mirror circuit, etc.

In an example of operation, the power source reference circuit 162 provides a current reference with DC and/or oscillating components to the comparator 164. The comparator 164 compares the reference current with the current power signal 158 generated by the current source 154-1 and produces, based on the comparison, the representative signal 120.

The regulation circuit 152, which includes a feedback circuit 166 (e.g., a dependent current source biasing circuit, a wire, etc.), generates a regulation signal 156-1 based on the representative signal 120 and provides the regulation signal to the current source 154-1. The current source generates a regulated current as the power signal 116 based on the regulation signal 156-1.

As an example, the current reference signal corresponds to a given current (I) times a given impedance (Z). The current source 154-1 generates the power signal to produce the given current (I). If the impedance of the sensor 30 substantially matches the given impedance (Z), then the comparator's output is reflective of the impedances substantially matching. If the impedance of the sensor 30 is greater than the given impedance (Z), then the comparator's output is indicative of how much greater the impedance of the sensor 30 is than that of the given impedance (Z). If the impedance of the sensor 30 is less than the given impedance (Z), then the comparator's output is indicative of how much less the impedance of the sensor 30 is than that of the given impedance (Z). The regulation circuit functions to account for the variations in the impedance of the sensor and to ensure that the current source produces a regulated current source (e.g., it remains substantially at the given current (I)).

Figure 18:
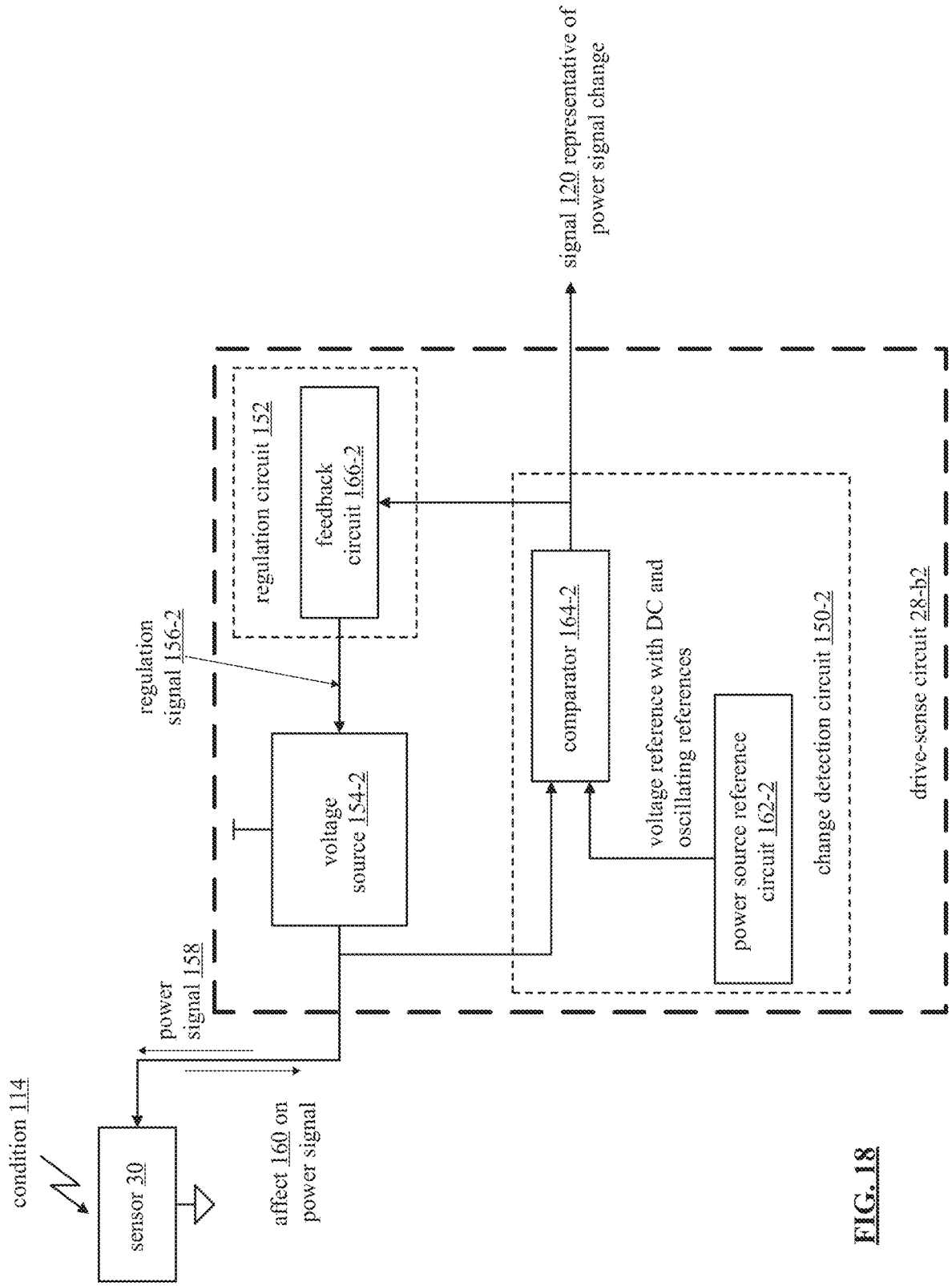
FIG. 18 is a schematic block diagram of another embodiment of a drive sense circuit in accordance with the present invention.

FIG. 18 is a schematic block diagram of another embodiment of a drive sense circuit 28-b2 that includes a voltage source 154-2 and a change detection circuit 150-2. The change detection circuit 150-2 includes a power source reference circuit 162-2 and a comparator 164-2. The voltage source 154-2 may be a linear regulator, a DC-DC converter, etc.

In an example of operation, the power source reference circuit 162-2 provides a voltage reference with DC and oscillating components to the comparator 164-2. The comparator 164-2 compares the reference voltage with the voltage power signal 158 generated by the voltage source 154-2 and produces, based on the comparison, the representative signal 120.

The regulation circuit 152, which includes a feedback circuit 166-2 (e.g., a power supply regulation circuit, a bias circuit, a wire, etc.), generates a regulation signal 156-2 based on the representative signal 120 and provides the regulation signal to the voltage source 154-2. The voltage source generates a regulated voltage as the power signal 116 based on the regulation signal 156-1.

As an example, the voltage reference signal corresponds to a given voltage (V) divided by a given impedance (Z). The voltage source 154-2 generates the power signal to produce the given voltage (V). If the impedance of the sensor 30 substantially matches the given impedance (Z), then the comparator's output is reflective of the impedances substantially matching. If the impedance of the sensor 30 is greater than the given impedance (Z), then the comparator's output is indicative of how much greater the impedance of the sensor 30 is than that of the given impedance (Z). If the impedance of the sensor 30 is less than the given impedance (Z), then the comparator's output is indicative of how much less the impedance of the sensor 30 is than that of the given impedance (Z). The regulation circuit functions to account for the variations in the impedance of the sensor and to ensure that the voltage source produces a regulated voltage source (e.g., it remains substantially at the given voltage (V)).

Figure 19:
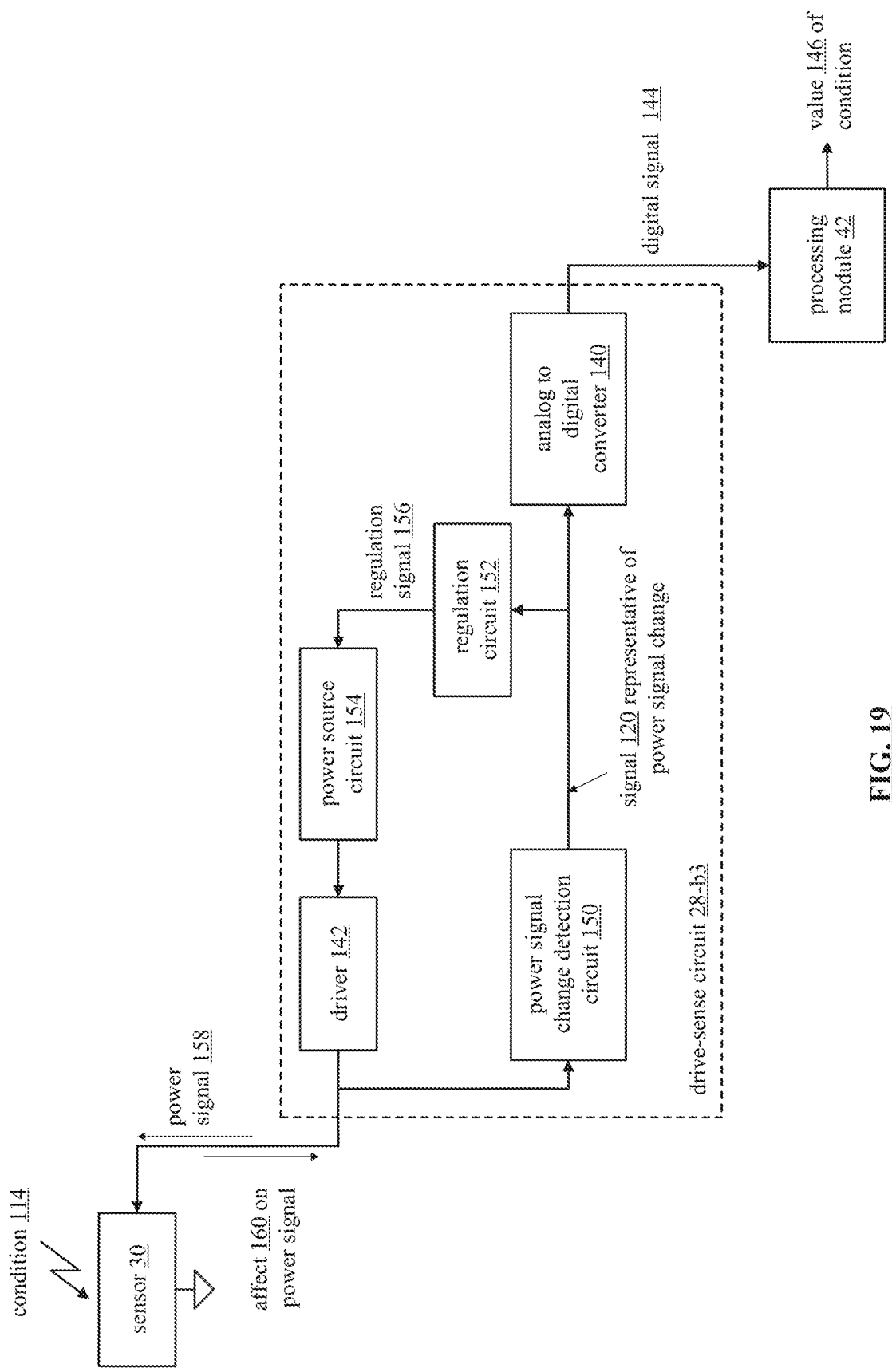
FIG. 19 is a schematic block diagram of another embodiment of a drive sense circuit in accordance with the present invention.

FIG. 19 is a schematic block diagram of another embodiment of a drive sense circuit 28-b3 that includes the power source circuit 154, the change detection circuit 150, the regulation circuit 152, an analog to digital converter 140, and a driver 142. The power source circuit 154, the regulation circuit 152, and the change detection circuit 150 function as previously discussed with reference to FIG. 16 to produce the regulation signal 156 and the signal 120 that is representative of a power signal change.

In this embodiment, the power source circuit 154 provides its output to the driver 142, which functions to increase the power (e.g., increase voltage and/or current) of the power signal. The driver 142 provides the power signal 116 to the sensor 30. With a driver, which may be a power amplifier, a low impedance sensor 30 may be used for specific types of sensing applications.

The analog to digital converter 140 converts the signal 120 that represents the power signal change into a digital signal 144. The digital signal 144 is provided to the processing module 42 via a connection between the drive-sense circuit and the processing module.

Figure 20:
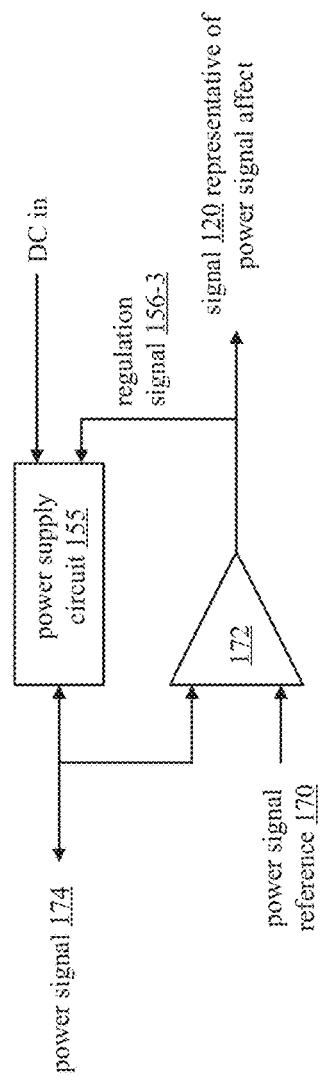
FIG. 20 is a schematic block diagram of another embodiment of a drive sense circuit in accordance with the present invention.

FIG. 20 is a schematic block diagram of another embodiment of a drive-sense circuit 28 that includes a power supply circuit 155 and an operational amplifier (op amp) or comparator 172. The power supply circuit 155 may be implemented in a variety of ways. For example, the power supply circuit 155 is a linear regulator that steps down a DC input voltage (DC in) to produce the power signal 174 based on a regulation signal 156-3. As another example, the power supply circuit 155 is a DC-DC converter that steps up or steps down the DC input voltage based on the regulation signal to produce the power signal 174.

The op amp 172 compares the power signal 174 with the power signal reference to produce the regulation signal 156-3, which is also the signal 120 representing a power signal change. In a specific embodiment, the power supply circuit 155 includes a P-channel FET (field effect transistor) and a bias circuit. The source of the P-channel FET is coupled to the DC input, the gate to the bias circuit, and the drain is coupled to provide the power signal 174. The bias circuit receives the regulation signal 156-3 and adjusts a gate-source voltage such that the voltage of the power signal 174 substantially matches the voltage of the power signal reference 170. For example, if the power signal reference has a DC component and/or an oscillating component as shown in FIG. 7, then the power signal 174 will have a substantially similar DC component and/or oscillating component.

When the power signal 174 is provided to a sensor and the sensor is exposed to a condition, an electrical characteristic of the sensor will affect the power signal. The control loop that regulates the voltage of the power signal 174 to substantially match the voltage of the power reference signal 170 will adjust the regulation signal to compensate for the affects the sensor has on the power signal 174. The compensation corresponds to the affect the electrical characteristic of the sensor has on the power signal and is representative of the condition being sensed by the sensor. Thus, the regulation signal 156-3 provides both the regulation of the power supply circuit 155 and the signal 120 that represents the effect on the power signal.

Figure 21:
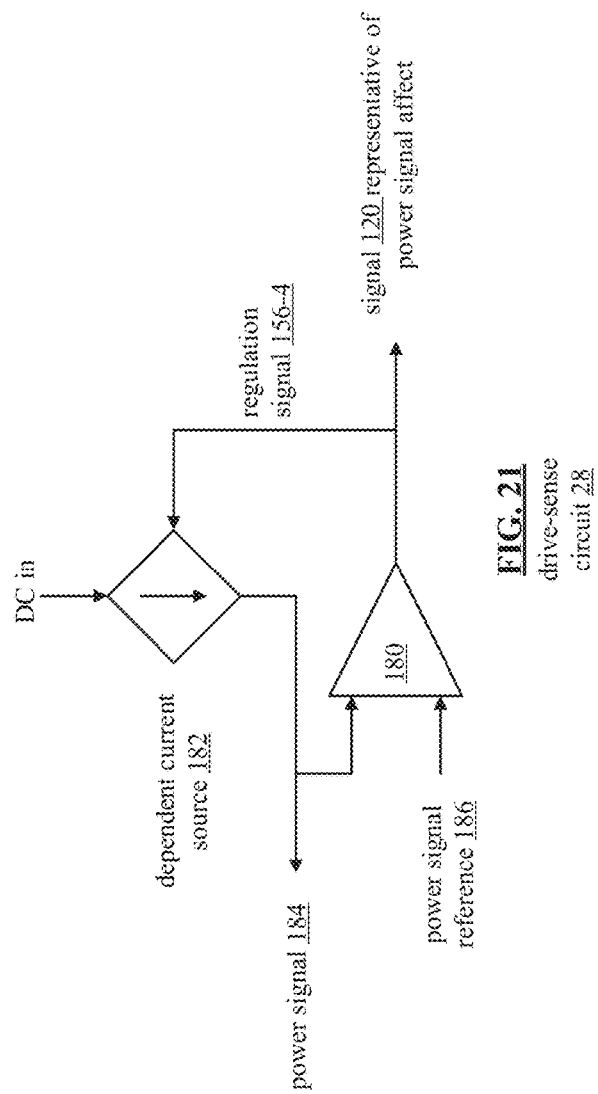
FIG. 21 is a schematic block diagram of another embodiment of a drive sense circuit in accordance with the present invention.

FIG. 21 is a schematic block diagram of another embodiment of a drive-sense circuit 28 that includes a dependent current source 182 and a transimpedance amplifier 180, which functions as a current comparator in this embodiment. The dependent current source 182 may be implemented in a variety of ways. For example, the dependent current source 182 is a current mirror circuit sourced via a DC input voltage (DC in) to produce the power signal 184 based on a regulation signal 156-3. As another example, the dependent current source 182 is voltage controlled current source. As yet another example, the dependent current source 182 is current controlled current source.

The transimpedance amplifier 180 compares current of the power signal 184 with current of the power signal reference 186 to produce the regulation signal 156-4, which is also the signal 120 representing a power signal change. In a specific embodiment, the power supply circuit 155 includes a P-channel FET (field effect transistor) and a bias circuit. The source of the P-channel FET is coupled to the DC input, the gate to the bias circuit, and the drain is coupled to provide the power signal 184. The bias circuit receives the regulation signal 156-4 and adjusts a gate-source voltage such that the current of the power signal 184 substantially matches the current of the power signal reference 186.

When the current of the power signal 184 is provided to a sensor and the sensor is exposed to a condition, an electrical characteristic of the sensor will affect the power signal. The control loop that regulates the current of the power signal 184 to substantially match the current of the power reference signal 186 will adjust the regulation signal to compensate for the affects the sensor has on the power signal 184. The compensation corresponds to the affect the electrical characteristic of the sensor has on the power signal and is representative of the condition being sensed by the sensor. Thus, the regulation signal 156-4 provides both the regulation of the dependent current source 182 and the signal 120 that represents the effect on the power signal.

Figure 22:
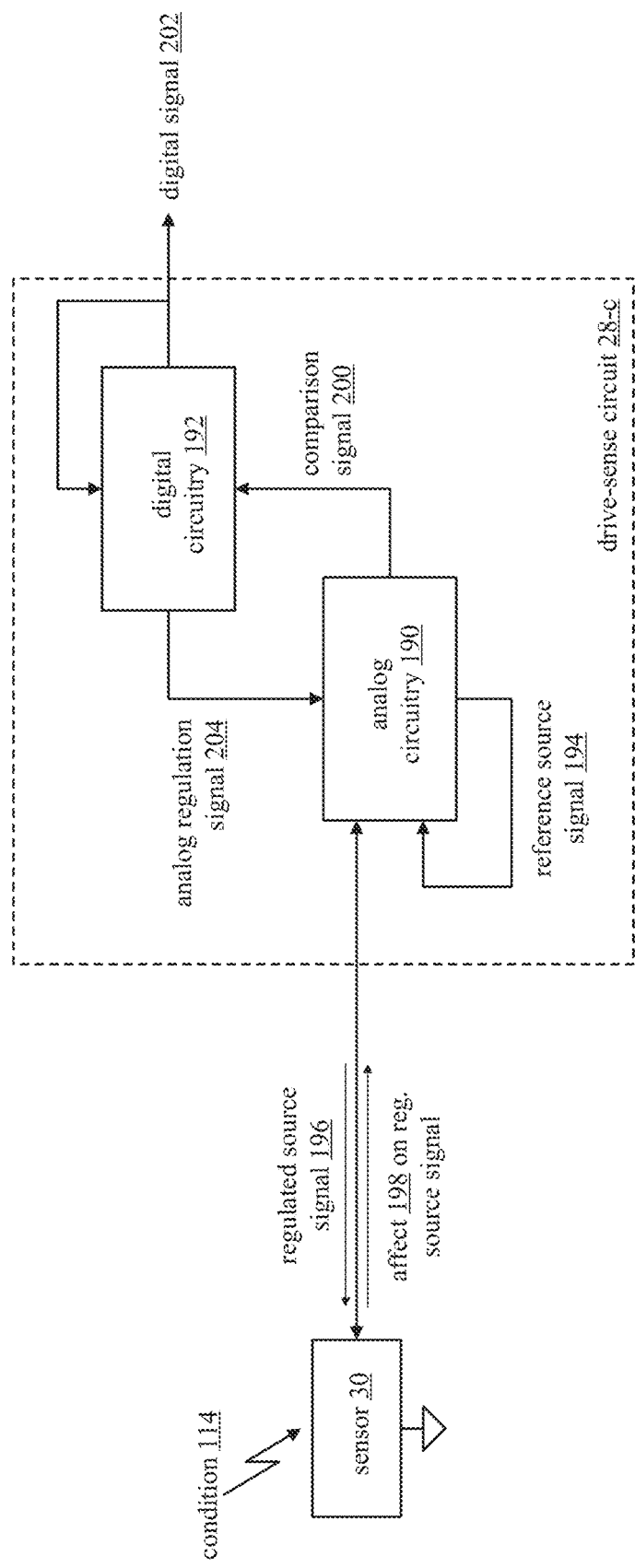
FIG. 22 is a schematic block diagram of another embodiment of a drive sense circuit in accordance with the present invention.

FIG. 22 is a schematic block diagram of another embodiment of a drive sense circuit 28-c, which is coupled to a sensor 30. The drive sense circuit 28-c includes analog circuitry 190 and digital circuitry 192. When the analog circuitry 190 is enabled, it is operable to generate a regulated source signal 196 based on an analog regulation signal 204. The analog circuitry is enabled in a variety of ways. For example, the analog circuitry 190 is enable when power is applied to the drive sense circuit 28-c. As another example, the analog circuitry 190 is enabled when the drive sense circuit receives a control signal from the processing module.

The analog circuitry 190 provides the regulated source signal 196 to the sensor 30. The regulated source signal 196 may be a regulated current signal, a regulated voltage signal, or a regulated impedance signal. When the sensor 30 is exposed to a condition 114, an electrical characteristic of the sensor affects 198 the regulated source signal.

In addition to generating the regulated source signal 196, the analog circuitry 190 also generates a reference source signal 194 at a desired source level. For example, the reference source signal 194 is generated to include a DC component having a magnitude and/or an oscillating component having a waveform (e.g., sinusoidal, square, triangular, polygonal, multiple step, etc.), a frequency, a phase, and a magnitude. The analog circuitry 190 is further operable to compare the regulated source signal 196 to the reference source signal 194 to produce a comparison signal 200. The comparison signal 200 corresponds to the affect the electrical characteristic of the sensor has on the regulated source signal and is representative of the condition 114 being sensed by the sensor 30.

When the digital circuitry is enabled, it is operable to convert the comparison signal 200 into a digital signal 202. The digital signal is a digital representation of the comparison signal and, as such, corresponds to the affect the electrical characteristic of the sensor has on the regulated source signal and is representative of the condition 114 being sensed by the sensor 30. The digital circuitry 192 is further operable to convert the digital signal 202 into the analog regulation signal 204.

Figure 23:
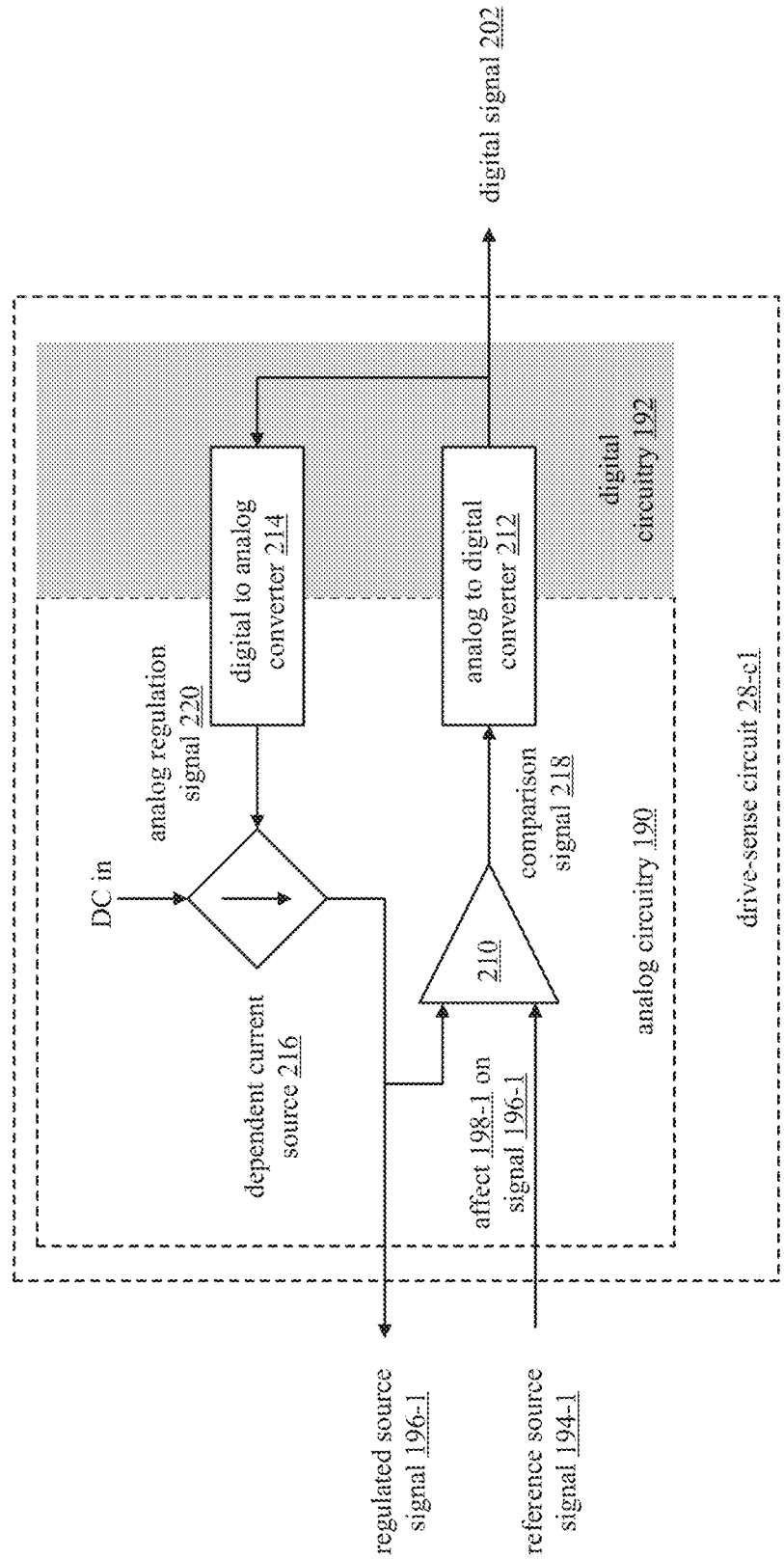
FIG. 23 is a schematic block diagram of another embodiment of a drive sense circuit in accordance with the present invention.

FIG. 23 is a schematic block diagram of another embodiment of a drive sense circuit 28-c1 that includes the analog circuitry 190 and the digital circuitry 192. The analog circuitry 190 includes a dependent current source 216, a comparator 210, an analog portion of an analog to digital converter 212, and an analog portion of a digital to analog converter 214. The digital circuitry 192 includes a digital portion of the analog to digital converter 212, and a digital portion of the digital to analog converter 214. The analog to digital converter (ADC) 212 may be a flash ADC, a successive approximation ADC, a ramp-compare ADC, a Wilkinson ADC, an integrating ADC, a delta encoded ADC, and/or a sigma-delta ADC. The digital to analog converter (DAC) 214 may be a sigma-delta DAC, a pulse width modulator DAC, a binary weighted DAC, a successive approximation DAC, and/or a thermometer-coded DAC.

The dependent current source 216 generates the regulated source signal 196-1 as a regulated current signal based on the analog regulation signal 220. The comparator 210 compares the regulated source signal 196-1 with a reference source signal 194-1, which is a current reference signal having a DC component and/or an oscillating component. The comparison signal 218 corresponds to the effect on the regulated source signal 196-1 and is representative of the condition 114 being sensed by the sensor 30. The comparator 210 provides the comparison signal 218 to the analog to digital converter 212, which generates the digital signal 202. The digital to analog converter 214 converts the digital signal into the analog regulation signals 220.

Figure 24:
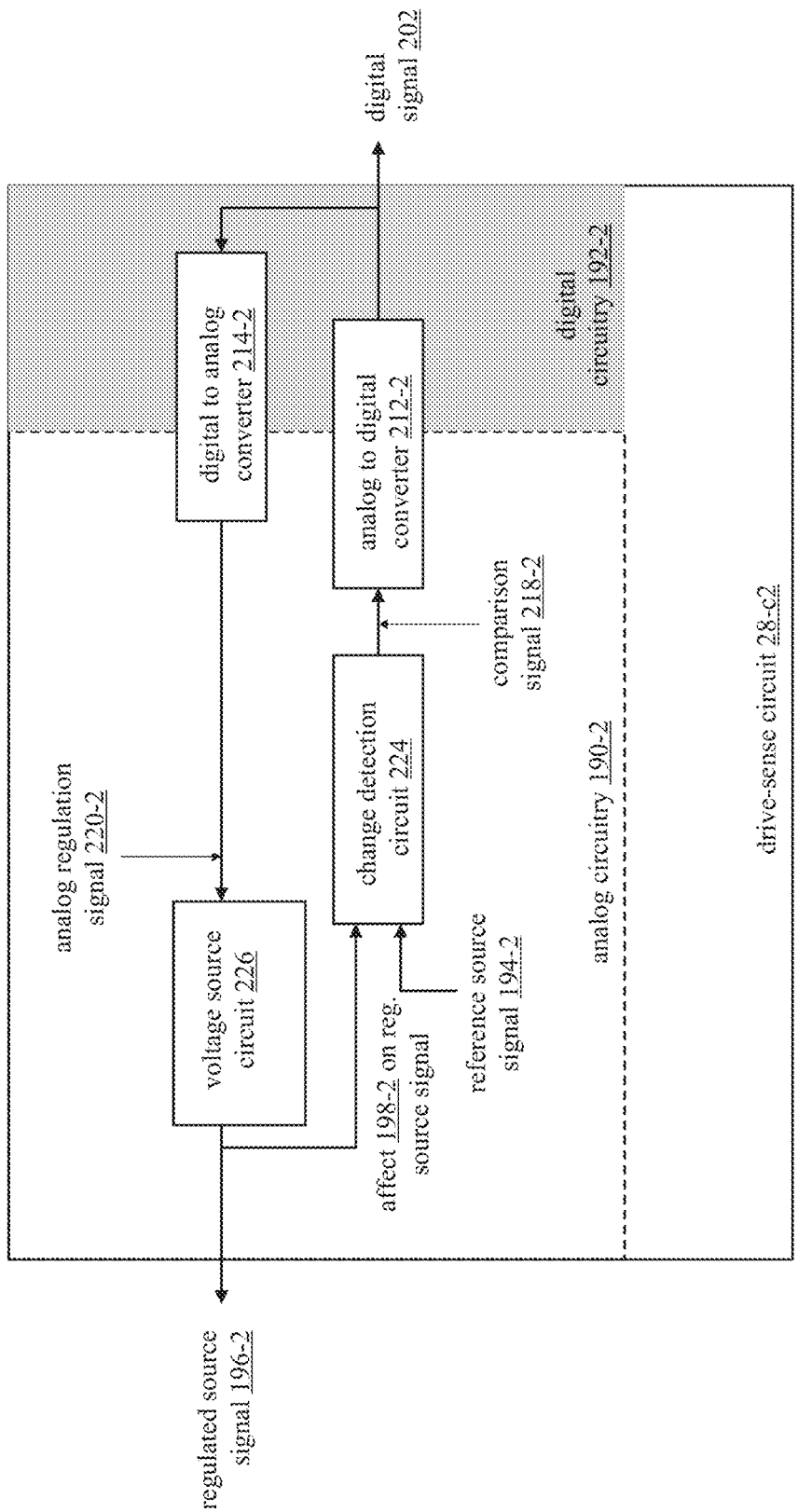
FIG. 24 is a schematic block diagram of another embodiment of a drive sense circuit in accordance with the present invention.

FIG. 24 is a schematic block diagram of another embodiment of a drive sense circuit 28-c2 that includes the analog circuitry 190 and the digital circuitry 192. The analog circuitry 190 includes a voltage source circuit 216, a change detection circuit 224, an analog portion of an analog to digital converter 212-2, and an analog portion of a digital to analog converter 214-2. The digital circuitry 192 includes a digital portion of the analog to digital converter 212-2, and a digital portion of the digital to analog converter 214-2. The analog to digital converter 212-2 and the digital to analog converter 214-2 are one or more of the types discussed with reference to FIG. 23.

The voltage source circuit 226 (e.g., a power supply, a linear regulator, a biased transistor, etc.) generates the regulated source signal 196-2 as a regulated voltage signal based on the analog regulation signal 220-2. The change detection circuit 224 (e.g., an op amp, a comparator, etc.) compares the regulated source signal 196-2 with a reference source signal 194-2, which is a voltage reference signal having a DC component and/or an oscillating component. The comparison signal 218-2 corresponds to the effect on the regulated source signal 196-2 and is representative of the condition 114 being sensed by the sensor 30. The change detection circuit 224 provides the comparison signal 218-2 to the analog to digital converter 212-2, which generates the digital signal 202. The digital to analog converter 214-2 converts the digital signal into the analog regulation signals 220-2.

Figure 25:
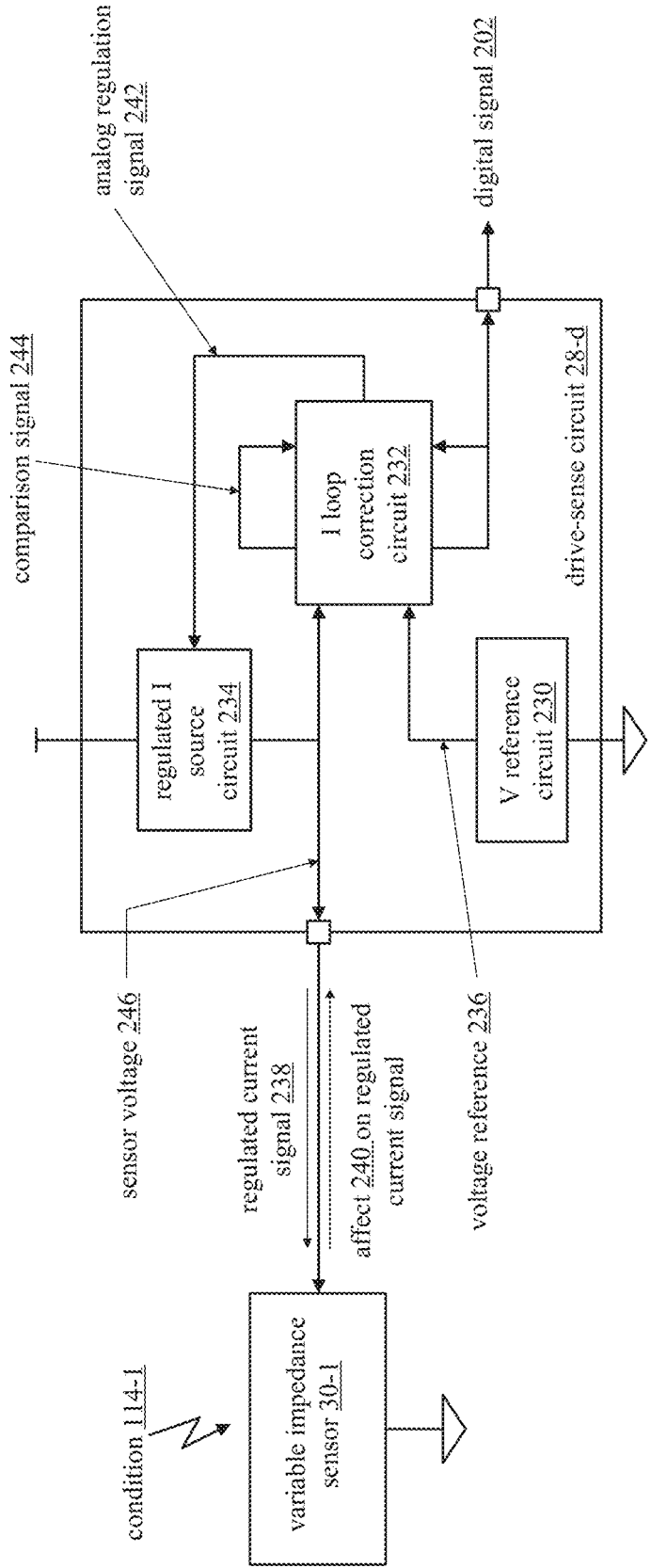
FIG. 25 is a schematic block diagram of another embodiment of a drive sense circuit in accordance with the present invention.

FIG. 25 is a schematic block diagram of another embodiment of a drive sense circuit 28-d coupled to a variable impedance sensor 30-1. The drive sense circuit 28-d includes a voltage (V) reference circuit 230, a current (I) loop correction circuit 232, and a regulated current (I) source circuit 234. In general, the drive sense circuit 28-d regulates the current applied to the sensor and keeps the voltage constant to sense an impedance (Z) of the sensor 30-1 in relation to a sensor voltage 246 and a voltage reference 236.

When the drive sense circuit 28-d is enabled, the regulated current source circuit 234 is operable to generate a regulated current signal 238 based on an analog regulation signal 242. The regulated current source circuit 234 generates the regulated current signal 238 such that the sensor voltage 246 substantially matches a voltage reference 236 produced by the V reference circuit 230.

The V reference circuit 230 (which may be a bandgap reference, a regulator, a divider network, an AC generator, and/or combining circuit) generates the voltage reference 236 to include a DC component and/or at least one oscillating component. For example, the V reference circuit generates a DC component to have a magnitude between 1 and 3 volts, generates a first sinusoidal oscillating component at frequency 1, and generates a second sinusoidal oscillating component at frequency 2. As a specific example, the first sinusoidal oscillating component at frequency 1 is used to sense self-touch on a touch screen display and the second sinusoidal oscillating component at frequency 2 is used to sense mutual touch on the touch screen display.

The regulated current source circuit 234 provides the regulated current signal 238 to the sensor 30-1. When the sensor 30-1 is exposed to a condition 114-1, its impedance affects 240 the regulated current signal 238 based on V=I*Z. As such, the sensor voltage 246 is created as a result of the current (I) provided by the regulated current source circuit 234 and the impedance of the sensor 30-1. As the impedance of the sensor 30-1 changes due to changing conditions 114-1, the current provided by the regulated current source circuit 234 changes so that the sensor voltage 246 remains substantially equal to the voltage reference 236, including the DC component and/or the oscillating component(s).

The current (I) loop correction circuit 232 is operable to generate a comparison signal 244 based on a comparison of the sensor voltage 246 with the voltage reference 236. The effect of the impedance of the sensor on the regulated current signal 238 is detected by the I loop correction circuit 232 and captured by the comparison signal 244. The I loop correction circuit 232 is further operable to convert the comparison signal 244 into a digital signal 202, which is a digital representation of the affect the impedance of the sensor has on the regulated current signal and corresponds to the sensed condition 114-1. The I loop correction circuit is further operable to convert the digital signal 202 into the analog regulation signal 242, thereby creating a feedback loop to keep the sensor voltage 246 substantially equal to the voltage reference 236.

Figure 26:
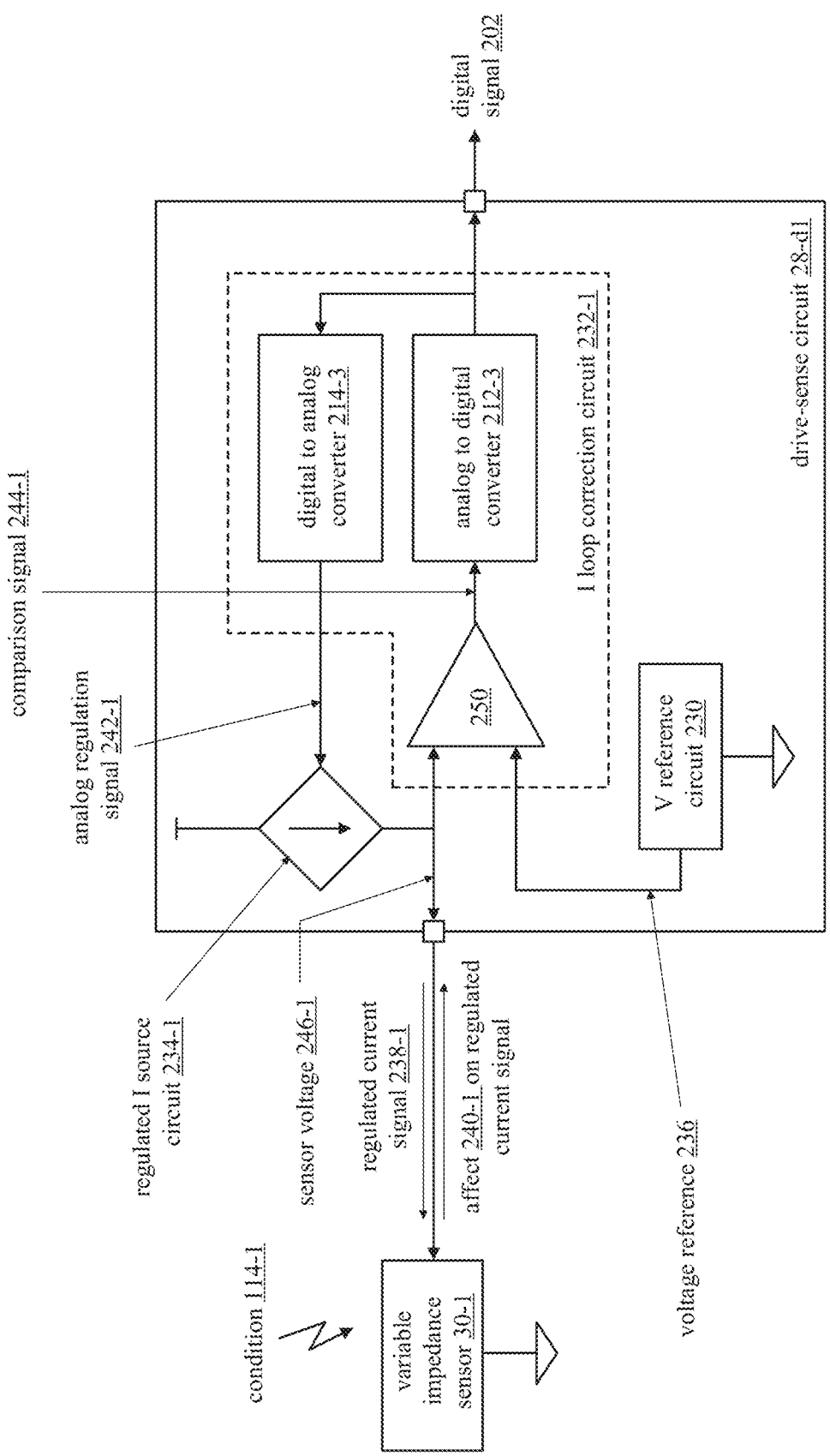
FIG. 26 is a schematic block diagram of another embodiment of a drive sense circuit in accordance with the present invention.

FIG. 26 is a schematic block diagram of another embodiment of a drive sense circuit 28-d1 coupled to a variable impedance sensor 30-1. The drive sense circuit 28-d1 includes the voltage (V) reference circuit 230, a current (I) loop correction circuit 232-1, and a regulated current (I) source circuit 234-1. The regulated current (I) source circuit 234-1 includes a dependent current source and the I loop correction circuit 232-1 includes a voltage comparator or op amp 250, an analog to digital converter 212-3 and a digital to analog converter 214-3. The analog to digital converter 212-3 and the digital to analog converter 214-3 are one or more of the types discussed with reference to FIG. 23.

When the drive sense circuit 28-d1 is enabled, the regulated current source circuit 234-1 is operable to generate a regulated current signal 238-1 based on an analog regulation signal 242-1. The regulated current source circuit 234-1 generates the regulated current signal 238-1 such that the sensor voltage 246-1 substantially matches the voltage reference 236 produced by the V reference circuit 230.

The regulated current source circuit 234-1 provides the regulated current signal 238-1 to the sensor 30-1. When the sensor 30-1 is exposed to a condition 114-1, its impedance affects 240-1 the regulated current signal 238-1 based on V=I*Z. As such, the sensor voltage 246-1 is created as a result of the current (I) provided by the regulated current source circuit 234-1 and the impedance of the sensor 30-1. As the impedance of the sensor 30-1 changes due to changing conditions 114-1, the current provided by the regulated current source circuit 234-1 changes so that the sensor voltage 246-1 remains substantially equal to the voltage reference 236-1, including the DC component and/or the oscillating component(s).

The comparator 250 compares the sensor voltage 246-1 with the voltage reference 236 to produce a comparison signal 244-1. The effect of the impedance of the sensor on the regulated current signal 238-1 is captured by the comparison signal 244-1. The analog to digital converter 212-3 converts the comparison signal 244-1 into a digital signal 202, which is a digital representation of the affect the impedance of the sensor has on the regulated current signal and corresponds to the sensed condition 114-1. The digital to analog converter 214-3 converts the digital signal 202 into the analog regulation signal 242-1, thereby creating a feedback loop to keep the sensor voltage 246-1 substantially equal to the voltage reference 236.

Figure 27:
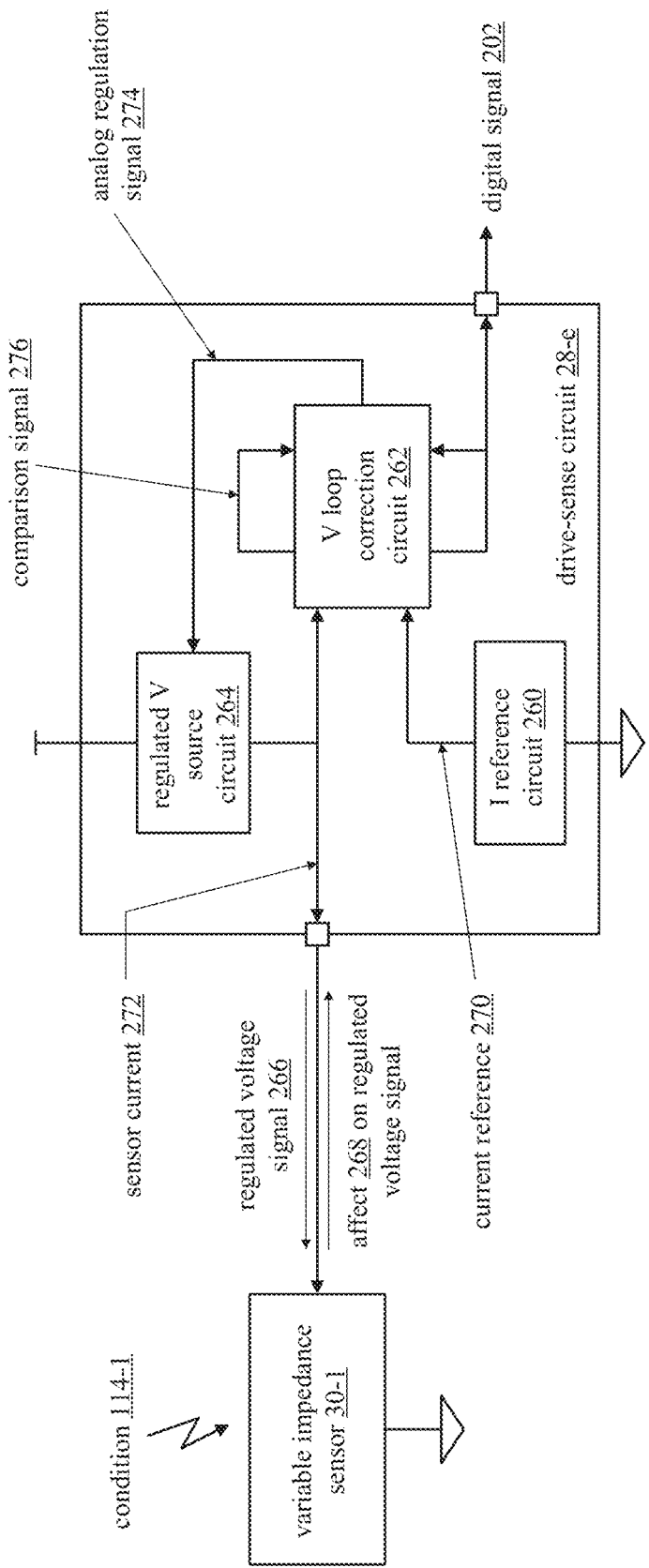
FIG. 27 is a schematic block diagram of another embodiment of a drive sense circuit in accordance with the present invention.

FIG. 27 is a schematic block diagram of another embodiment of a drive sense circuit 28-*e* coupled to a variable impedance sensor 30-1. The drive sense circuit 28-*e* includes a current (I) reference circuit 260, a voltage (V) loop correction circuit 262, and a regulated voltage (V) source circuit 264. In general, the drive sense circuit 28-*e* regulates the voltage applied to the sensor and keeps the current constant to sense an impedance (Z) of the sensor 30-1 in relation to a sensor current 272 and a current reference 270.

When the drive sense circuit 28-*e* is enabled, the regulated voltage source circuit 264 is operable to generate a regulated voltage signal 266 based on an analog regulation signal 274. The regulated voltage source circuit 264 generates the regulated voltage signal 266 such that the sensor current 272 substantially matches the current reference 270 produced by the I reference circuit 260.

The I reference circuit 260 (which may be a biased dependent current source, an independent current source, a current mirror, an AC current generator, and/or combining circuit) generates the current reference 270 to include a DC component and/or at least one oscillating component. For example, the I reference circuit generates a DC component to have a magnitude between 100 micro-amps and 300 micro-amps (or other range), generates a first sinusoidal oscillating current component at frequency 1, and generates a second sinusoidal oscillating current component at frequency 2. As a specific example, the first sinusoidal oscillating current component at frequency 1 is used to sense self-touch on a touch screen display and the second sinusoidal oscillating current component at frequency 2 is used to sense mutual touch on the touch screen display.

The regulated voltage source circuit 264 provides the regulated voltage signal 266 to the sensor 30-1. When the sensor 30-1 is exposed to a condition 114-1, its impedance affects 240 the regulated voltage signal 266 based on Z=V/I. As such, the sensor current 272 is created as a result of the voltage (V) provided by the regulated voltage source circuit 264 and the impedance of the sensor 30-1. As the impedance of the sensor 30-1 changes due to changing conditions 114-1, the voltage provided by the regulated voltage source circuit 264 changes so that the sensor current 272 remains substantially equal to the current reference 270, including the DC component and/or the oscillating component(s).

The voltage (V) loop correction circuit 262 is operable to generate a comparison signal 276 based on a comparison of the sensor current 272 with the current reference 270. The effect of the impedance of the sensor on the regulated voltage signal 266 is detected by the V loop correction circuit 262 and is captured by the comparison signal 276. The V loop correction circuit 262 is further operable to convert the comparison signal 276 into the digital signal 202, which is a digital representation of the affect 268 the impedance of the sensor has on the regulated voltage signal and corresponds to the sensed condition 114-1. The V loop correction circuit is further operable to convert the digital signal 202 into the analog regulation signal 274, thereby creating a feedback loop to keep the sensor current 272 substantially equal to the current reference 270.

Figure 28:
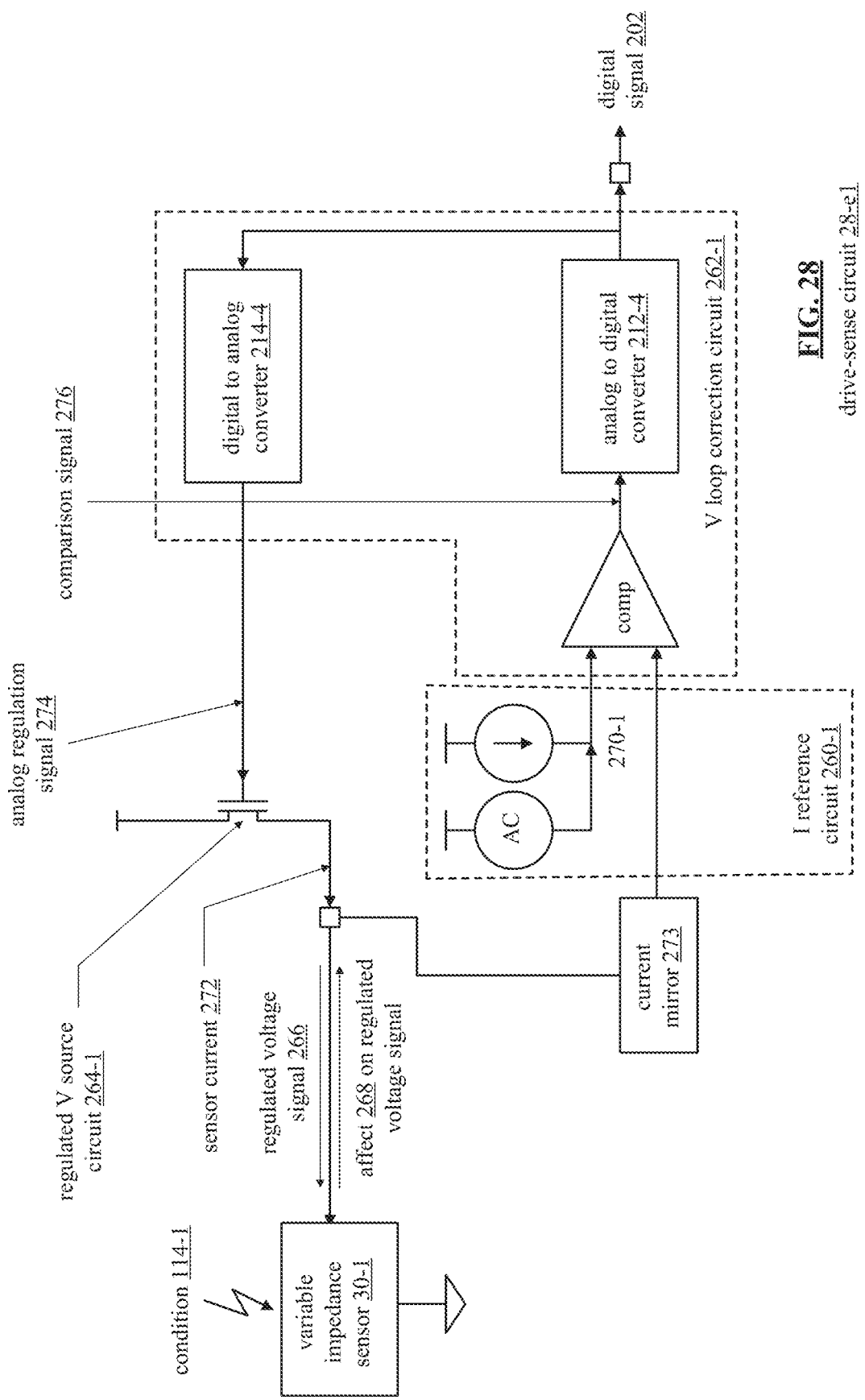
FIG. 28 is a schematic block diagram of another embodiment of a drive sense circuit in accordance with the present invention.

FIG. 28 is a schematic block diagram of another embodiment of a drive sense circuit 28-*e1* coupled to a variable impedance sensor 30-1. The drive sense circuit 28-*e1* includes a current (I) reference circuit 260-1, a voltage (V) loop correction circuit 262-1, and a regulated voltage (V) source circuit 264-1. The I reference circuit 260-1 includes an independent current source to produce a reference current ($I_{ref}$). The V loop correction circuit 262-1 includes a current comparator (e.g., a transimpedance amplifier), an analog to digital converter 212-4 and a digital to analog converter 214-4. The regulated voltage source 264-1 includes a P-channel FET and a current mirror 273. The regulated voltage source 264-1 may further include a bias circuit (not shown) coupled between the gate and source of the P-channel FET. The analog to digital converter 212-4 and the digital to analog converter 214-4 are one or more of the types discussed with reference to FIG. 23.

When the drive sense circuit 28-*e1* is enabled, the regulated voltage source circuit 264-1 is operable to generate a regulated voltage signal 266 based on an analog regulation signal 274-1. The regulated voltage source circuit 264 generates the regulated voltage signal 266 such that the sensor current 272 substantially matches the current reference 270, a multiple thereof, or a fraction thereof, produced by the I reference circuit 260. The current mirror 273 mirrors the sensor current 272 and the mirrored current substantially matches the current reference 270. The mirrored current produced by the current mirror 273 is equal to the sensor current 272, is greater than the sensor current 272, or is less than the sensor current 272 depending on the application and/or the sensor sensitivity.

The I reference circuit 260 (which may a DC current source and/or an AC current source) generates the current reference 270-1 to include a DC component and/or at least one oscillating component. For example, the I reference circuit generates a DC component to have a magnitude between 100 micro-amps and 300 micro-amps (or other range), generates a first sinusoidal oscillating current component at frequency 1, and generates a second sinusoidal oscillating current component at frequency 2.

The regulated voltage source circuit 264-1 provides the regulated voltage signal 266 to the sensor 30-1. When the sensor 30-1 is exposed to a condition 114-1, its impedance affects 240 the regulated voltage signal 266 based on Z=V/I. As such, the sensor current 272 is created as a result of the voltage (V) provided by the regulated voltage source circuit 264-1 and the impedance of the sensor 30-1. As the impedance of the sensor 30-1 changes due to changing conditions 114-1, the voltage provided by the regulated voltage source circuit 264-1 changes so that the mirrored current of the sensor current 272 remains substantially equal to the current reference 270-1, including the DC component and/or the oscillating component(s).

The current comparator (comp) compares the mirrored current of the sensor current 272 with the current reference 270-1 to generate the comparison signal 276. The effect of the impedance of the sensor on the regulated voltage signal 266 is captured by the comparison signal 276. The analog to digital converter 212-4 converts the comparison signal 276 into the digital signal 202, which is a digital representation of the affect the impedance of the sensor has on the regulated voltage signal and corresponds to the sensed condition 114-1. The digital to analog converter 214-4 convert the digital signal 202 into the analog regulation signal 274, thereby creating a feedback loop to keep the mirrored current of the sensor current 272 substantially equal to the current reference 270-1.

Figure 29:
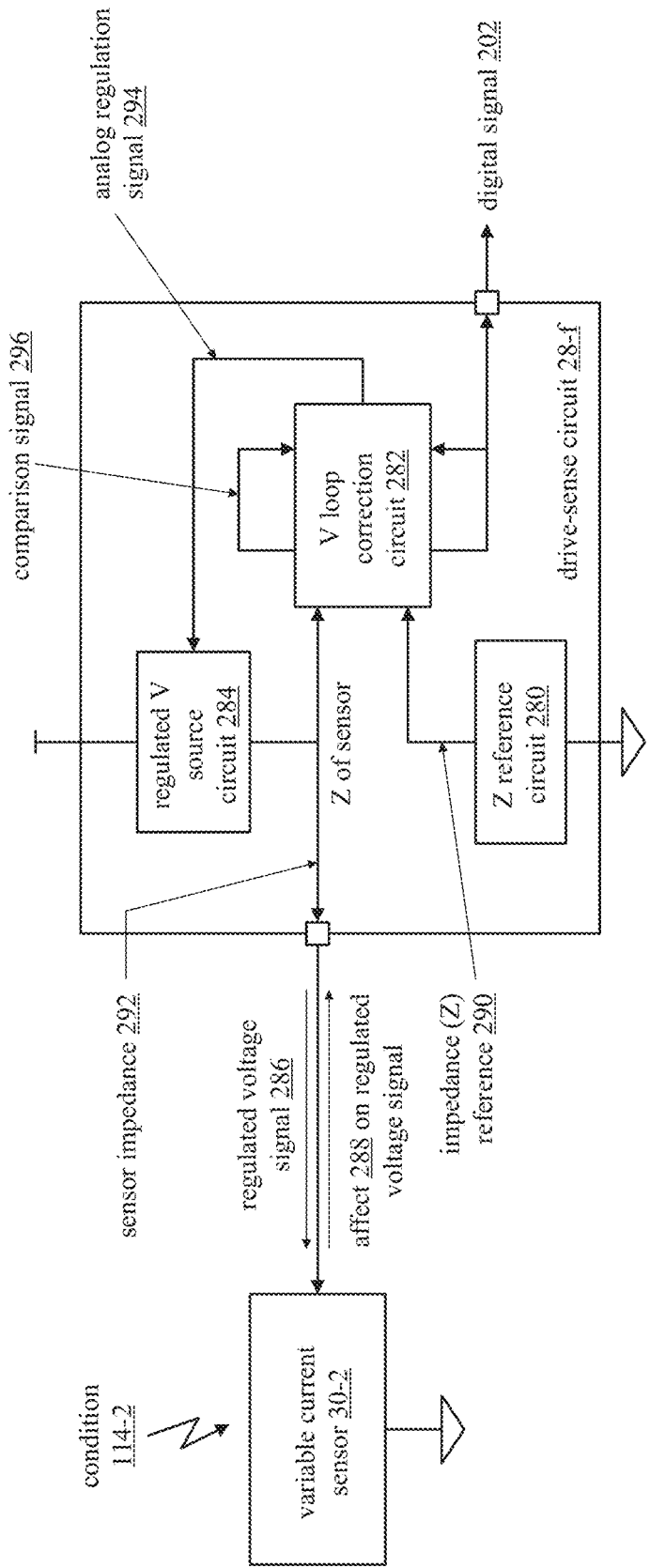
FIG. 29 is a schematic block diagram of another embodiment of a drive sense circuit in accordance with the present invention.

FIG. 29 is a schematic block diagram of another embodiment of a drive sense circuit 28-*f* coupled to a variable current sensor 30-2. The drive sense circuit 28-*f* includes an impedance (Z) reference circuit 280, a voltage (V) loop correction circuit 282, and a regulated voltage (V) source circuit 284. In general, the drive sense circuit 28-*f* regulates the voltage applied to the sensor and keeps the sensor's impedance constant to sense a current (I) of the sensor 30-2 in relation to a sensor impedance 292 and an impedance (Z) reference 290. Varying current of the sensor 30-2 is indicative of changes to the condition 114-2 being sensed (e.g., magnetic field, current flow, etc.), which may be used in motor monitoring applications, load sensing applications, electronic circuit applications, failure analysis applications, etc.

When the drive sense circuit 28-*f* is enabled, the regulated voltage source circuit 284 is operable to generate a regulated voltage signal 286 based on an analog regulation signal 294. The regulated voltage source circuit 284 generates the regulated voltage signal 286 such that the sensor impedance 292 (e.g., capacitance, inductance, etc.) substantially matches the impedance reference 290 produced by the Z reference circuit 280.

The Z reference circuit 280 (which may be a capacitor, an inductor, a circuit equivalent of a capacitor, a circuit equivalent of an inductor, a tunable capacitor bank, etc.) generates the impedance reference 290 to include a DC component and/or at least one oscillating (AC) component. For example, the Z reference circuit generates a DC component to have a desired resistance at DC and/or to have a first desired impedance at frequency 1, and have a second desired impedance at frequency 2.

The regulated voltage source circuit 284 provides the regulated voltage signal 286 to the sensor 30-2. When the sensor 30-2 is exposed to a condition 114-2, its current affects 288 the regulated voltage signal 286 based on I=V/Z. As such, the sensor impedance 292 corresponds to the voltage (V) provided by the regulated voltage source circuit 284 and the current flowing through the sensor 30-2. As the current of the sensor 30-2 changes due to changing conditions 114-1, the voltage provided by the regulated voltage source circuit 284 changes so that the sensor impedance 292 remains substantially equal to the impedance reference 290, including the DC resistance and/or desired impedances at f1 and f2.

The voltage (V) loop correction circuit 282 is operable to generate a comparison signal 296 based on a comparison of the sensor impedance 292 with the impedance reference 290. The effect of the current of the sensor on the regulated impedance signal 286 is detected by the V loop correction circuit 282 and is captured by the comparison signal 296. The V loop correction circuit 282 is further operable to convert the comparison signal 296 into the digital signal 202, which is a digital representation of the affect the current of the sensor has on the regulated voltage signal and corresponds to the sensed condition 114-2. The V loop correction circuit is further operable to convert the digital signal 202 into the analog regulation signal 294, thereby creating a feedback loop to keep the sensor impedance 292 substantially equal to the impedance reference 290.

Figure 30:
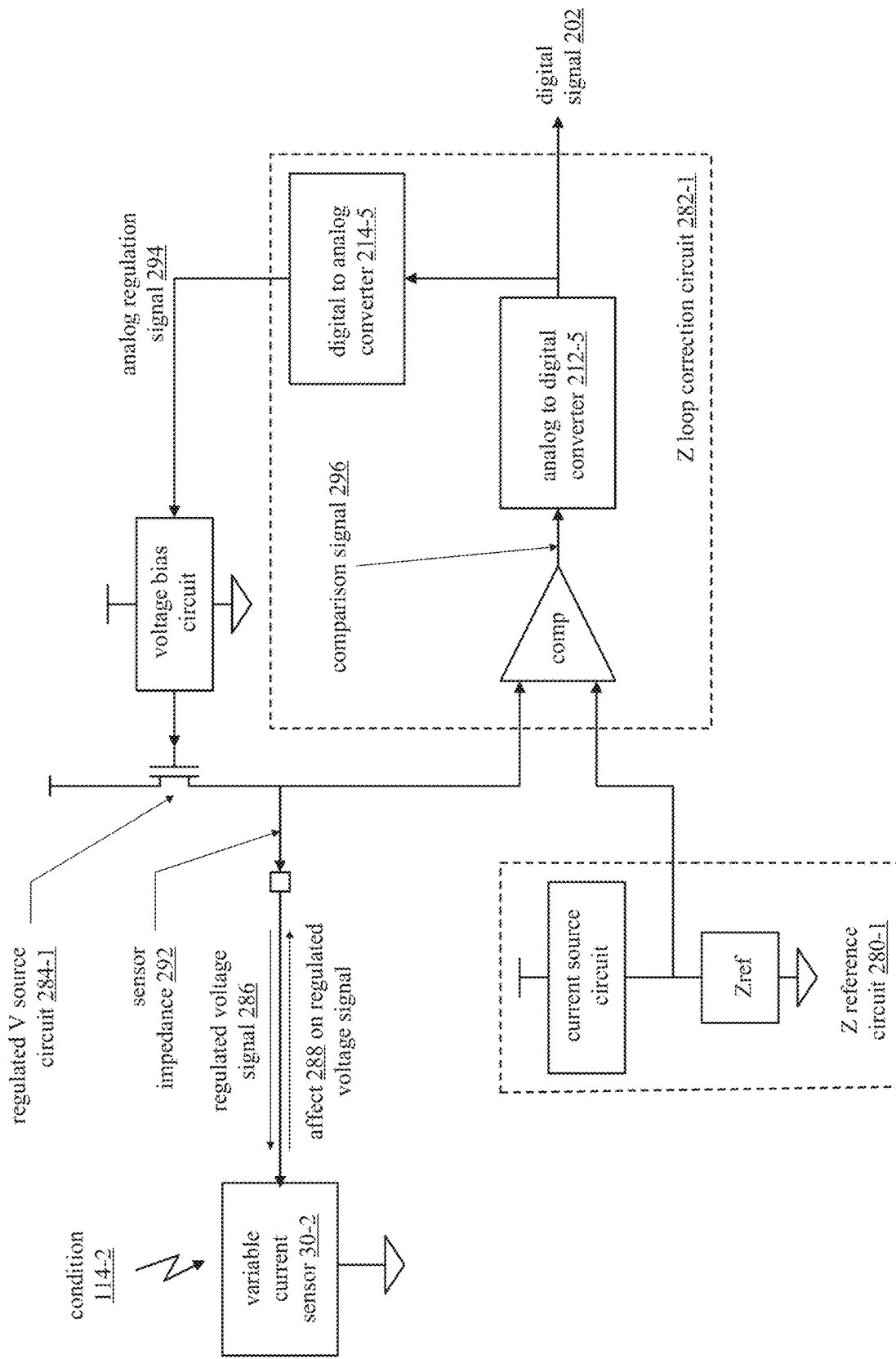
FIG. 30 is a schematic block diagram of another embodiment of a drive sense circuit in accordance with the present invention.

FIG. 30 is a schematic block diagram of another embodiment of a drive sense circuit 28-*f*1 coupled to a variable current sensor 30-2. The drive sense circuit 28-*f*1 includes an impedance (Z) reference circuit 280-1, a voltage (V) loop correction circuit 282-1, and a regulated voltage (V) source circuit 284-1. The Z reference circuit includes a current source circuit and an impedance ($Z_{ref}$). The V loop correction circuit 282-1 includes a comparator (comp), an analog to digital converter 212-5 and a digital to analog converter 214-5. The analog to digital converter 212-5 and the digital to analog converter 214-5 are one or more of the types discussed with reference to FIG. 23.

When the drive sense circuit 28-*f*1 is enabled, the regulated voltage source circuit 284-1, which includes a P-channel transistor and a voltage bias circuit, is operable to generate a regulated voltage signal 286 based on an analog regulation signal 294. The regulated voltage source circuit 284-1 generates the regulated voltage signal 286 such that the sensor impedance 292 (e.g., capacitance, inductance, etc.) substantially matches the impedance reference 290 produced by the Z reference circuit 280.

The Z reference circuit 280 (which includes a current source circuit and an impedance) generates the impedance reference 290 in accordance with (V/I) to include a DC component and/or at least one oscillating (AC) component. For example, the Z reference circuit generates a DC component to have a desired resistance at DC, to have a first desired impedance at frequency 1, and to have a second desired impedance at frequency 2.

The regulated voltage source circuit 284-1 provides the regulated voltage signal 286 to the sensor 30-2. When the sensor 30-2 is exposed to a condition 114-2, its current affects 288 the regulated impedance signal 286 based on I=V/Z. As such, the sensor impedance 292 corresponds to the voltage (V) provided by the regulated voltage source circuit 284 and the current flowing through the sensor 30-2. As the current of the sensor 30-2 changes due to changing conditions 114-1, the voltage provided by the regulated voltage source circuit 284 changes so that the sensor impedance 292 remains substantially equal to the impedance reference 290, including the DC resistance and/or desired impedances at f1 and f2.

The comparator compares (as voltages or currents) the impedance reference with the sensor impedance 292 to produce a comparison signal 296, which captures the effect of the current of the sensor has on the regulated impedance signal 286. The analog to digital converter 212-5 converts the comparison signal 296 into the digital signal 202, which is a digital representation of the affect the current of the sensor has on the regulated voltage signal and corresponds to the sensed condition 114-2. The digital to analog converter 214-5 converts the digital signal 202 into the analog regulation signal 294, thereby creating a feedback loop to keep the sensor impedance 292 substantially equal to the impedance reference 290.

Figure 31:
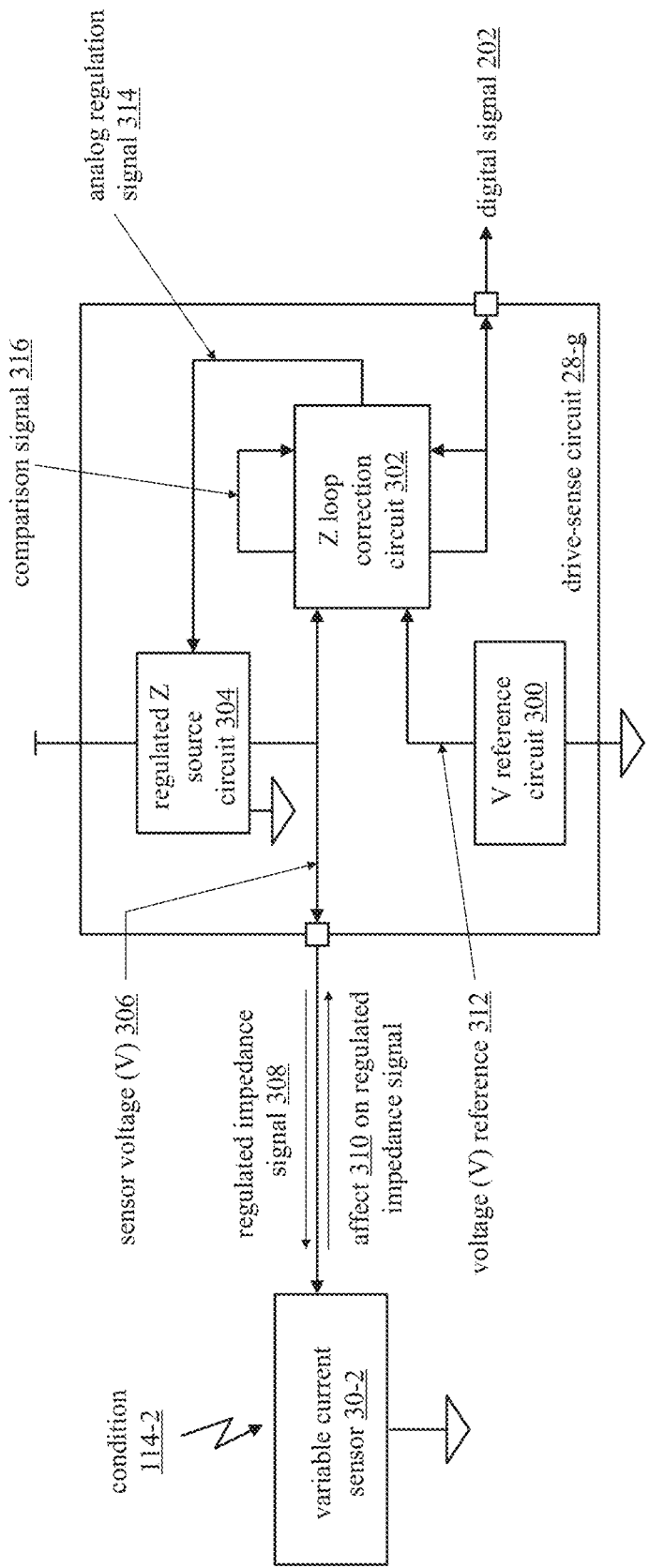
FIG. 31 is a schematic block diagram of another embodiment of a drive sense circuit in accordance with the present invention.

FIG. 31 is a schematic block diagram of another embodiment of a drive sense circuit 28-*g* coupled to a variable current sensor 30-2. The drive sense circuit 28-*g* includes a voltage (V) reference circuit 300, an impedance (Z) loop correction circuit 302, and a regulated impedance (Z) source circuit 304. In general, the drive sense circuit 28-*g* regulates the impedance of the sensor and keeps the sensor's voltage constant to sense a current (I) of the sensor 30-2 in relation to a sensor voltage 306 and a voltage (V) reference 312. Varying current of the sensor 30-2 is indicative of changes to the condition 114-2 being sensed (e.g., magnetic field, current flow, etc.), which may be used in motor monitoring applications, load sensing applications, electronic circuit applications, failure analysis applications, etc.

When the drive sense circuit 28-*g* is enabled, the regulated impedance source circuit 304 is operable to generate a regulated impedance signal 308 based on an analog regulation signal 314. The regulated impedance source circuit 304 generates the regulated impedance signal 308 by varying frequency of a voltage produced by the regulated Z source circuit 304 such that the sensor voltage 306 substantially matches the voltage reference 312 produced by the V reference circuit 300.

The V reference circuit 300 (which includes a bandgap reference, a linear regulator, a power supply, a divider network, an AC generator, a combining circuit and/or etc.)

generates the voltage reference 312 to include a DC component and/or at least one oscillating (AC) component. For example, the V reference circuit generates a DC component to have a desired DC level, a first oscillating component at a first frequency 1, and a second oscillating component at frequency 2. Alternatively, the frequency of the oscillating component sweeps a frequency range to find a frequency, or frequencies, that optimizes the impedance of the sensor.

The regulated impedance source circuit 304 provides the regulated impedance signal 308 to the sensor 30-2. When the sensor 30-2 is exposed to a condition 114-2, its current affects 288 the regulated impedance signal 308 based on I=V/Z. As such, the sensor voltage 306 corresponds to the impedance of the sensor as regulated by the regulation Z source circuit and the current provided by the regulated impedance source circuit 304 to the sensor 30-2. As the current of the sensor 30-2 changes due to changing conditions 114-2, the impedance is adjusted by the regulated impedance source circuit 304 changes so that the sensor voltage 306 remains substantially equal to the voltage reference 312, including the DC resistance and desired impedances at f1 and f2.

The impedance (Z) loop correction circuit 302 is operable to generate a comparison signal 316 based on a comparison of the sensor voltage 306 with the voltage reference 312. The effect of the current of the sensor on the regulated voltage signal 308 is detected by the Z loop correction circuit 302 and is captured by the comparison signal 316. The Z loop correction circuit 302 is further operable to convert the comparison signal 316 into the digital signal 202, which is a digital representation of the affect the current of the sensor has on the regulated impedance signal and corresponds to the sensed condition 114-2. The Z loop correction circuit is further operable to convert the digital signal 202 into the analog regulation signal 314, thereby creating a feedback loop to keep the sensor voltage 306 substantially equal to the voltage reference 312.

Figure 32:
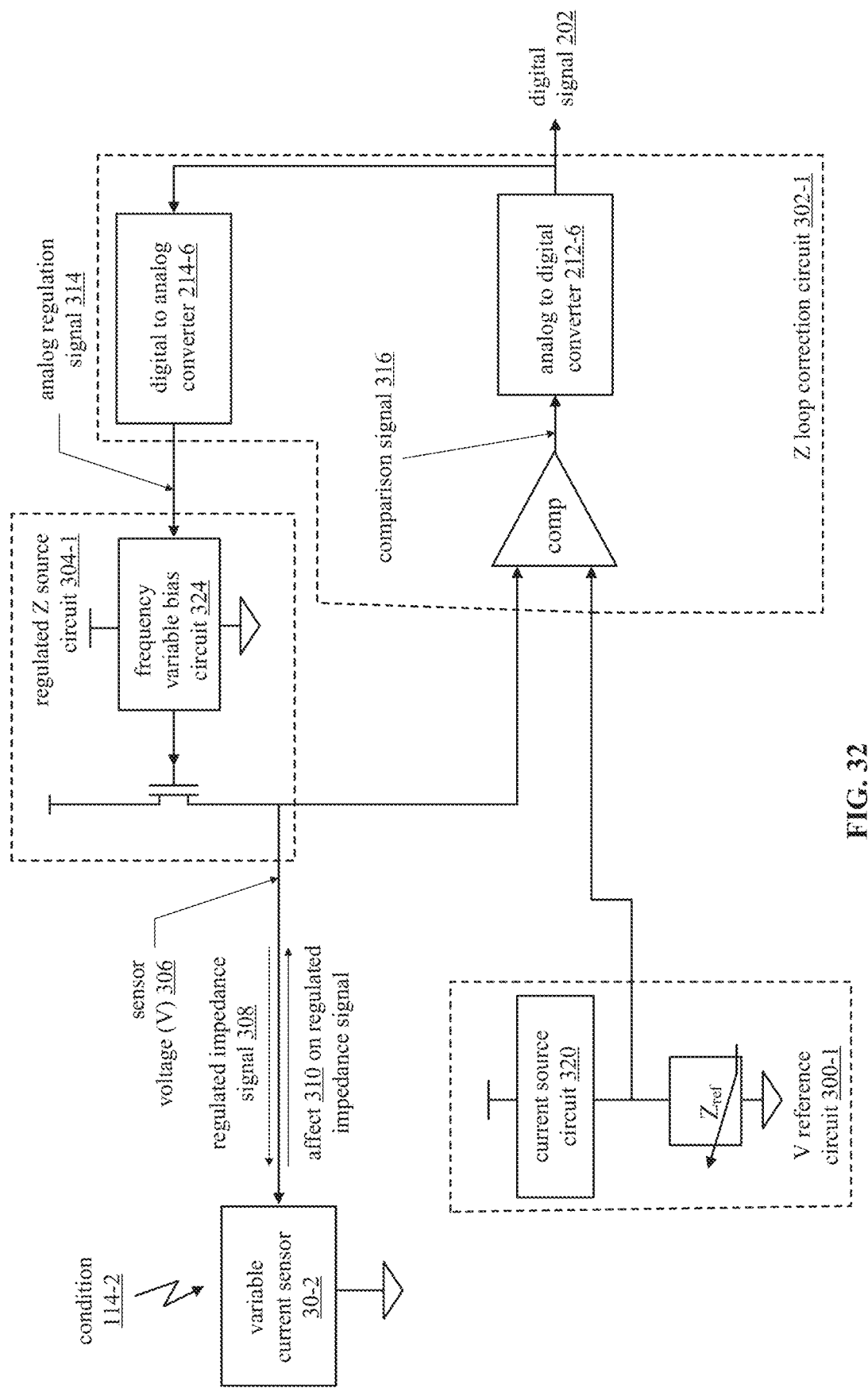
FIG. 32 is a schematic block diagram of another embodiment of a drive sense circuit in accordance with the present invention.

FIG. 32 is a schematic block diagram of another embodiment of a drive sense circuit 28-g1 coupled to a variable current sensor 30-2. The drive sense circuit 28-g1 includes a voltage (V) reference circuit 300-1, an impedance (Z) loop correction circuit 302-1, and a regulated impedance (Z) source circuit 304. The voltage reference circuit 300-1 includes a current source circuit 320 and a variable impedance. The Z loop correction circuit 302-1 includes a comparator or op amp, an analog to digital converter 212-6 and a digital to analog converter 214-6. The analog to digital converter 212-6 and the digital to analog converter 214-6 are one or more of the types discussed with reference to FIG. 23.

When the drive sense circuit 28-g1 is enabled, the regulated impedance source circuit 304-1 is operable to generate the regulated impedance signal 308 based on an analog regulation signal 314. The frequency variable bias circuit 324 provides a frequency vary gate source voltage to the P-channel FET to generate the regulated impedance signal 308, which includes a varying frequency voltage component. In this manner, the sensor voltage 306 substantially matches the voltage reference 312 produced by the V reference circuit 300-1.

The V reference circuit 300 (which includes a current source and a variable impedance.) generates the voltage reference 312 to include a DC component and/or at least one oscillating (AC) component. For example, the current source circuit 320 and/or the variable impedance generate a DC component to have a desired DC level, a first oscillating component at a first frequency 1, and a second oscillating component at frequency 2. Alternatively, the current source circuit 320 and/or the variable impedance performs a frequency sweeps within a frequency range to find a frequency, frequencies, that optimizes the impedance of the sensor.

The regulated impedance source circuit 304 provides the regulated impedance signal 308 to the sensor 30-2. When the sensor 30-2 is exposed to a condition 114-2, its current affects 288 the regulated impedance signal 308 based on I=V/Z. As such, the sensor voltage 306 corresponds to the impedance of the sensor as regulated by the regulation Z source circuit and the current provided by the regulated impedance source circuit 304 to the sensor 30-2. As the current of the sensor 30-2 changes due to changing conditions 114-2, the impedance is adjusted by the regulated impedance source circuit 304 changes so that the sensor voltage 306 remains substantially equal to the voltage reference 312, including the DC resistance and/or desired impedances at f1 and f2.

The comparator is operable to generate a comparison signal 316 based on a comparison of the sensor voltage 306 with the voltage reference 312. The effect of the current of the sensor on the regulated voltage signal 308 is detected by the Z loop correction circuit 302 and is captured by the comparison signal 316. The analog to digital converter 212-6 converts the comparison signal 316 into the digital signal 202, which is a digital representation of the affect the current of the sensor has on the regulated impedance signal and corresponds to the sensed condition 114-2. The digital to analog converter 214-6 convert the digital signal 202 into the analog regulation signal 314, thereby creating a feedback loop to keep the sensor voltage 306 substantially equal to the voltage reference 312.

Figure 33:
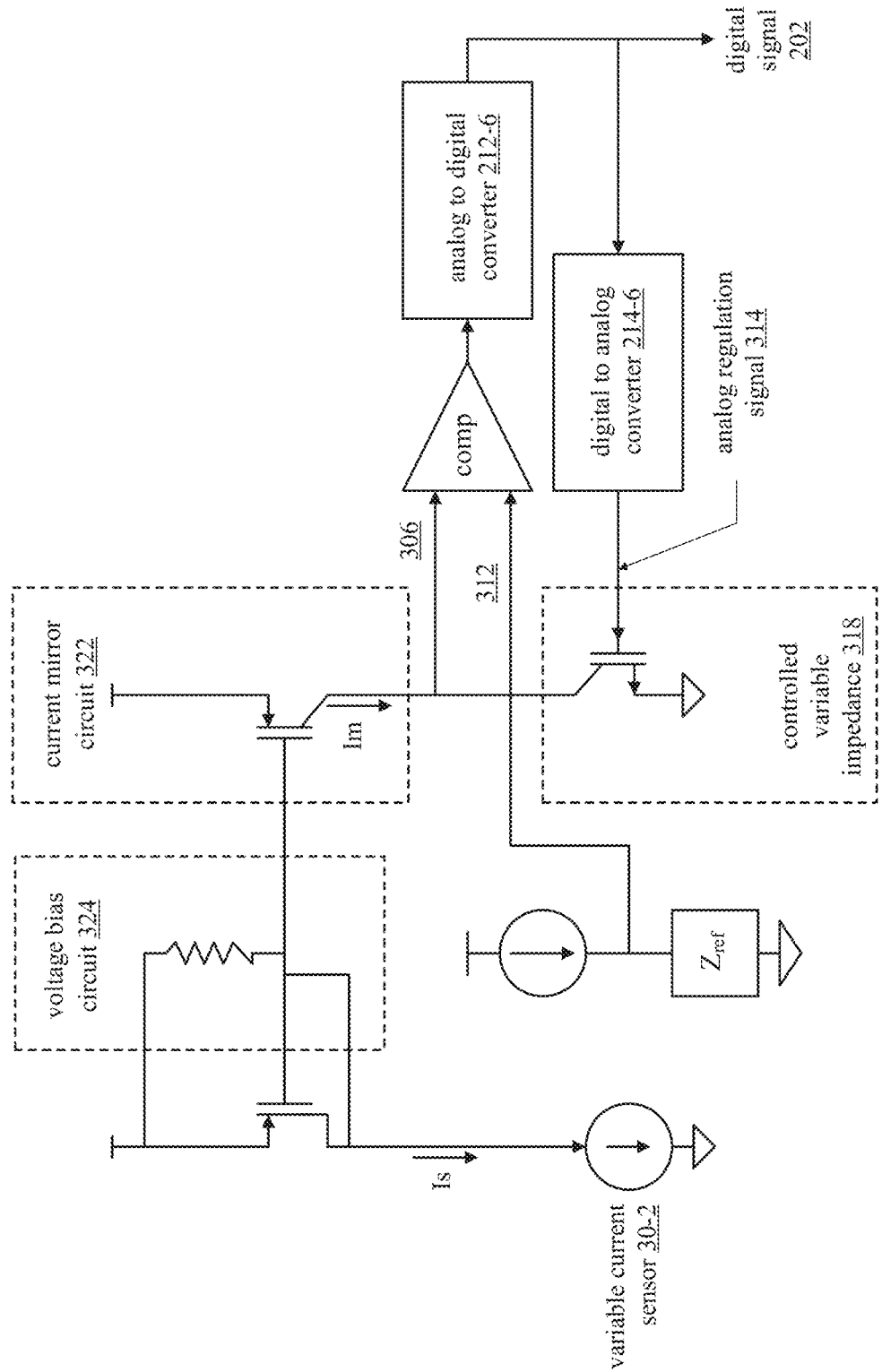
FIG. 33 is a schematic block diagram of another embodiment of a drive sense circuit in accordance with the present invention.

FIG. 33 is a schematic block diagram of another embodiment of a drive sense circuit 28-g2 coupled to a variable current sensor 30-2. The drive sense circuit 28-g1 includes a voltage (V) reference circuit (which includes a current source and an impedance (Zref)), an impedance (Z) loop correction circuit (which includes the comparator, the analog to digital converter 212-6, the digital to analog converter 214-6, a current mirror circuit 322, and a controlled variable impedance 318), and a regulated impedance (Z) source circuit (which includes a voltage bias circuit 324 and a P-channel FET).

When the drive sense circuit 28-g1 is enabled, the comparator compares the voltage reference signal 312 with the sensor voltage 306 to produce the comparison signal. The analog to digital converter converts the comparison signal into the digital signal 202. The digital to analog converter converts the digital signal 202 into the analog regulation signal 314.

The analog regulation signal 314 varies the impedance of the controlled variable impedance 318. The varying impedance of circuit 318 is multiplied by the mirrored current ($I_m$) of the sensor current ($I_s$) to produce the sensor voltage 306. The mirrored current is produced by the current mirror circuit 322 that mirrors the current provided by the P-channel FET to the variable current sensor 30-2. The P-channel FET is enabled via the voltage bias circuit 324, which includes one or more resistors and/or one or more capacitors. The varying of the impedance of the controlled variable impedance 318 regulates the sensor voltage 306 to substantially match the reference voltage 312.

Figure 34:
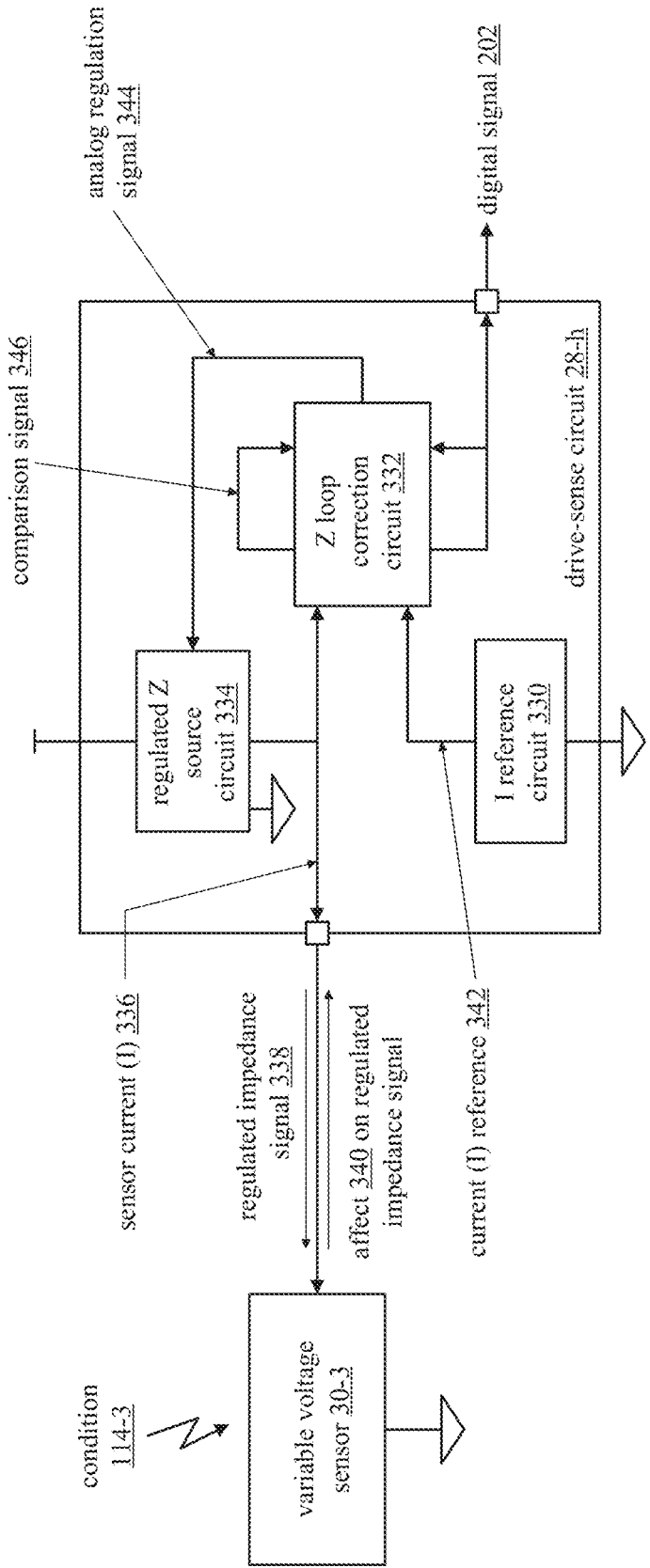
FIG. 34 is a schematic block diagram of another embodiment of a drive sense circuit in accordance with the present invention.

FIG. 34 is a schematic block diagram of another embodiment of a drive sense circuit 28-h coupled to a variable voltage sensor 30-3. The drive sense circuit 28-h includes a current (I) reference circuit 330, an impedance (Z) loop correction circuit 332, and a regulated impedance (Z) source circuit 334. In general, the drive sense circuit 28-h regulates the impedance of the sensor and keeps the sensor's current constant to sense a voltage (V) of the sensor 30-3 in relation to a sensor current 336 and a current (I) reference 342. Varying voltage of the sensor 30-3 is indicative of changes to the condition 114-3 being sensed (e.g., voltage levels, capacitance, inductance, thermal conditions, etc.).

When the drive sense circuit 28-h is enabled, the regulated impedance source circuit 334 is operable to generate a regulated impedance signal 338 based on an analog regulation signal 344. The regulated impedance source circuit 334 generates the regulated impedance signal 338 by varying frequency of a current produced by the regulated Z source circuit 334 such that the sensor current 306 substantially matches the voltage reference 342 produced by the I reference circuit 330.

The I reference circuit 330 (which may be implement in accordance with a previously discussed current reference circuit) generates the current reference 342 to include a DC component and/or at least one oscillating (AC) component. For example, the I reference circuit generates a DC component to have a desired DC level, a first oscillating component at a first frequency 1, and a second oscillating component at frequency 2. Alternatively, the frequency of the oscillating component sweeps a frequency range to find a frequency, or frequencies, that optimizes the impedance of the sensor.

The regulated impedance source circuit 334 provides the regulated impedance signal 338 to the sensor 30-3. When the sensor 30-3 is exposed to a condition 114-3, its voltage affects 288 the regulated impedance signal 338 based on V=I*Z. As such, the sensor current 336 corresponds to the impedance of the sensor as regulated by the regulation Z source circuit and the voltage provided by the regulated impedance source circuit 334 to the sensor 30-3. As the voltage of the sensor 30-3 changes due to changing conditions 114-3, the impedance is adjusted by the regulated impedance source circuit 334 so that the sensor current 336 remains substantially equal to the current reference 342, including the DC resistance and/or desired impedances at f1 and f2.

The impedance (Z) loop correction circuit 332 is operable to generate a comparison signal 346 based on a comparison of the sensor current 336 with the current reference 342. The effect of the voltage of the sensor on the regulated impedance signal 338 is detected by the Z loop correction circuit 332 and is captured by the comparison signal 336. The Z loop correction circuit 332 is further operable to convert the comparison signal 336 into the digital signal 202, which is a digital representation of the affect the voltage of the sensor has on the regulated impedance signal and corresponds to the sensed condition 114-3. The Z loop correction circuit is further operable to convert the digital signal 202 into the analog regulation signal 344, thereby creating a feedback loop to keep the sensor current 336 substantially equal to the current reference 342.

Figure 35:
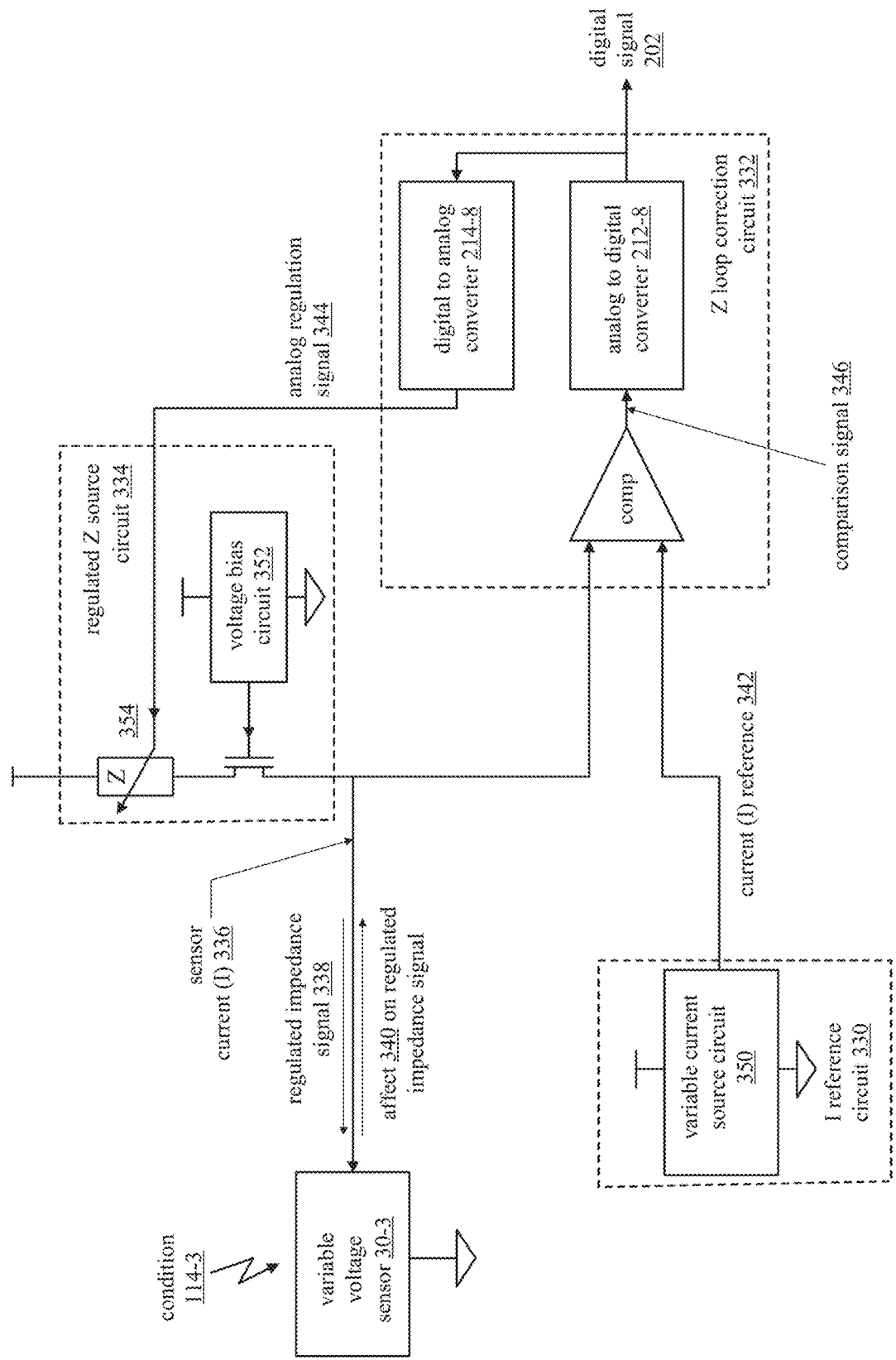
FIG. 35 is a schematic block diagram of another embodiment of a drive sense circuit in accordance with the present invention.

FIG. 35 is a schematic block diagram of another embodiment of a drive sense circuit 28-h1 coupled to a variable voltage sensor 30-3. The drive sense circuit 28-h1 includes a current (I) reference circuit 330, an impedance (Z) loop correction circuit 332, and a regulated impedance (Z) source circuit 334. The I reference circuit 330 includes a variable current source circuit 350. The Z loop correction circuit 332 includes a comparator, an analog to digital converter 212-8 and a digital to analog converter 214-8. The regulated Z source circuit 334 includes a variable impedance 354, a P-channel FET, and a voltage bias circuit 352. The analog to digital converter 212-8 and the digital to analog converter 214-8 are one or more of the types discussed with reference to FIG. 23.

The voltage bias circuit 352 generates a gate-source voltage for the P-channel FET and the impedance of the variable impedance is adjusted based on the analog regulation signal 344. In this embodiment, the combination of the variable impedance and P-channel transistor generate a regulated impedance signal 338 at a desired current level for the variable voltage sensor 30-3. The regulated impedance signal 338 is regulated to obtain a desired impedance of the sensor 30-3 such that, at the desired current level (e.g., a few micro amps to an amp or more), variation of the voltage of the sensor is within the linear range of the sensor.

The I reference circuit 330 (which may be implement in accordance with a previously discussed current reference circuit) generates the current reference 342 to include a DC component and/or at least one oscillating (AC) component. For example, the variable current source circuit 350 generates a DC component to have a desired DC level, a first oscillating component at a first frequency 1, and a second oscillating component at frequency 2.

The comparator (e.g., a transimpedance amplifier) compares the sensor current 336 with the current reference 342 to produce the comparison signal 346. The effect of the voltage of the sensor on the regulated impedance signal 338 is captured by the comparison signal 336. The analog to digital converter 212-8 converts the comparison signal 346 into the digital signal 202, which is a digital representation of the affect the voltage of the sensor has on the regulated impedance signal and corresponds to the sensed condition 114-3. The digital to analog converter converts the digital signal 202 into the analog regulation signal 344, thereby creating a feedback loop to keep the sensor current 336 substantially equal to the current reference 342.

Figure 36:
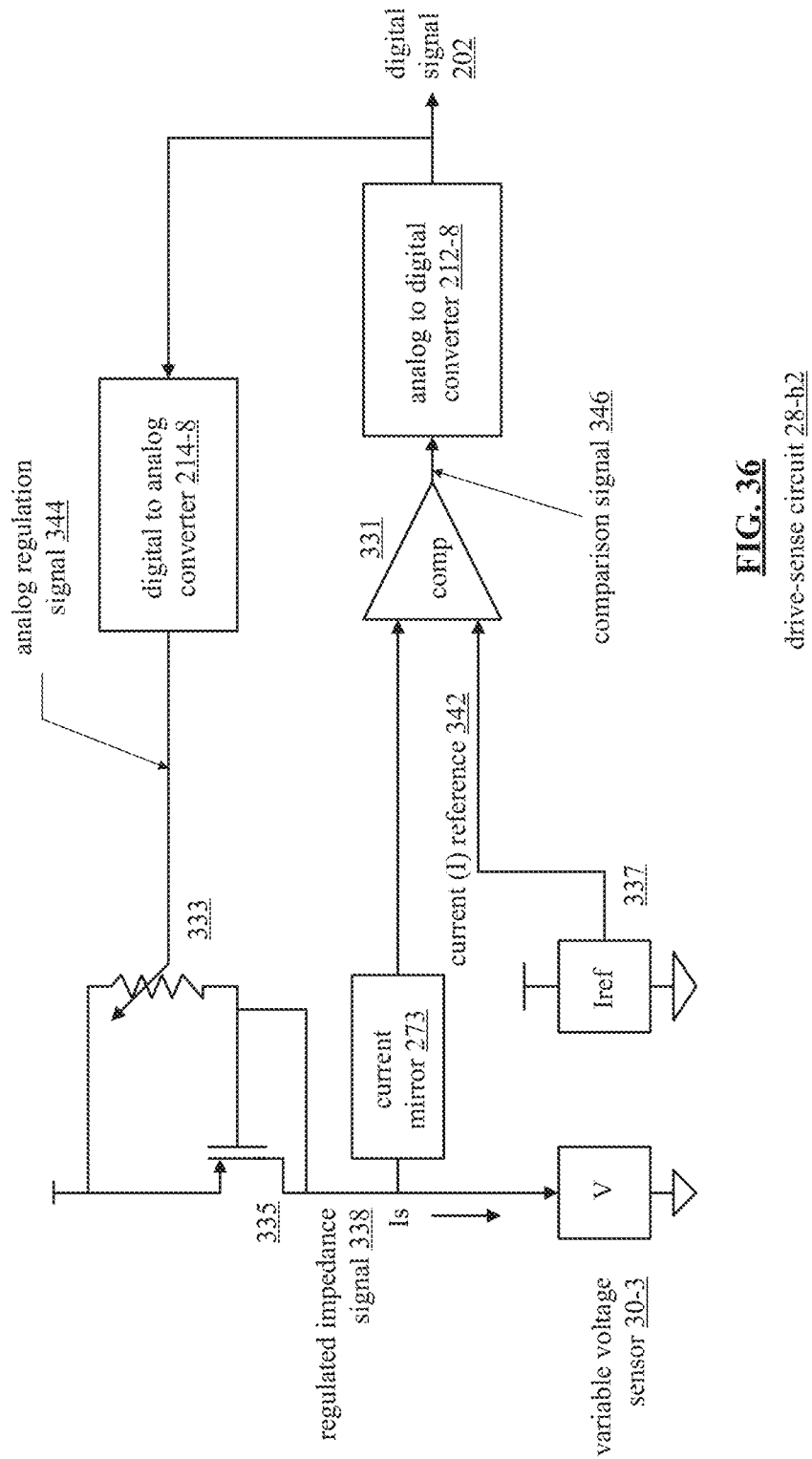
FIG. 36 is a schematic block diagram of another embodiment of a drive sense circuit in accordance with the present invention.

FIG. 36 is a schematic block diagram of another embodiment of a drive sense circuit 28-h2 is coupled to a variable voltage sensor 30-3. The drive sense circuit 28-h2 includes a P-channel transistor 335, a variable impedance 333 (e.g., resistor(s), capacitor(s), and/or transistor(s)), a comparator 331, the analog to digital converter 212-8, and the digital to analog converter 214-8.

In operation, the variable voltage sensor 30-3 is exposed to a condition that changes its voltage when its receiving the variable impedance signal at a current level (Is). The comparator 331 compares a mirrored current of the sensor 30-1 with the current reference 342 to produce the comparison signal 336. The analog to digital converter 212-8 converts the comparison signal 336 into the digital signal 202. The digital to analog converter 214-8 convers the digital signal 202 into the analog regulation signal 344. The variable impedance 333 is adjusted based on the analog regulation signal 334. Adjusting the variable impedance 333 adjusts the gate-source voltage of the P-channel transistor to produce the regulated impedance signal 338.

Figure 37:
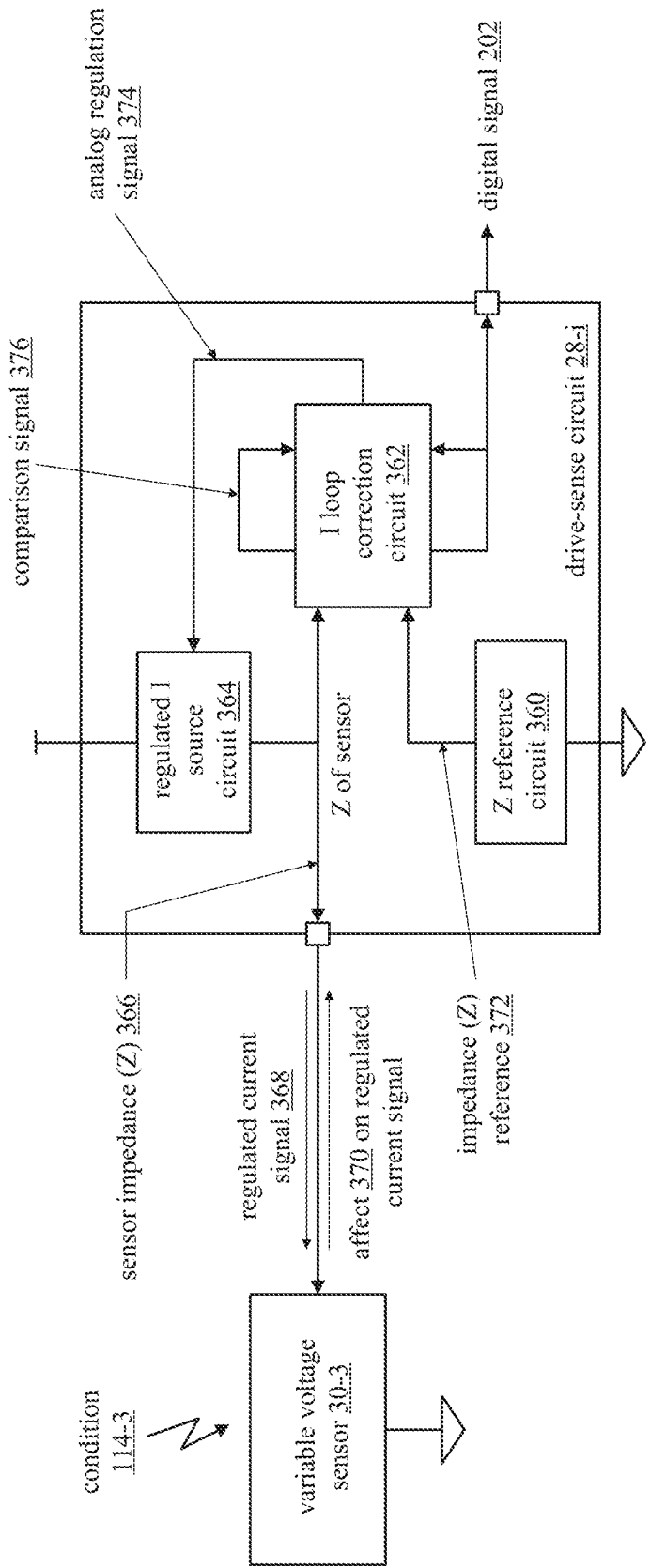
FIG. 37 is a schematic block diagram of another embodiment of a drive sense circuit in accordance with the present invention.

FIG. 37 is a schematic block diagram of another embodiment of a drive sense circuit 28-i coupled to a variable voltage sensor 30-3. The drive sense circuit 28-i includes an impedance (Z) reference circuit 360, a current (I) loop correction circuit 262, and a regulated current (I) source circuit 264. In general, the drive sense circuit 28-i regulates the current applied to the sensor and keeps the impedance of sensor constant to sense a voltage of the sensor 30-3 in relation to a sensor impedance 366 and an impedance reference 372.

When the drive sense circuit 28-i is enabled, the regulated current source circuit 364 is operable to generate a regulated current signal 368 based on an analog regulation signal 374. The regulated current source circuit 364 generates the regulated current signal 368 such that the sensor impedance (Z) 366 substantially matches the impedance reference 372 produced by the Z reference circuit 260.

The Z reference circuit 360 (which may be a capacitor, an inductor, a circuit equivalent of a capacitor, a circuit equivalent of an inductor, a tunable capacitor bank, etc.) generates the impedance reference 372 to include a DC component and/or at least one oscillating component. For example, the impedance reference 372 includes a DC component and/or at least one oscillating (AC) component. For example, the Z reference circuit 360 generates a DC component to have a desired resistance at DC, a first desired impedance at frequency 1, and a second desired impedance at frequency 2.

The regulated current source circuit 364 provides the regulated current signal 368 to the sensor 30-3. When the sensor 30-3 is exposed to a condition 114-3, its voltage affects 370 the regulated current signal 388 based on I=V/Z. As such, the sensor impedance 366 is created as a result of the current (I) provided by the regulated current source circuit 364 and the voltage of the sensor 30-3. As the voltage of the sensor 30-3 changes due to changing conditions 114-3, the current provided by the regulated current source circuit 234 changes so that the sensor impedance 366 remains substantially equal to the impedance reference 372, including the DC component and/or the oscillating component(s).

The current (I) loop correction circuit 362 is operable to generate a comparison signal 376 based on a comparison of the sensor impedance 366 with the impedance reference 372. The effect of the voltage of the sensor on the regulated current signal 368 is detected by the I loop correction circuit 362 and captured by the comparison signal 376. The I loop correction circuit 362 is further operable to convert the comparison signal 376 into a digital signal 202, which is a digital representation of the affect the voltage of the sensor has on the regulated current signal and corresponds to the sensed condition 114-3. The I loop correction circuit is further operable to convert the digital signal 202 into the analog regulation signal 374, thereby creating a feedback loop to keep the sensor impedance 366 substantially equal to the impedance reference 372.

Figure 38:
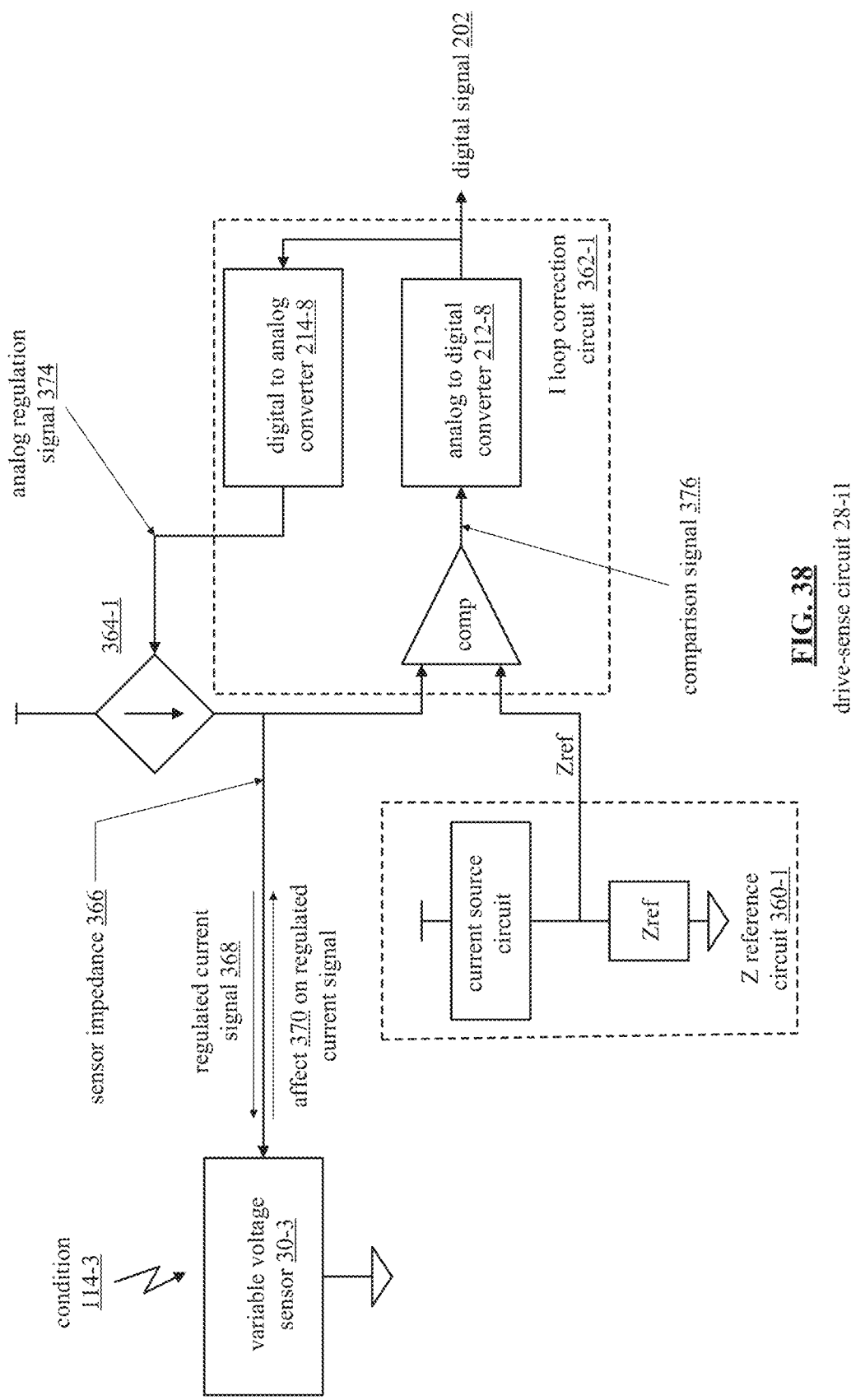
FIG. 38 is a schematic block diagram of another embodiment of a drive sense circuit in accordance with the present invention.

FIG. 38 is a schematic block diagram of another embodiment of a drive sense circuit 28-$i$1 coupled to a variable voltage sensor 30-3. The drive sense circuit 28-$i$1 includes an impedance (Z) reference circuit 360-1, a current (I) loop correction circuit 262-1, and a regulated current (I) source circuit 364-1, implemented as a dependent current source. The Z reference circuit 360-1 includes a current source circuit and an impedance circuit (e.g., resistor(s), capacitor(s), inductor(s), transistor(s), etc.) to produce the impedance reference, which may be expressed as a voltage (V of impedance reference=current of current source times impedance of the impedance circuit).

The dependent current source 364-1 generate a regulated current signal 368 based on the analog regulation signal 374. The voltage of the sensor 30 and current of the regulated current signal 368 provides the sensor impedance 366.

The comparator compares the sensor impedance 366 with the impedance reference, which may be done in voltage, to produce the comparison signal 376. The analog to digital converter 212-8 converts the comparison signal 376 into a digital signal 202, which is a digital representation of the affect the voltage of the sensor has on the regulated current signal and corresponds to the sensed condition 114-3. The digital to analog converter 214-8 converts the digital signal 202 into the analog regulation signal 374, thereby creating a feedback loop to keep the sensor impedance 366 substantially equal to the impedance reference 372.

Figure 39:
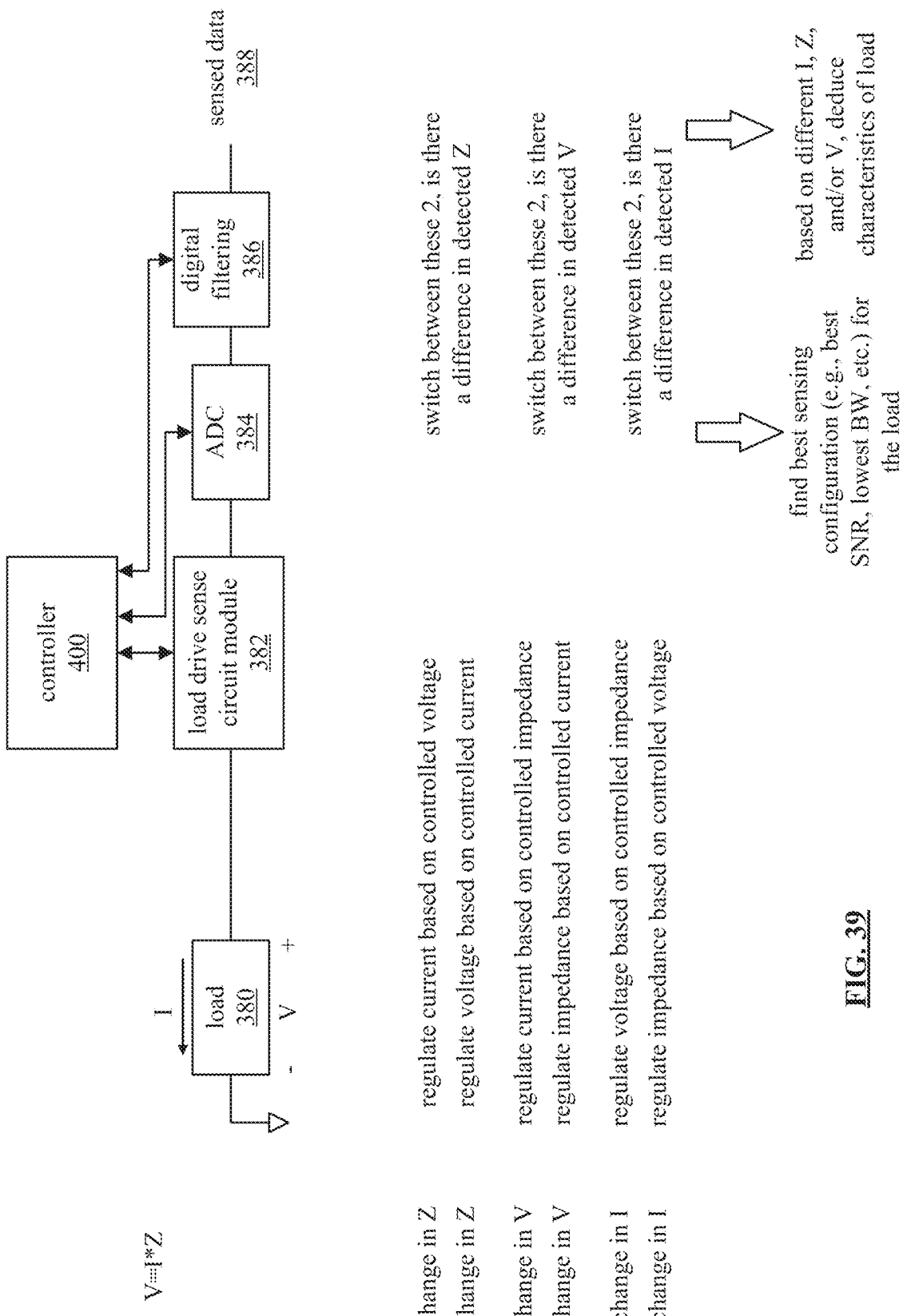
FIG. 39 is a schematic block diagram of a drive sense circuit module used to determine effects of different electrical characteristics on load characteristics in accordance with various embodiments of the present invention.

Referring next to FIG. 39 a schematic block diagram of a drive sense circuit module 382 will be discussed in accordance with various embodiments of the present invention. Drive sense circuit module 382 is used to determine effects that different electrical characteristics have on one or more load characteristics. For example, drive sense circuit module 382 can be used to empirically determine how changes to load current and load voltage affect load impedance. Similarly, drive sense circuit module 382 can be used to empirically determine how changes to load impedance affect changes to load current and voltage across the load. Drive sense circuit module 382 can also be used to empirically determine how changes in the voltage applied across the load affect the load current and the load impedance. Although the effects of each of these electrical characteristics can be estimated by calculation, empirical determination of these effects can aid in characterizing the actual in-circuit load characteristics, and in determining an optimal sensing configuration for circuits to be used with particular loads.

As used herein, the term "characteristics" or "electrical characteristics" are used to refer to electrical characteristics such as voltage, current, resistance, reactance, impedance, phase angle, frequency, wave-form type (e.g. direct current, alternating current, square wave, sinusoidal, sawtooth), or the like.

FIG. 39 shows drive sense circuit module 382 connected to load 380, analog-to-digital converter (ADC) 384, digital filtering circuit 386, and controller 400. Effects of a power signal on load 380 are sensed and, a comparison signal is generated. The analog comparison signal is digitized by ADC 384, and filtered by digital filtering circuit 386, to generate sensed data 388. Sensed data 388 indicates an effect of the power signal on load 380. More specifically, sensed data 388 indicates how a load characteristic is affected by variations in a regulated characteristic of a drive-sense signal.

Controller 400 controls drive sense circuit module 382 to iteratively apply different drive-sense signals, sometimes referred to herein as power signals, to load 380. The different drive sense signals are generated by regulating different characteristics of the power signal. In various embodiments, a power signal has a regulated characteristic (e.g. current, voltage, impedance) controlled by an interdependent controlled characteristic (e.g. current, voltage, impedance). Drive sense circuit module 382 regulates one of the characteristics of the power signal based on another of the characteristics (e.g. voltage regulated based on current), and the power signal is applied to load 380. The load has load characteristics (e.g. load current, load voltage, load impedance) that determine how the load interacts with the power signal. Those load characteristics may change depending on the value of the regulated characteristic of the power signal. For example, the impedance of the load may change as the voltage of the power signal varies, or the voltage across the load may vary as an impedance associated with the power signal varies.

Controller 400 may apply one or more different combinations of regulated and controlled characteristics in an automated sequence in response to user input indicating that a load is to be characterized. In some implementations, user input can cause controller 400 to apply individual load-characterization processes in which, for example, the impedance of the load is characterized with respect to single regulated electrical characteristic of the power signal. In other implementations, user input can direct controller 400 to perform full characterization of a single load characteristic. For example, the effects of a regulated current on impedance and a regulated voltage on impedance can be determined at multiple different frequencies to generate a full characterization of load impedance.

In some embodiments a processing system to which the controller is in communication can initiate, terminate, repeat, or otherwise alter one or more iterations of load characterization steps. Additionally, as discussed subsequently in greater detail, sensed data can be used to generate various configuration parameters. These configuration parameters can be used by controller 400 to configure drive sense circuit module 382, ADC 384, and digital filtering circuitry 386 for use with a particular load. This configuration can include adjusting a frequency or bandwidth associated with digital filtering circuitry 386, selecting regulated and controlled electrical characteristics to cause the load to operate in a linear response region, selecting a configuration that provides for an optimal signal to noise ratio, a lowest bandwidth, or the like.

Examples of drive sense circuit module 382 configured to regulate a current based on a voltage to determine changes in load impedance caused by variations in load current are illustrated and discussed with reference to FIGS. 25 and 26. Examples of drive sense circuit module 382 configured to regulate a voltage based on a current to determine changes in load impedance caused by variations in load voltage are illustrated and discussed with reference to FIGS. 27 and 28. Examples of drive sense circuit module 382 configured to regulate a voltage based on an impedance to determine changes in load current caused by variations in load voltage are illustrated and discussed with reference to FIGS. 29 and 30. Examples of drive sense circuit module 382 configured to regulate an impedance based on a voltage to determine changes in load current caused by variations in impedance are illustrated and discussed with reference to FIGS. 31, 32, and 33. Examples of drive sense circuit module 382 configured to regulate an impedance based on a current to determine changes in load voltage caused by variations in impedance are illustrated and discussed with reference to FIGS. 34, 35, and 36. Examples of drive sense circuit module 382 configured to regulate an current based on an impedance to determine changes in load voltage caused by variations in load current are illustrated and discussed with reference to FIGS. 37 and 38.

Figure 40:
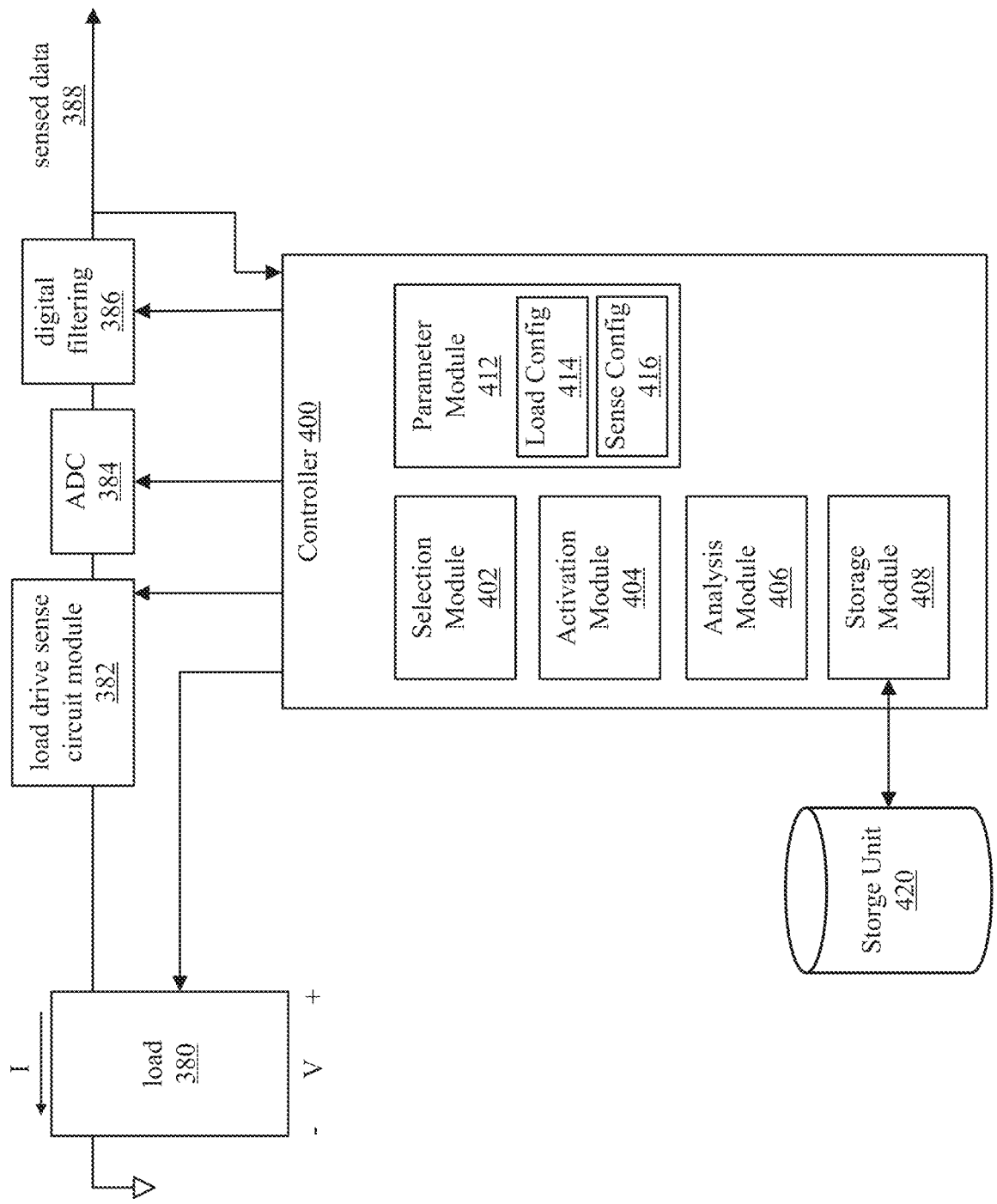
FIG. 40 is a schematic block diagram of a controller that controls a drive sense circuit module to determine effects of different electrical characteristics on load characteristics in accordance with various embodiments of the present invention.

Referring next to FIG. 40 a controller 400 that controls a drive sense circuit module to determine effects of different electrical characteristics on load characteristics will be discussed in accordance with various embodiments of the present invention. In at least one embodiment, controller 400 is implemented using a processor programmed to instruct load drive sense circuit module 382 to iteratively generate different regulated drive-signals, and apply them to load 380. different regulated drive signals employ different combinations of regulated electrical characteristics and controlled electrical characteristics, which allows load drive sense circuit module 382 to sense effects of different electrical different electrical load characteristics of load 380. In response to sensing each of the different effects that result from using different combinations of regulated electrical characteristics and controlled electrical characteristics in the different iterations, the drive-sense circuit module generates different output signals during different iterations. Outputs of the load drive sense circuit module 38 can be converted to digital data by analog to digital converter (ADC) 384, filtered by digital filtering module 386, to create sensed data 388.

In various embodiments, controller 400 also controls one or more functions of ADC 384, for example by instructing the ADC 384 to use a particular number of bits per sample and the sampling frequency employed by ADC 384. Various implementations of controller 400 also control the type of filtering, e.g. bandpass, high pass, low pass, used by digital filtering module 386, and adjust the filter coefficients used by digital filtering module 386. Additionally, controller 400 can adjust one or more load characteristics by, for example, selectively switching resistive, capacitive or inductive components into or out of the load circuit.

In the illustrated embodiment, controller 400 includes a selection module 402, an activation module 404, an analysis module 406, a storage module 408 configured to store data in storage unit 420; and parameter module 412, which selects response parameters, e.g. load configuration parameters 414, sense configuration parameters 416, e.g. filter coefficients and filter parameters stored in storage unit 420, and generates control signals to send to load 380, load drive sense circuit module 382, ADC 384, and digital filtering module 386.

During load characterization or sense characterization modes of operation, controller 400 controls load drive sense circuit module 382 to iteratively apply to load 380 different drive sense signals with different regulated and controlled characteristics to sense particular load characteristics. Each iteration can apply different combinations of regulated and controlled characteristics. For each iteration and/or combination of the regulated and controlled characteristics, controller 400 can set parameters associated with ADC 384 and digital filtering module 386 so that digitization and filtering operations are tuned to the particular load characteristic being sensed. Setting the parameters associated with ADC 384 and digital filtering module 386 can include using default parameters, using parameters determined during a previous characterization of the load 380 or another load of the same type as load 380, using parameters determined during a previous a characterization of the sensing circuitry, or similarly configured sensing circuitry.

Consider for example, sensing circuitry implemented using a particular type of ADC 384 and a particular type of digital filtering module 386 that have been previously characterized in a similar sensing configuration. Filter coefficients and other parameters empirically determined in-situ for ADC 384 and digital filtering module 386 can be used to adjust the sensing circuitry to generate more accurate sensed data, sensed data having a more a preferred signal to noise ratio, sensed data having an optimal bandwidth, or the like. Similarly, a sensing configuration can be set based on previous empirically determined load characteristics, so that the digitization and filtering can be optimized for particular load characteristics.

Selection module 402 selects, for each iteration, which load characteristic is to be sensed for evaluation, and which regulated and controlled characteristics are to be used to generate the sensed data indicating the sensed load characteristic. For example, selection module 402 can determine that during a first iteration, a regulated current controlled by a controlled voltage will be used to sense changes in a load impedance caused by changes in the regulated current. The selection module can likewise determine that during a second iteration a regulated voltage, controlled by a controlled current, will be used to sense changes in a load impedance caused by changes in the regulated voltage.

In various embodiments, selection module 402 cooperates with activation module 404 to select and activate particular sub-circuits or sub-modules of load drive sense circuit module 382 to produce the different combinations of regulated and controlled characteristics. The selection and activation tasks of controller 400 will be discussed in greater detail with reference to FIG. 41.

Analysis module 406 receives sensed data 388 and calculates changes in the load characteristics based on the sensed data. In at least one embodiment, the changes in the load characteristic are related to changes in a regulated characteristic of a power signal applied to the load. Changes in the regulated characteristic are indicated by a comparison signal generated within a loop correction circuit that is part of the load drive sense circuit module. But the comparison signal is not a measured indication of the changes in the load characteristic. Instead, changes in the load characteristic are computed based on a comparison of a sensed value of a controlled characteristic of the power signal and a reference value of the regulated characteristic of the power signal, which represents a variation in the regulated signal, and a reference value of the controlled characteristic. For example, Ohm's law states: $V=I*Z$. Assume that load impedance, Z, is the load characteristic being evaluated. Further assume that the regulated characteristic of the power, or drive sense signal, is current, I. Voltage, V, is the controlled characteristic. The comparison signal generated within the loop correction circuit is based on a controlled voltage V. The current, I, is regulated based on the voltage, V, so that V is maintained at a reference value. Changes in the regulated current, I, can be determined based on a voltage difference at a comparison circuit, which generates a comparison signal based on differences in V. This means that the sensed data 388 represents an amount by which the regulated current, I, changes. Thus, the change in load impedance, Z, can be calculated based on the sensed data 388 (representing the change in current) and the reference voltage, V. Similar calculations can be made when determining changes in load voltage and load impedance.

Analysis module 406 can also be used, in conjunction with parameter module 412, to calculate load configuration parameters 414 and sense configuration parameters 416. Load configuration parameters include base level impedance, voltage, and current values, information used to adjust a load to maintain the base level values when power or drive-sense signals are applied. For example, if a load is to be used part of time with a drive signal having a first frequency, and a second part of the time using a drive signal having a second frequency, but the load impedance needs to be constant at both frequencies, load configuration parameters can specify load components to be inserted or removed from the load to maintain a constant impedance.

In some embodiments, load configuration parameters are not used only to adjust the load configuration, but also as a basis for generating sense configuration parameters. For example, if load configuration parameters indicate that the load current increases when a lower frequency drive signal is applied, parameter module 412 can use those load configuration parameters to generate or select sense configuration parameters to compensate for the frequency-based change in current. For example, parameter module 412 can send filter parameters, such as filter coefficients, to digital filtering module 386, causing a shift in a central frequency of a bandpass filter. Similarly, parameter module 412 can provide load configuration parameters 414 and sense configuration parameters 416 to analysis module 406, which can adjust its calculations based on those parameters.

In various embodiments, sensed data 388 is provided to controller 400, which uses analysis module 406 to calculate load configuration parameters 414 and sense configuration parameters 416, which are stored in storage unit 420 by storage module 408. In at least one embodiment, configuration parameters determined during one iteration are linked to configuration parameters determined during other iterations, so that the load and/or the sense circuitry can be fully characterized over multiple different configurations.

Figure 41:
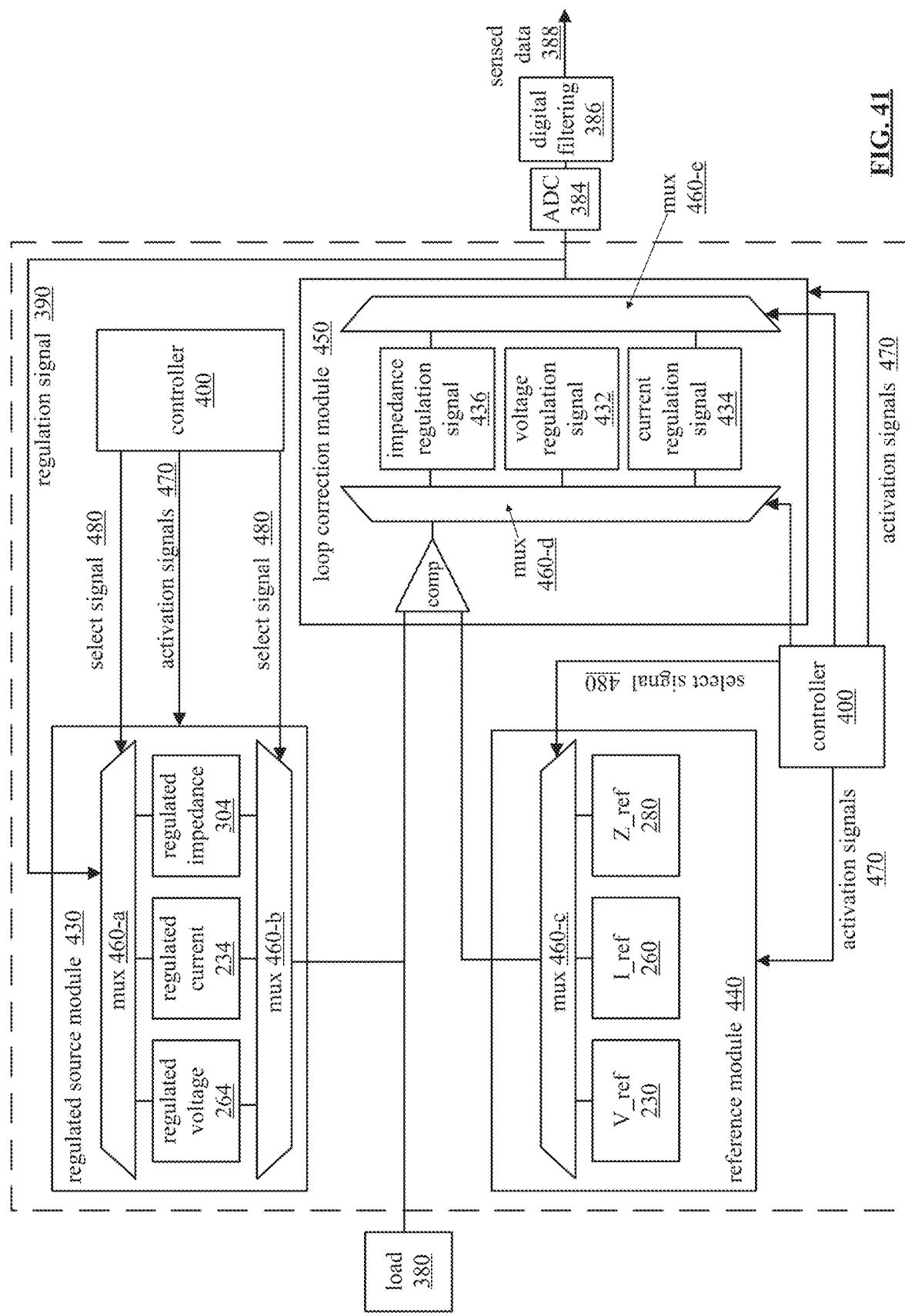
FIG. 41 is a schematic block diagram of a drive sense circuit module including selectable elements controlled by a controller to determine effects of different electrical characteristics on load characteristics in accordance with various embodiments of the present invention.

Referring to FIG. 41 is a schematic block diagram of a drive sense circuit module 382 including selectable elements, and controlled by a controller to determine effects of different electrical characteristics on load characteristics, is discussed in accordance with various embodiments of the present invention. Drive sense circuit module 382 includes regulated source module 430, reference module 440, loop correction module 450, and controller 400.

Controller 400 is illustrated as two-separate modules, but in various embodiments a single controller 400 is used. Controller 400 generates selection signals 480 using a selection module 402 (FIG. 40), and activation signals 470 using activation module 404 (FIG. 40). Selection signals are used to control multiplexers 460 a-e to insert the sub-circuits and sub-modules used by load drive sense circuit module 382 during different iterations of load sensing. For example, regulated source module 430 includes a regulated voltage module 264, a regulated current module 234, and a regulated impedance module 304. During iterations in which the regulated characteristic of the power signal, or drive sense signal, is used, controller 400 sends select signals 480 to multiplexers 460-a and 460-b so that the regulated voltage source is inserted into the sensing circuitry. Regulated current source 234 and regulated impedance source 304 can similarly be inserted in the sensing circuitry for use in iterations employing regulated current or regulated impedance, respectively.

The selection and activation signals generated by controller 400 can also be supplied to reference module 440 to selectively insert voltage reference circuit 230, current reference circuit 260 or impedance reference circuit 280 into the sense circuit to provide a reference value for controlled characteristics during appropriate iterations. Similarly, selection and activation signals can be used to select whether the regulation signal 390 provided to regulated source module 430 by loop correction module 450 is an impedance regulation signal 436, a voltage regulation signal 432, or a current regulation signal 434, based on a type of regulated source being used in the current iteration.

Note that not all embodiments are required to include all illustrated types of regulated source modules, reference modules, and feedback regulation signals. For example, some embodiments may not include a regulated impedance source or circuitry for generating the impedance regulation signal 436. Other embodiments may not include a current reference circuit 260, or a regulated voltage source, and so on.

Figure 42:
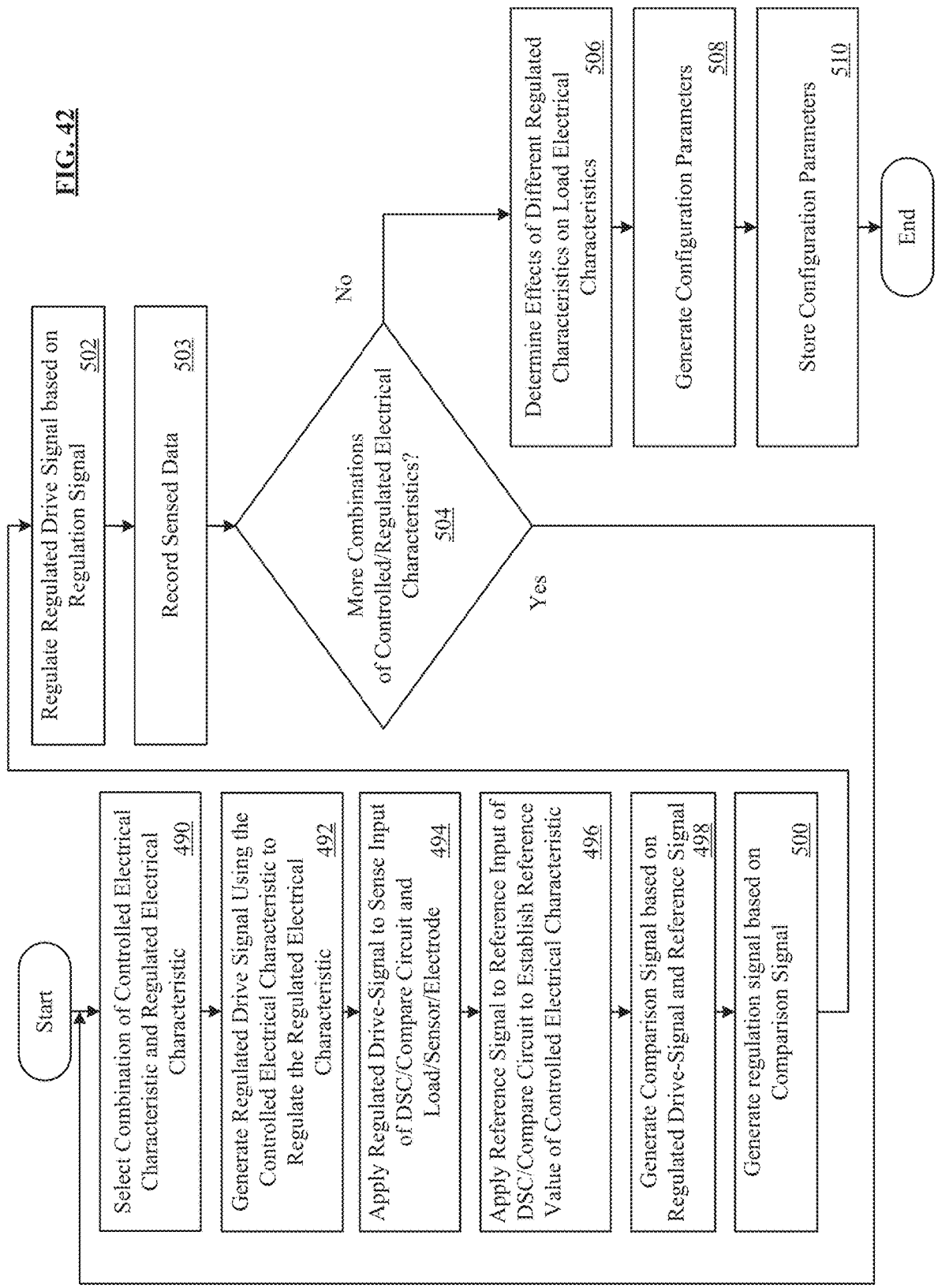
FIG. 42 is a flow chart illustrating a method of determining effects of different electrical characteristics of a power signal on load characteristics in accordance with various embodiments of the present invention.

FIG. 42 a method of determining effects of different electrical characteristics of a power signal on load characteristics will be discussed in accordance with various embodiments of the present invention. As illustrated by block 490, a combination of controlled and regulated electrical characteristics of a power signal, also referred to herein as a drive sense signal, or a drive signal, are selected for application to a load. The combination of controlled and regulated characteristics can be chosen based on a preset testing order, based on the type of load being characterized, based on available sense modules and circuitry, e.g. regulated source circuits, reference circuits, feedback or other circuitry for generating particular reference signals, or the like.

As illustrated by block 492, a regulated drive signal is generated by using the selected controlled electrical characteristic of the drive signal to regulate the regulated electrical characteristic of the drive signal. As shown in block 494, the regulated drive signal is applied to a sense input of a comparison circuit, such as a drive sense circuit (DSC), and at the same time applied to the load being sensed. The load includes, but is not limited to, a sensor, an electrode, and can be an active load or a passive load. As illustrated in block 496, a reference signal is applied to a reference input of the comparison circuit to establish a reference value of the electrical characteristic selected to be the controlled electrical characteristic.

As illustrated by block 498 the DSC, or a comparison circuit included in the DSC, generates a comparison signal by comparing the value of the controlled characteristic of the regulated drive signal present on the sense input to the reference value of the controlled characteristic present at the reference input. A regulation signal is generated based on the comparison signal, as illustrated by block 500. As shown by block 502, the regulated drive signal is regulated based on the regulation signal. Specifically, the regulated characteristic of the regulated drive signal is regulated based on the regulation signal. The sensed data generated from the combination of regulated/controlled characteristics used during the current iteration is recorded, as shown by block 503

At block 504, a check is made to determine if more combinations of controlled/regulated characteristics remain. In some case, e.g., where full characterization of the load or sense circuitry is not being performed, fewer than all possible combinations of controlled/regulated electrical characteristics are used.

For example, if changes in load impedance are to be evaluated, voltage can be regulated based on controlled current, and current can be regulated based on controlled voltage, so that two combinations of controlled/regulated characteristics are used. If the load is to be characterized with respect to both changes in impedance and changes in current, voltage can be regulated based on controlled current, current can be regulated based on controlled voltage, voltage can be regulated based on impedance, and impedance can be regulated based on voltage, resulting in 4 different combinations of controlled/regulated characteristics. If additional iterations are to be performed, If it is determined at block 504 that additional iterations, using different combinations of controlled/regulated electrical characteristics, are to be performed, the method returns to block 490, where the next combination of controlled/regulated characteristics are selected. If no more iterations are to be performed, because there are no additional combinations of controlled/regulated characteristics to be tested, the method proceeds to block 506, the effect of the different regulated characteristics on the load's electrical characteristics are determined based on the sensed data recorded at block 503.

As shown by block 508, configuration parameters are generated based on the effects determined at block 506. For example, if the load exhibits a phase shift dependent on the frequency of a regulated voltage signal, one or more load configuration parameters may be generated that indicate frequency dependent phase shifts of the load at various frequencies. Similarly, one or more sense configuration parameters can be generated to compensate for the observed phase shift at the filtering stage, at the computation stage, or both. For example, a sense configuration parameter can indicate that when a regulated voltage signal having a frequency of between X and Y is used, the filter coefficients should be adjusted to account for the phase shift. In some cases, the load configuration parameters can be used to change the load configuration to compensate for the phase shift, by for example adding or removing capacitive elements to or from the load. As illustrated by block 510, the configuration parameters can be stored for use with other loads connected to the same sense circuit, for use with other sense circuits coupled to the same load, or for use with the current sense circuit/load combination where different drive signals are used.

In some embodiments discussed herein, the load characteristics can be changed by coupling multiple loads together. If the particular combination of loads has not been characterized as a combination, the load configuration parameters can be used to determine combined load characteristics. Similarly, in some embodiments, different drive-signals are applied to the same load at different times, and to perform different operations. In those cases, the load and sense configuration parameters can be used to configure the load and or the sense circuitry for optimal operation with the applied drive signal.

Figure 43:
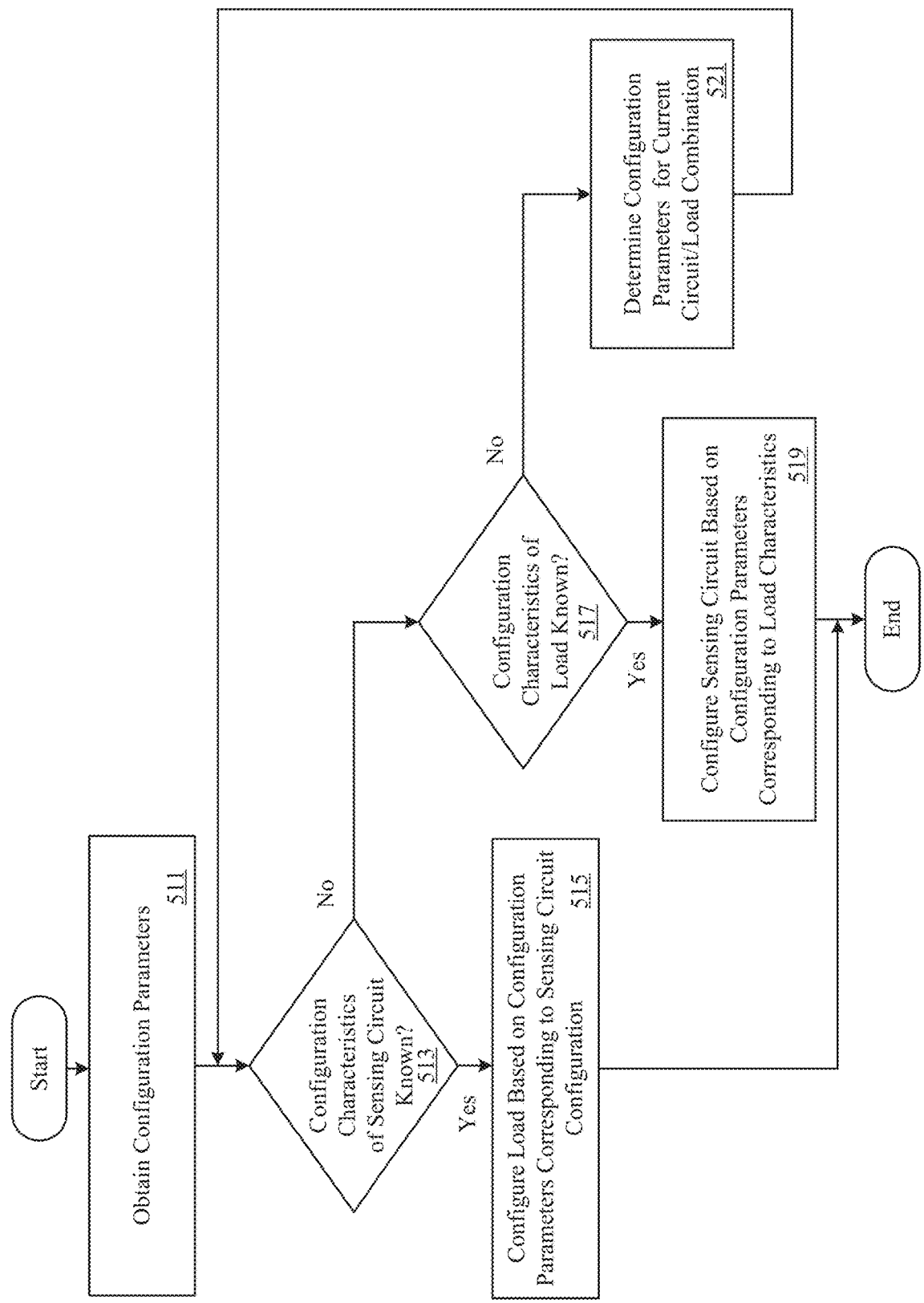
FIG. 43 is a flow chart illustrating a method of configuring a drive sense circuit module, and/or a load coupled to the drive sense circuit module, in accordance with various embodiments of the present invention.

Referring next to FIG. 43, a method of configuring a drive sense circuit module, and/or a load coupled to the drive sense circuit module, is discussed in accordance with various embodiments of the present invention. At block 511, configuration parameters are obtained. The configuration parameters can include load configuration parameters and sense configuration parameters, and can be obtained upon power-up of a load drive sense circuit module, upon connection of the load drive sense circuit module to a load, upon manual or automated initiation of a characterization process, or from stored characterization parameters determined during a previous characterization process.

As illustrated by block 513, a check is made to determine whether the configuration characteristics of the sensing circuit are known. Determining whether the configuration characteristics of the sensing circuit are known can include, but is not limited to, attempting to retrieve sense configuration parameters from storage, and if there are no stored sense configuration parameters, determining that the configuration characteristics of the sensing circuit are unknown; using a lookup table; querying an external processor or controller; evaluating identifiers associated with configuration parameters; querying a filter module, a drive sense circuit module, and/or a load.

As illustrated by block 515, if the configuration characteristics of the sensing circuit are known, the load can be tuned to match the sensing circuit characteristics. For example, if the sense configuration parameters indicate that the sensing circuit is configured to use a regulated current source based on a controlled voltage having a particular reference value, the load characteristics can be adjusted to operate optimally with the reference voltage being used by the sensing circuit. In a specific example, if the load configuration parameters indicate that the load impedance is to be increased when using the reference voltage employed by the sensing circuit, impedance increasing components (e.g. resistors, inductors, capacitors, diodes, or the like) can be multiplexed into the load to provide the increased impedance.

As illustrated by block 517, if the configuration characteristics of the sensing circuit are not known, a check is made to determine if the configuration characteristics of the load are known. Determining whether the configuration characteristics of the load are known can include, but is not limited to, attempting to retrieve load configuration parameters from storage, and if there are no stored load configuration parameters, determining that the configuration characteristics are unknown; using a lookup table; querying an external processor or controller; evaluating identifiers associated with configuration parameters; querying a filter module, a drive sense circuit module, and/or a load.

As illustrated by block 519, if the sensing circuit are not known, but the configuration characteristics of the load are known, the sensing circuit can be tuned to match the load's configuration characteristics. For example, if the load configuration parameters indicates that it is most sensitive to changes in capacitance when operating within a given range of current values, the sense circuit can be configured to supply the load a regulated drive signal having a current within that range of current values.

As illustrated by block 521, if neither the load configuration characteristics nor the sense circuit configuration are known, a characterization process, such as the one discussed with reference to FIG. 42, can be performed. In various embodiments, previously determined configuration parameters are used to configure the sense circuit and load based on an application in which the sense circuit and load are employed.

Figure 44:
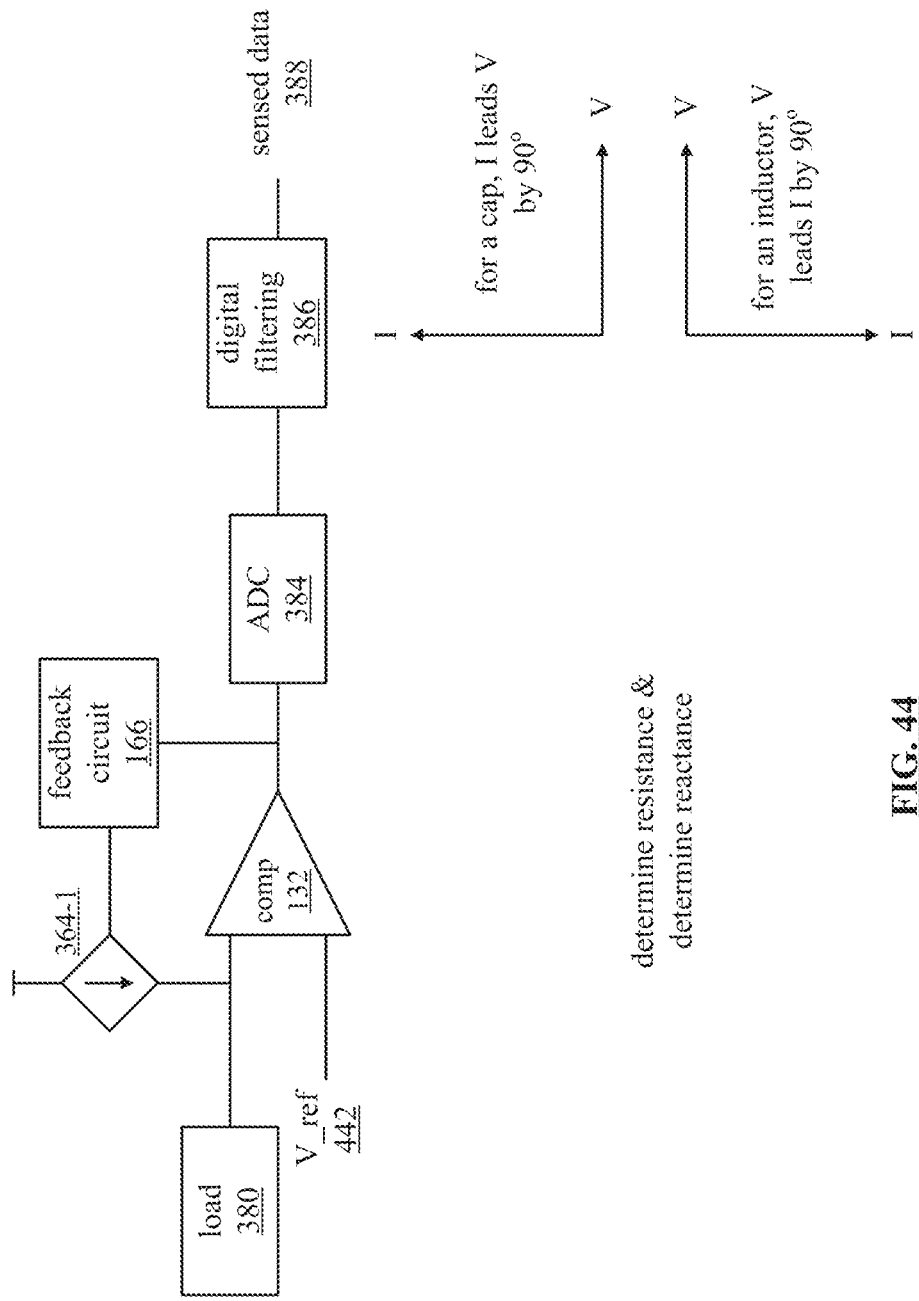
FIG. 44 is a schematic block diagram illustrating a drive sense circuit module used to determine frequency dependent impedance characteristics of a load in accordance with various embodiments of the present invention.

Referring next to FIG. 44, a drive sense circuit module used to determine frequency dependent impedance characteristics of a load is discussed in accordance with various embodiments of the present invention. In various embodiments, a reference frequency is swept across a range of frequencies to determine a phase angle between load voltage and current a different frequencies. The phase angles can then be used to determine the resistance and reactance of a load, so that a full complex impedance of the load can be determined. The absolute data determined at each frequency of the range of frequencies can be used for impedance detection.

The drive sense circuit module illustrated in FIG. 44 include a comparator 132 having a reference input coupled to a voltage reference 442, a sense input coupled to load 380 and to a regulated current source 364-1. Comparator 132 also includes an output coupled to feedback circuit 166 and to analog to digital converter (ADC) 384, which is in turn coupled to digital filtering module 386. Feedback circuit 166 includes an output coupled to provide a regulation signal to regulated current source 364-1. In operation, the output of comparator 132 is a comparison signal generated by comparing the value of a sensed voltage at the sense input of comparator 132 to a reference voltage value present on the reference input of comparator 132. The comparison signal is fed back to feedback circuit 166, which generates a regulation signal used to regulate the regulated current source 364-1, which applies a voltage-controlled regulated drive signal to both load 380 and the sense input of comparator 132. Any instantaneous changes in the impedance of load 380 tend to change the sensed voltage on the sense input of comparator 132. The comparison signal generated by the instantaneous change in voltage is fed back as a regulation signal to regulated current source, which increases or decreases the amount of current to maintain the sensed value of the voltage equal to the reference value of the voltage present at the reference input of comparator 132. The comparison signal is also digitized by ADC 384, and filtered by digital filtering module 386 to generate sensed data 388.

As the reference voltage varies at a given frequency, load 380 presents a corresponding impedance to the power signal produced by regulated current source 364-1. If capacitance dominates the load at a given frequency, the change in the current through the load will lead the change in voltage. In a purely capacitive load, the current will lead the voltage by 90 degrees. In a purely inductive load, the voltage will lead the current by 90 degrees. The sensed data indicates the effect the load on the regulated characteristic of the power, or drive signal. Thus, the output of comparator 132, and hence the sensed data, will indicate a change in the amount of current flowing through the load. The phase angle, i.e. the amount by which the current leads the voltage, or the voltage leads the current, can be determined by comparing the value of the sensed data with the value of the reference frequency at the time when the sensed data was generated. In some embodiments processing delays introduced by ADC 384 and digital filtering module 386 are known, and can be used to adjust a timing associated with the sensed data. In addition, feedback and regulation control delays introduced by comparator 132, feedback circuit 166, and regulated current source 364-1 are known, and can also be factored in to the phase angle computation. The computations can be performed by a processor in near real time, or the sensed data and digital representations of the reference voltage can be stored for later processing.

By sweeping the frequency of the reference voltage 442 over a range of frequencies, the load can be more fully characterized by using the impedance values at multiple frequencies to characterize the load more fully. For example, a load may have both capacitive and inductive elements, and may therefore have a resonant frequency, have a response dominated by capacitance at one frequency and dominated by impedance at another frequency, or the like. Embodiments employing a reference current and a regulated voltage are also contemplated.

Figure 45:
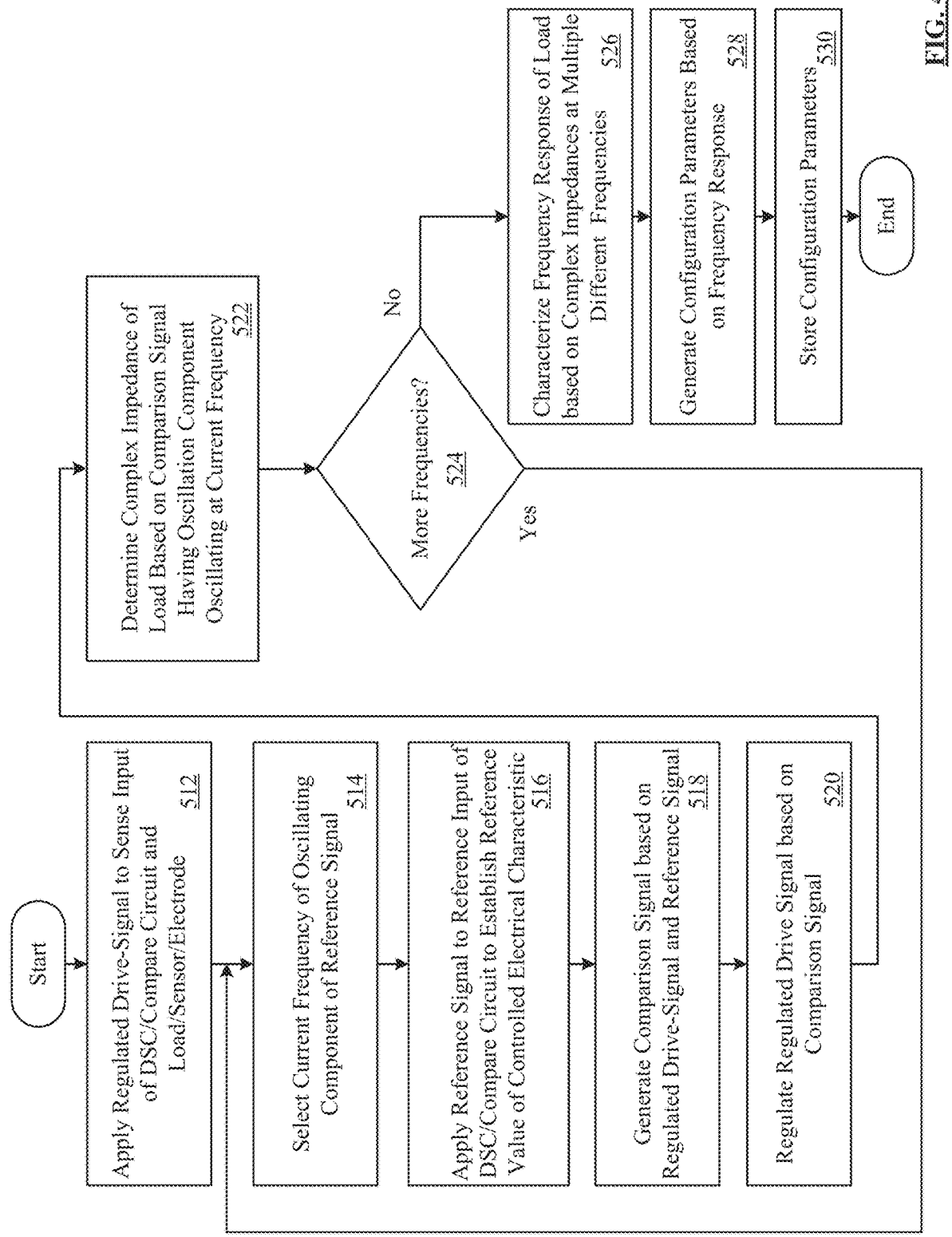
FIG. 45 is a flow chart illustrating a method of determining frequency dependent impedance responses of a load, in accordance with various embodiments of the present invention.

Referring next to FIG. 45 a method of determining frequency dependent impedance responses of a load is discussed in accordance with various embodiments of the present invention. As illustrated by block 512, a regulated drive-signal is applied to a node coupling a load to a sense-input of a drive sense circuit. The regulated drive-signal has a voltage characteristic and a current characteristic. Whichever of the voltage characteristic or the current characteristic that is regulated is referred to as the regulated characteristic. The other of the voltage characteristic or the current characteristic not used as the regulated characteristic is referred to as the controlled characteristic. The load can be a sensor, an electrode, an analog circuit, a digital circuit, or another load associated with a complex impedance.

A starting frequency of an oscillating component of a reference signal to be coupled to a reference input of the drive sense circuit (DSC) is selected, as shown in block 514. The starting frequency can be selected base on the type of load, an application in which the load is employed, based on a configuration of the DSC, or the like.

As illustrated by block 516, the oscillating reference signal is applied to a reference input of the drive sense circuit. In various embodiments, the oscillating component of the reference signal can be either an oscillating voltage or an oscillating current. The reference signal establishes a reference value of controlled characteristic—either voltage or current.

As illustrated by block 518, a comparison signal is generated at the output of the drive-sense circuit. The comparison signal is generated based on a comparison of a value of the controlled electrical characteristic of the regulated drive-signal at the sense input of the comparator with the reference value of the controlled electrical characteristic.

As shown by block 520, the regulated drive signal is regulated based on the comparison signal.

As illustrated by block 522, the complex impedance of the load is determined based on a comparison signal having an oscillating component oscillating at the same frequency as the reference signal. A check is made at block 524 to determine if additional frequencies are to be applied to the load. In various embodiments, a continuous sweep is made across a range of frequencies. In other embodiments, multiple discrete frequencies are used. In any case, when there are more frequencies to be applied, for example when the sweep has not been completed, the method returns to block 514 for additional iterations. During these iterations, different reference signals having different oscillating frequencies are applied to the reference input of the drive sense circuit, and sensed data used to determine the complex impedance of the load. Determining complex impedance can include calculating resistance values at different frequencies As illustrated by block 526, the frequency response of the load is characterized based on the complex impedances determined at the different applied frequencies. As shown in block 528, configuration parameters, e.g. both load configuration and sense configuration parameters can be generated, and stored in accordance with block 530.

Figure 46:
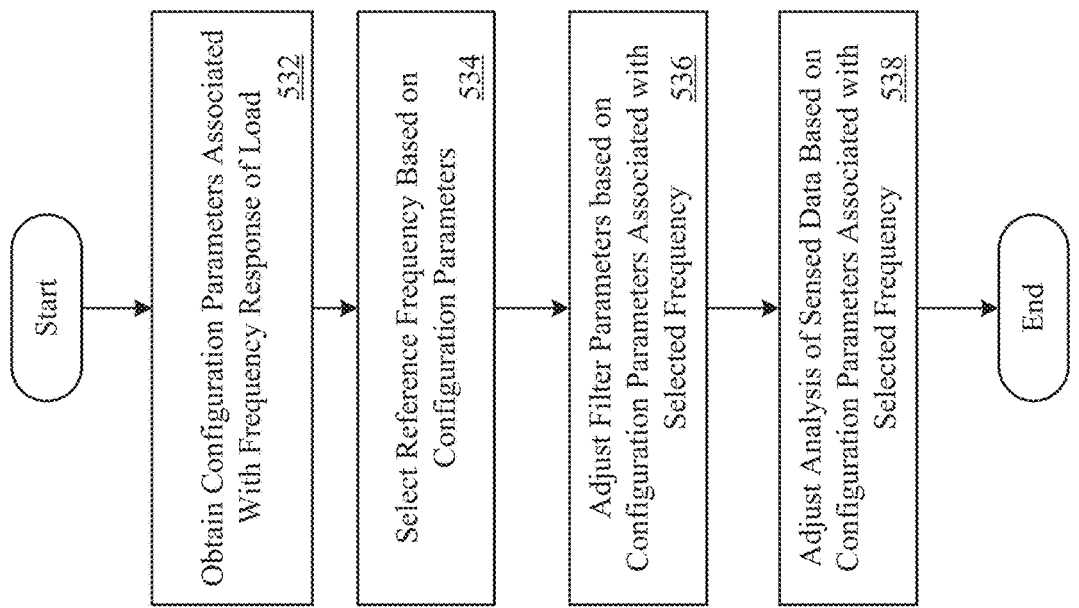
FIG. 46 is a flow chart illustrating a method of configuring a drive sense circuit module and associated processing circuitry based on frequency dependent impedance characteristics of a load, in accordance with various embodiments of the present invention.

Referring next to FIG. 46, a method of configuring a drive sense circuit module and associated processing circuitry based on frequency dependent impedance characteristics of a load is discussed in accordance with various embodiments of the present invention. As illustrated by block 532, configuration parameters associated with the frequency response of a load can be obtained from storage.

As illustrated by block 534, a reference frequency suitable for use with a particular load/sense circuit configuration is selected based on the configuration parameters. As illustrated by block 536, filter parameters, such as filter coefficients, filter bandwidths, center frequencies of bandpass filters, sample rates, or the like, can be selected based on configuration parameters associated with the selected reference frequency. As shown in block 538, configuration parameters associated with the load, the sense circuitry, and the selected frequency can be provided to a controller or other processing device so that analysis of sensed data can be adjusted to compensate for circuit or load non-linearities or other characteristics that may lead to less than optimal calculated results.

Figure 47:
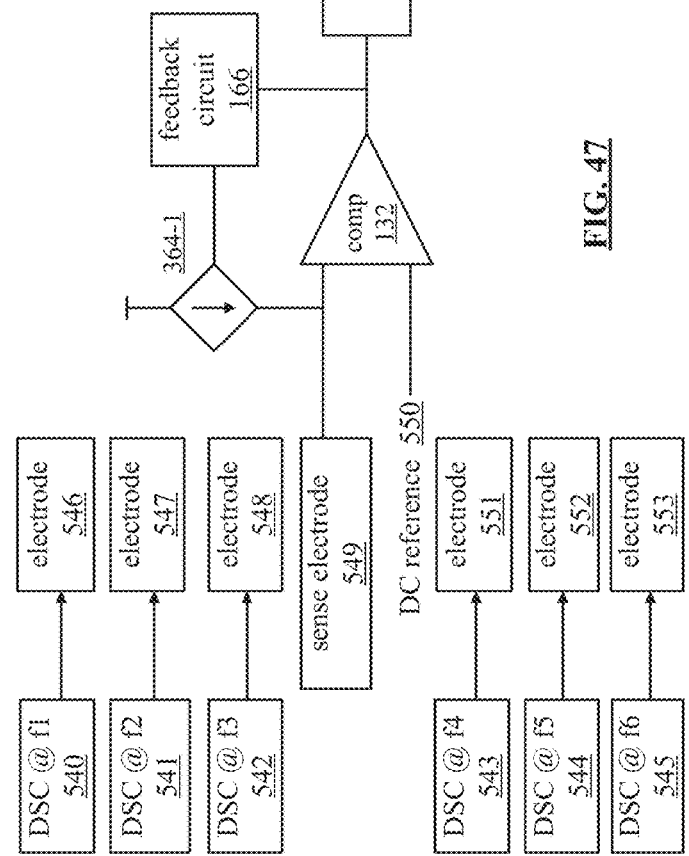
FIG. 47 is a schematic block diagram of a drive sense circuit module that detects changes in mutual capacitances between a sense electrode and one or more drive electrodes, in accordance with various embodiments of the present invention.

Referring next to FIG. 47, a drive sense circuit module that detects changes in mutual capacitances between a sense electrode and one or more drive electrodes will be discussed in accordance with various embodiments of the present invention. The sensing configuration illustrated in FIG. 47 includes a sense electrode coupled to a sense input of comparator 132, multiple drive electrodes 546, 547, 548, 551, 552, and 553, a direct current (DC) reference circuit 550m feedback circuit 166, regulated source 364-1, ADC 384, and digital filtering module 386.

The sense electrode 549 senses capacitively coupled signals from each of the drive electrodes 546, 547, 548,551, 552, and 553. Each of the drive electrodes has an oscillating signal of a particular frequency applied to it by a corresponding drive sense circuit (DSC). For example, DSC 540 applies a frequency $f_1$ to electrode 546, DSC 541 applies a frequency $f_2$ to electrode 547, DSC 542 applies a frequency $f_3$ to electrode 548, DSC 543 applies a frequency $f_4$ to electrode 551, DSC 544 applies a frequency $f_5$ to electrode 552, and DSC 545 applies a frequency $f_6$ to electrode 553. The different frequency signals, referred to herein as drive signals, are applied to respective electrodes, and capacitively coupled to sense electrode 549. The capacitive coupling between the drive electrodes 546, 547, 548,551, 552, and 553 and sense electrode 549 is referred to herein as mutual capacitance.

In a neutral, or base state, there is an initial level of mutual capacitance between each drive electrode and sense electrode 549. Thus, the comparison output of comparator 132 will include frequency components $f_1$, $f_2$, $f_3$, $f_4$, $f_5$, and $f_6$. In general, the magnitude of these frequency components is a function of the mutual capacitances between the individual drive electrodes and the sense electrode 549. The mutual capacitances tend to vary based on the proximity of the individual drive electrode to the sense electrode, but the drive electrodes may compensate for positional variances in mutual capacitance by being larger, or using more powerful oscillating components. In some embodiments, the drive and sense electrodes are con figured so that the frequency component associated with any one drive electrode has substantially the same magnitude as the frequency component associated with the other drive electrodes. This matching of frequency component magnitudes is not required by all embodiments. In some embodiments, for example, it is the change in the magnitude of a frequency component that is of interest, not the actual value.

In various embodiments, when an object moves into proximity of sense electrode 549 and one or more of the drive electrodes, the object cause the mutual capacitance between the sense electrode and the one or more drive electrodes to change. These changes in mutual capacitance will cause variations in the amplitude of the coupled signals. For example, if the mutual capacitance between drive electrode 548 and sense electrode 549 increases, that increase in capacitance will result in an increase in the magnitude of the $f_3$ component coupled to sense electrode 549. The increased magnitude of the $f_3$ component will result in an increase in the magnitude of the $f_3$ component included in the comparison signal generated at the output of comparator 132, which will then be digitized by ADC 384 and filtered by digital filtering module 386. The same is functionality holds for each of the different frequency components.

In at least one embodiment, digital filtering module 386 implements a bandpass filter having a variable center frequency. This center frequency can be changed by altering filter coefficients. To determine which of the drive electrodes are associated with a change in mutual capacitance, the center frequency of the bandpass filter implemented by digital filtering module 386 is iteratively altered to successively pass each of the individual frequency components $f_1$ to $f_6$. In some embodiments, multiple bandpass filters (not illustrated) can be concurrently employed, rather than requiring iterative scanning. By knowing the magnitude, or the magnitude of change, associated with each frequency component, and knowing the position of each of the drive electrodes in relation to the sense electrode, various information can be detected about the object causing the changes in the mutual capacitances. For example, positional information indicating where the object is located relative to the sense electrode can be determined based on which frequency components are changing, and which are not. Z-axis information, such as closeness to a touch sensitive device including the drive and sense electrodes can be obtained based on an absolute magnitude of the various frequency components. Information about the size of the object can be inferred from the number of frequency components whose magnitude has changed.

Figure 48:
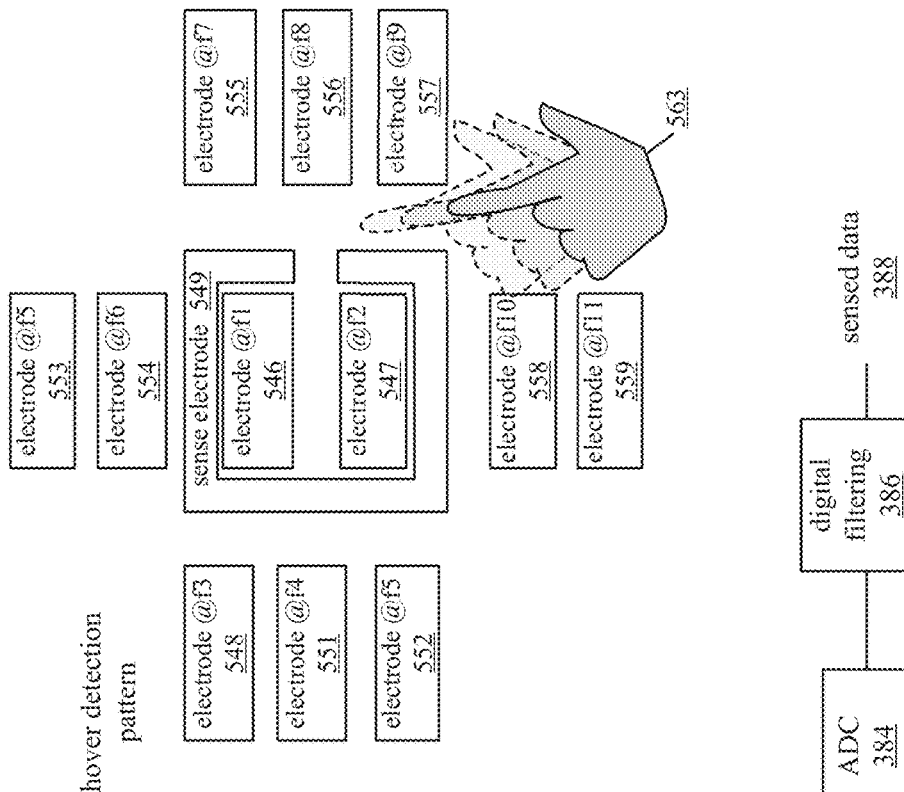
FIG. 48 is a schematic block diagram of an electrode arrangement used to detect positional information or other characteristics of an object in proximity to the electrode arrangement, in accordance with various embodiments of the present invention.

Referring next to FIG. 48 an electrode arrangement used to detect positional information or other characteristics of an object in proximity to the electrode arrangement will be discussed in accordance with various embodiments of the present invention. In various embodiments, the illustrated arrangement of electrodes can be included in a touch sensitive device, such as a touch panel, touch screen, or the like. Such an electrode arrangement can be used to assist in proper position of medical scanning device, in entrance sensors, touchless mice, touchless keyboards, or the like. It should be appreciated that other electrode configurations are contemplated to be within the scope of this invention.

The electrode arrangement in FIG. 48 shows a touch sensitive panel that includes a sense electrode 549 in a "C" configuration, with drive electrodes positioned about and within the sense electrode. Drive electrodes include electrodes 546, 547, 548, 551, 552, 553, 554, 555, 556, 557, 558, and 559, each having a different frequency drive signal applied. Hand 563 is illustrated as hovering over a portion of the touch sensitive panel, near the sense electrode 549 and drive electrodes 558, 558, and 557. As hand 563 hovers near the touch screen, the size and general shape of the hand can be detected based on the number and location of electrodes affected by the hover, the nearness of hand 563 to the touch panel (z-coordinate) can be determined by the magnitude of each of the frequency component that is capacitively coupled to sense electrode 549, and the x-y coordinates of the hover can be detected by determining during the bandpass filter's scan that the magnitude of frequency components $f_9$, $f_{10}$, and $f_{11}$ has changed.

Figure 49:
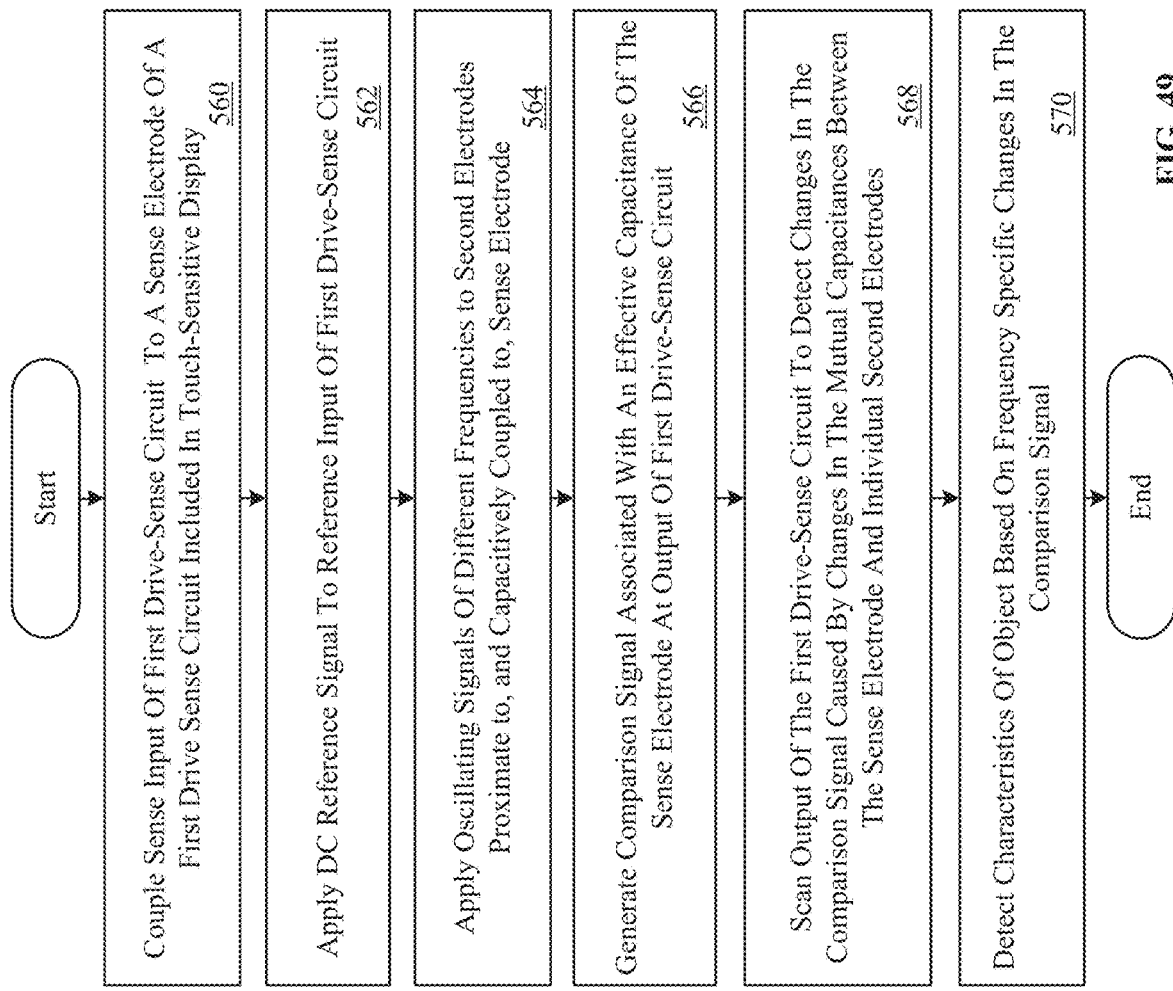
FIG. 49 is a flow chart illustrating a method of detecting positional information or other characteristics of an object in proximity to an electrode arrangement, in accordance with various embodiments of the present invention.

Referring next to FIG. 49, a method of detecting positional information or other characteristics of an object in proximity to an electrode arrangement will be discussed in accordance with various embodiments of the present invention. As illustrated by block 560, a sense input of a first drive sense circuit (DSC) is coupled to a sense electrode associated with a first drive sense circuit included in a touch-sensitive display, or other touch sensitive panel. As illustrated by block 562, a DC reference signal is applied to a reference input of the DSC.

As illustrated by block 564, oscillating signals having different frequencies are applied to second electrodes, sometimes referred to herein as drive electrodes. The second electrodes are positioned proximate to the sense electrode. The second electrodes are also capacitively coupled to the sense electrode. As illustrated by block 566, a comparison signal associated with an effective capacitance of the sense electrode is generated at an output of the first DSC. As used herein the term "effective capacitance" is used to refer to a combination of all mutual capacitances between the sense electrode and the individual drive electrodes. The effective capacitance is made up of individual mutual capacitances that can be separated into individual mutual capacitances based on frequency components.

As illustrated by block 568, a comparison signal output by the first drive sense circuit is scanned to detect changes in the comparison signal caused by changes in the mutual capacitances between the sense electrode and individual drive electrodes. In at least one embodiment, this scanning is performed by sequentially altering the center frequency of a bandpass filter to detect different frequency components included in the comparison signal, with each different frequency component being associated with a particular mutual capacitance. As shown by block 570, the characteristics of an object, including positional characteristics, size and shape, are detected based on frequency specific changes in the comparison signal.

Figure 50:
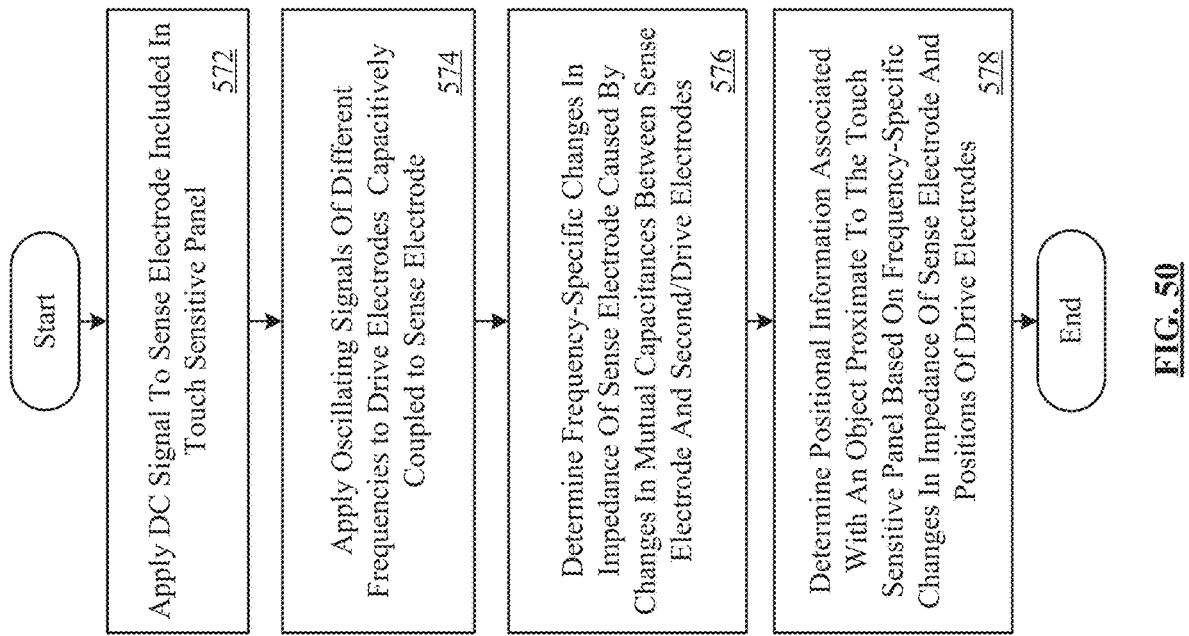
FIG. 50 is a flow chart illustrating another method of detecting positional information or other characteristics of an object in proximity to an electrode arrangement, in accordance with various embodiments of the present invention.

Referring next to FIG. 50, another method of detecting positional information or other characteristics of an object in proximity to an electrode arrangement is discussed in accordance with various embodiments of the present invention. As illustrated by block 572, a direct current signal is applied a sense electrode included in a touch sensitive panel. AT block 574, oscillating signals of different frequencies are applied to drive electrodes that are capacitively coupled to a sense electrode.

As illustrated by block 576, frequency-specific changes in impedance of the sense electrode caused by changes in mutual capacitances between the sense electrode and drive electrodes is determined. As illustrated by block 578, positional information associated with an object proximate to the touch sensitive panel is determined based on the frequency-specific changes to the impedance of the sense electrode, and the positions of drive electrodes.

Figure 51:
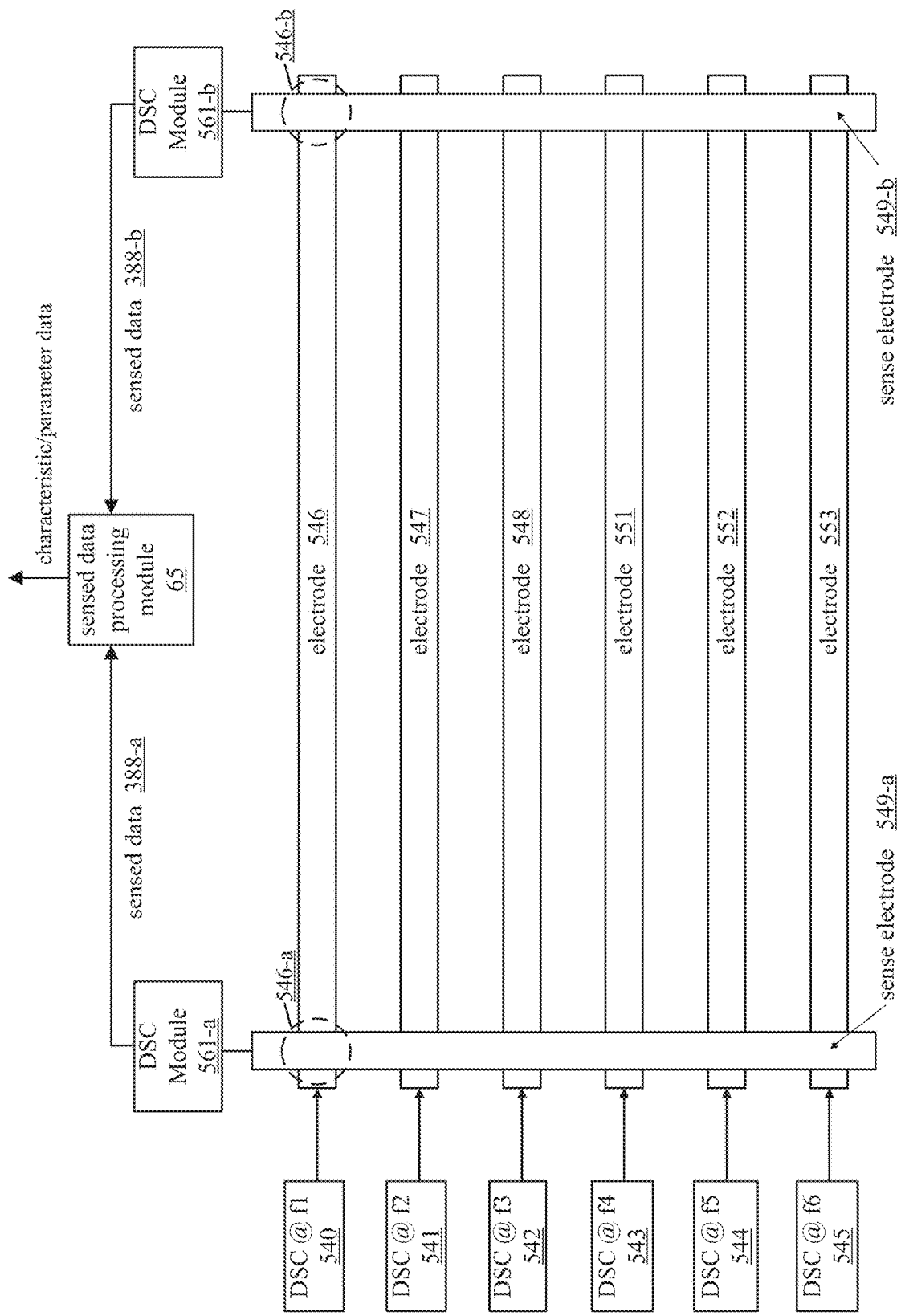
FIG. 51 is a schematic block diagram illustrating multiple sense electrodes, positioned proximate to different portions of other electrodes, to determine changes in characteristics of those other electrodes, in accordance with various embodiments of the present invention.

Referring next to FIG. 51 an electrode configuration including multiple sense electrodes, positioned proximate to different portions of other electrodes will be discussed in accordance with various embodiments of the present invention. The electrode configuration shown in FIG. 51 includes multiple elongated drive electrodes 546, 547, 548, 551, 552, and 553, each of which is coupled to a different drive sense circuit (DSC) 540, 541, 542, 543, 544 providing a drive signal at a specific frequency $f_1$, $f_2$, $f_3$, $f_4$, $f_5$, or $f_6$. Two sense electrodes, 549-a and 549-b are coupled to DSC modules 561-a and 561-b, respectively. DSC modules 561-a and 561-b provide a regulated direct current (DC) power signal to both of the sense electrodes. The two sense electrodes are positioned proximate to different portions of the drive electrodes.

Each sense electrode 549-a and 549-b have mutual capacitances associated with each of the drive electrodes. So for example, a first mutual capacitance 546A is associated with capacitive coupling between elongated drive electrode 546 and sense electrode 549-a; and a second mutual capacitance 546B is associated with capacitive coupling between elongated drive electrode 546 and sense electrode 549-b. A drive signal having a frequency $f_1$ is applied at one end of elongated drive electrode 546 by DSC 540. Elongated drive electrode 546 acts as a transmission line, so first mutual capacitance 546A is different from second mutual capacitance 546B. This difference in mutual capacitance will manifest itself in a difference in the magnitude of the drive signal capacitively coupled to sense electrode 549-a and the magnitude of the drive signal capacitively coupled to sense electrode 549-b.

Thus, the difference between first mutual capacitance 546A and second mutual capacitance 546B can be determined based on the differences in magnitudes of the $f_1$ frequency component sensed by the two sense electrodes. The differences in mutual capacitance can be used to determine electrical characteristics of the elongated drive electrode 546, including, but not limited to, frequency dependent characteristics.

In the illustrated embodiments, the drive electrodes are shown as elongated electrodes to emphasize the transmission-line nature of the electrodes. In various embodiments, multiple non-elongated drive electrodes (not illustrated) can be coupled together to form an elongated drive electrode. Additionally, more than two sense electrodes can be used to sense and compare multiple mutual capacitances at different points on the drive electrodes. Furthermore, sense electrodes 549-a and 549-b can be a selected subset of sense electrodes selected from a larger group of sense electrodes. For example, each of the drive electrodes may be characterized using 3, 4, or more sense electrodes so that the drive electrodes are more fully characterized at multiple locations along their lengths. Configuration parameters can be generated based on the characterization. If the characterization parameters indicate that a desired sensing resolution can be obtained using only two sense electrodes, the other sense electrodes can be deactivated during sensing operations.

Additionally, in some embodiments, the sense electrodes 549-a and 549-b can be used as drive electrodes, and the drive electrodes 546, 547, 548, 551, 552, and 553 can be used as sense electrodes. This can be accomplished by changing the power signal applied to each electrode, so that electrodes 546, 547, 548, 551, 552, and 553 have a DC power signal applied to them, while electrodes 549-a and 549-b have oscillating power signals applied to them. In this way, desired vertical or horizontal sense resolutions can be obtained.

In at least one implementation, a first DSC, e.g. DSC 545 is coupled to a drive electrode e.g. electrode 553, the first DSC is configured to apply an oscillating drive signal to the drive electrode, and the oscillating drive signal oscillates at a first frequency e.g. $f_6$. A first sense electrode, e.g. sense electrode 549-a, is positioned proximate to a first portion of the drive electrode. The first sense electrode coupled to a second DSC, e.g. DSC 561-a, and the first sense electrode and the second DSC are configured to sense a first change in a first mutual capacitance between the first sense electrode and the drive electrode.

A second sense electrode, e.g. sense electrode 549-a, is positioned proximate to a second portion of the same drive electrode. The second sense electrode is coupled to a third DSC e.g. DSC 561-b, and the second sense electrode and the third DSC are configured to sense a second change in a second mutual capacitance between the second sense electrode and the drive electrode. The first and second sense electrodes are coupled to a sensed data processing module 65, which is configured to determine a characteristic of the drive electrode based on the first mutual capacitance and the second mutual capacitance, as indicated by the sensed data from the second and third DSC modules.

In at least one embodiment, the electrode configuration discussed with reference to FIG. 51 can be used in a large touch screen, a touch sensitive panel positioning sensor, a proximity detector, or the like. An example of a touch screen is shown and discussed with reference to FIG. 4.

Figure 52:
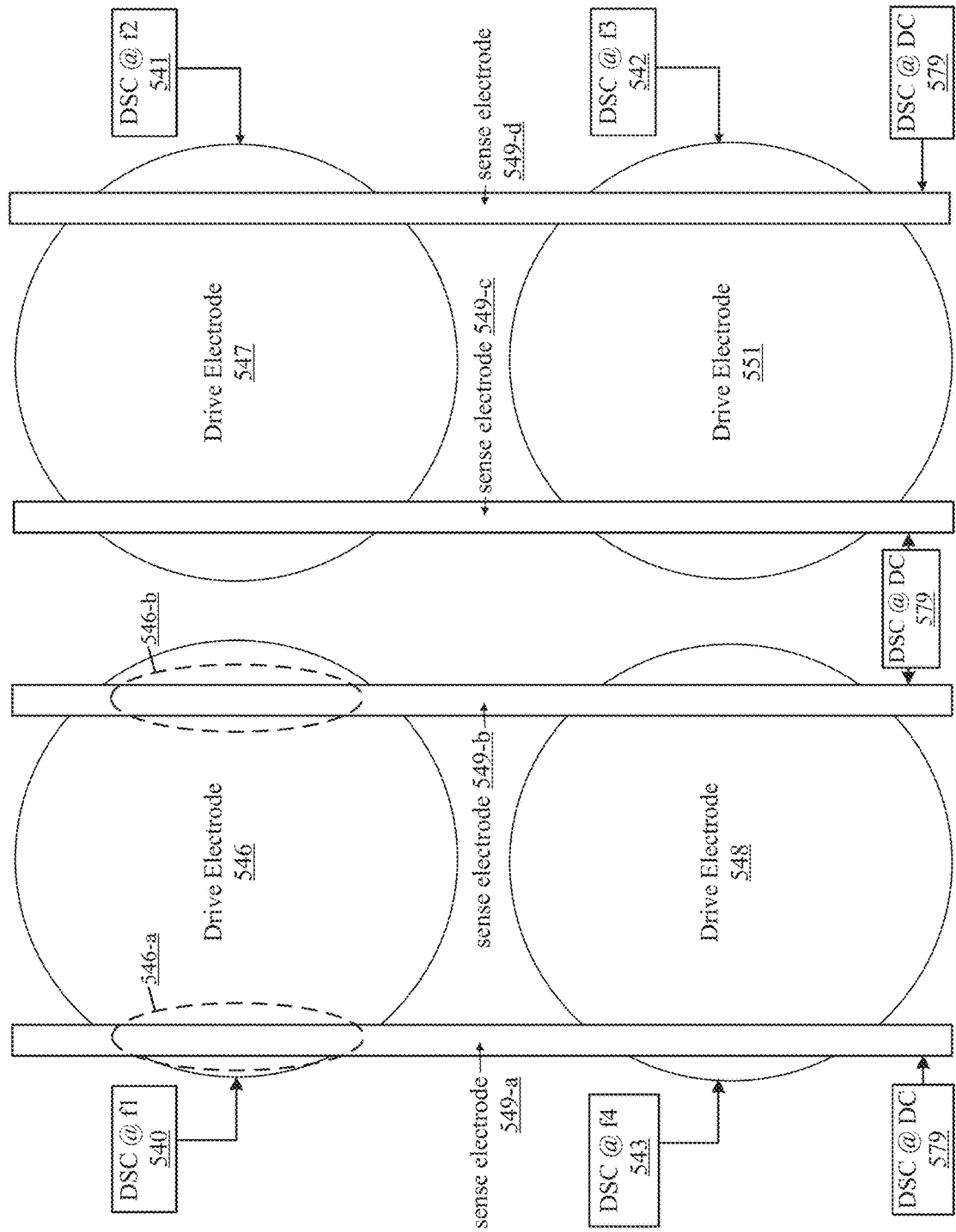
FIG. 52 is another schematic block diagram illustrating multiple sense electrodes, positioned proximate to different portions of other electrodes, to determine changes in characteristics of those other electrodes, in accordance with various embodiments of the present invention.

Although the above discussion refers to elongated drive electrodes, other electrode configurations are contemplated within the scope of the present invention. FIG. 52, for example, shows another electrode configuration in which multiple sense electrodes are positioned proximate to different portions of drive electrodes. Four sense electrodes 549-a, 549-b, 549-c, and 549-d are placed proximate to different portions of drive electrodes 546, 547, 548, and 551. The operation of the electrode configuration shown in FIG. 52 is the same as the operation of the electrode configuration shown in FIG. 51, except that the drive electrodes have a non-elongated shape. It will be appreciated that the mutual capacitances formed by the drive and sense electrodes, e.g. mutual capacitances 546A and 546B, are still different from each other, and can still be used to characterize the drive electrode, and can still be used to generate configuration characteristics and to sense positional and other information of an object brought into proximity of the electrode arrangement.

Figure 53:
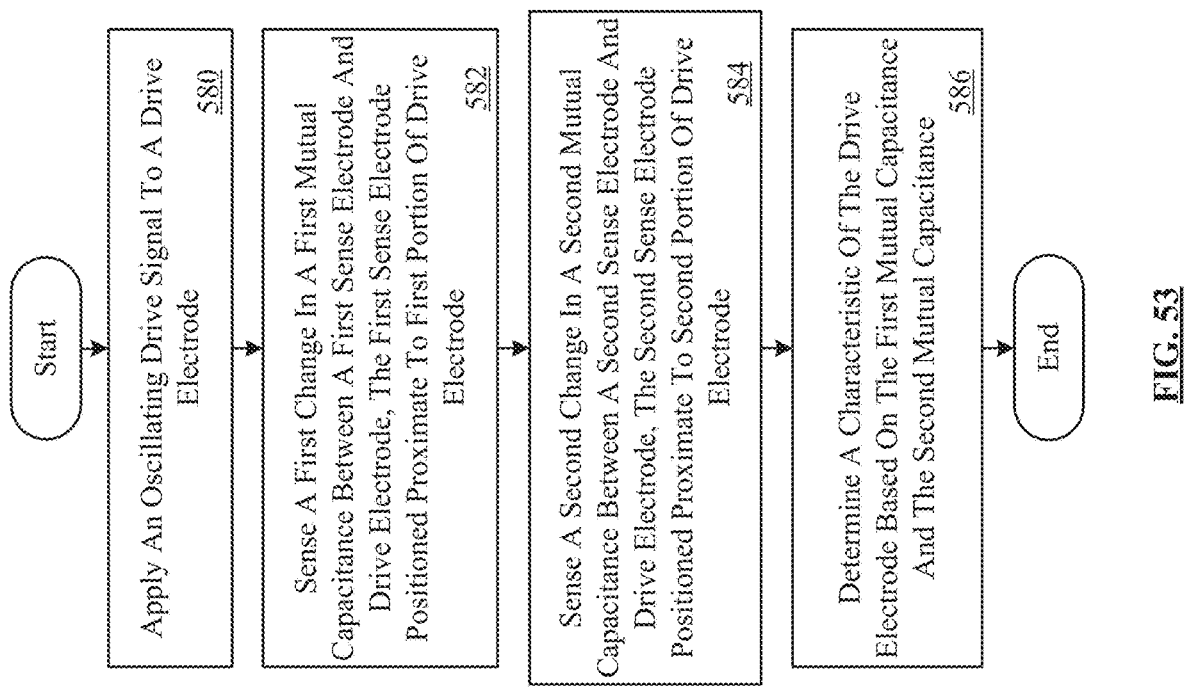
FIG. 53 is a flow chart illustrating a method of using multiple sense electrodes to determine changes in characteristics of other electrodes, in accordance with various embodiments of the present invention.

Referring next to FIG. 53 a method of using multiple sense electrodes to determine changes in characteristics of other electrodes will be discussed in accordance with various embodiments of the present invention. As illustrated at block 580, an oscillating drive signal is applied a drive electrode.

At block 582, a change in a first mutual capacitance is sensed. The change in the first mutual capacitance is associated with a mutual capacitance between a first sense electrode and a first portion of the drive electrode. The sensing includes applying a regulated, non-oscillating power signal, e.g. a direct current (DC) signal, to the first sense electrode, and comparing an electrical characteristic of the regulated power signal to a corresponding electrical characteristic of the reference signal. A result of the comparison indicates a change in the first mutual capacitance.

As illustrated by block 584, a change in a second mutual capacitance is sensed. The change in the second mutual capacitance is associated with a mutual capacitance between a second sense electrode and a second portion of the drive electrode. The sensing includes applying a regulated, non-oscillating power signal, e.g. a direct current (DC) signal, to the second sense electrode, and comparing an electrical characteristic of the power signal to a corresponding electrical characteristic of the reference signal. A result of the comparison indicates a change in the second mutual capacitance.

As illustrated by block 586, one or more characteristics of the drive electrode are determined based on the first and second mutual capacitances. For example, sensed data output by a DSC coupled to each of the sense electrodes indicates a change in mutual capacitance associated with a corresponding sense electrode. An amplitude of a particular frequency component of the sensed data from the first sense electrode can be compared to the amplitude of that same frequency component of the second sensed data to determine a frequency dependent characteristic, for example impedance per unit distance of the drive electrode. For example, if the spacing between the first sense electrode and the second sense electrode is known, the difference in amplitude can be used to determine how much resistance and/or reactance is introduced per unit length of the drive electrode. This information can be used to generate characterization parameters, which can be used later to interpret variations in sensed mutual capacitances, to adjust filter coefficients and other filter parameters, or the like.

In various embodiments, when multiple different drive electrodes having different frequencies interact with a sense electrode, the DSC used to sense changes in mutual capacitances associated with the sense electrode generates an output having multiple frequency component. The different frequency components can be separated by varying a center frequency of a bandpass filter in accordance with configuration parameters, or otherwise. In some instances, the drive electrodes can be sequentially activated, so that different frequency components are present in the output of the sense electrode's DSC at different times.

In some implementations, multiple pairs of sense electrodes, each configured for use with a specific frequency, can be used, so that mutual capacitances associated with electrodes at non-configured frequencies are ignored, or removed by filtering.

Figure 54:
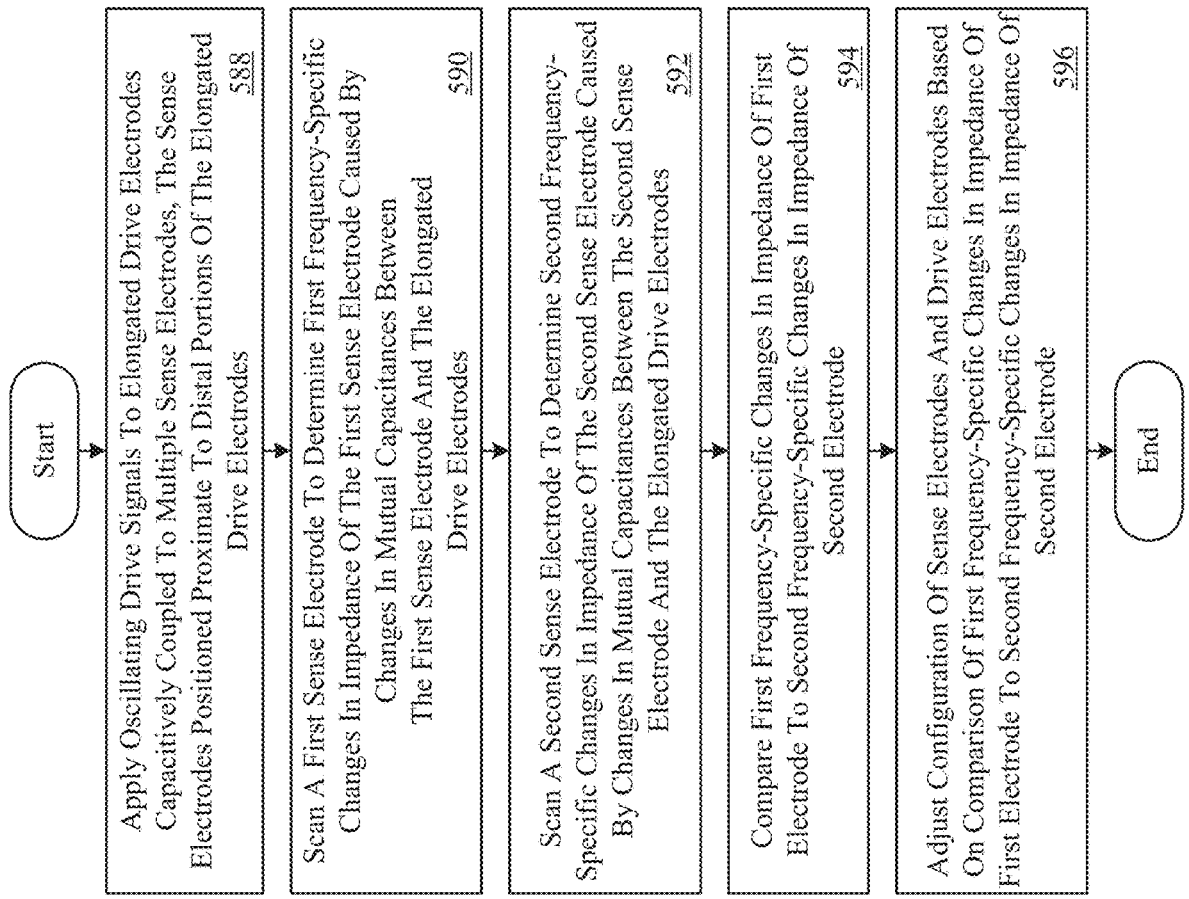
FIG. 54 is a flow chart illustrating a method of using multiple sense electrodes to sense changes in characteristics of other electrodes, and adjusting an electrode configuration based on those sensed changes, in accordance with various embodiments of the present invention.

Referring next to FIG. 54 a method of using multiple sense electrodes to sense changes in characteristics of other electrodes, and adjusting an electrode configuration based on those sensed changes will be discussed in accordance with various embodiments of the present invention. As illustrated by block 588, oscillating drive signals are applied to elongated drive electrodes, which are capacitively coupled to multiple sense electrodes. The sense electrodes are positioned proximate to distal portions of the elongated drive electrodes. An example of one such configuration is shown with respect of FIG. 51.

As illustrated by block 590, a first sense electrode is scanned to determine first frequency-specific changes in impedance of the first sense electrode, where the first frequency-specific changes in impedance are attributable to changes in mutual capacitances between the first sense electrode and the elongated drive electrodes. The scanning can be implemented by a controller, which adjusts filter coefficients to differentiate between different frequency components. The controller can selectively activate particular drive electrodes in addition to, or in place of adjusting filter coefficients. In other implementations, scanning includes sending sensed data including all frequency components of potential interest to a processing module that separates and analyzes the individual frequency components.

As illustrated by block 592, a second sense electrode is scanned to determine second frequency-specific changes in impedance of the second sense electrode, where the second frequency-specific changes in impedance are attributable to changes in mutual capacitances between the second sense electrode and the elongated drive electrodes.

As illustrated by block 594, the first frequency-specific changes in impedance of first electrode are compared to the second frequency-specific changes in impedance of second electrode. In at least one embodiment, the comparison is performed by a processing module based on sensed data corresponding to particular frequencies. In other embodiments, sensed data corresponding to different mutual capacitances at the same frequency can be input to an additional comparator, and the results of that comparator can be supplied to a processing module.

As illustrated by block 596, a configuration of the sense electrodes and drive electrodes can be adjusted based on the comparison of the first frequency-specific changes in impedance of first electrode to the second frequency-specific changes in impedance of second electrode. For example, the amplitude of a reference signal applied to a DSC associated with one of the sense electrodes can be decreased if the comparison indicates that the change in mutual capacitance associated with that sense electrode is causing the DSC circuit to saturate at that frequency. In another example, a filter coefficient may be adjusted to compensate for an unexpected difference in the frequency response between the two mutual capacitances.

In yet other embodiments, adjusting the configuration of the sense electrodes and the drive electrodes can include selecting different frequencies to use for the drive signals, coupling or de-coupling one or more electrodes, selecting or activating a different number of drive or sense electrodes, changing the function of one or more electrodes from drive to sense or sense to drive, substituting one regulated source type for another, and the like.

Figure 55:
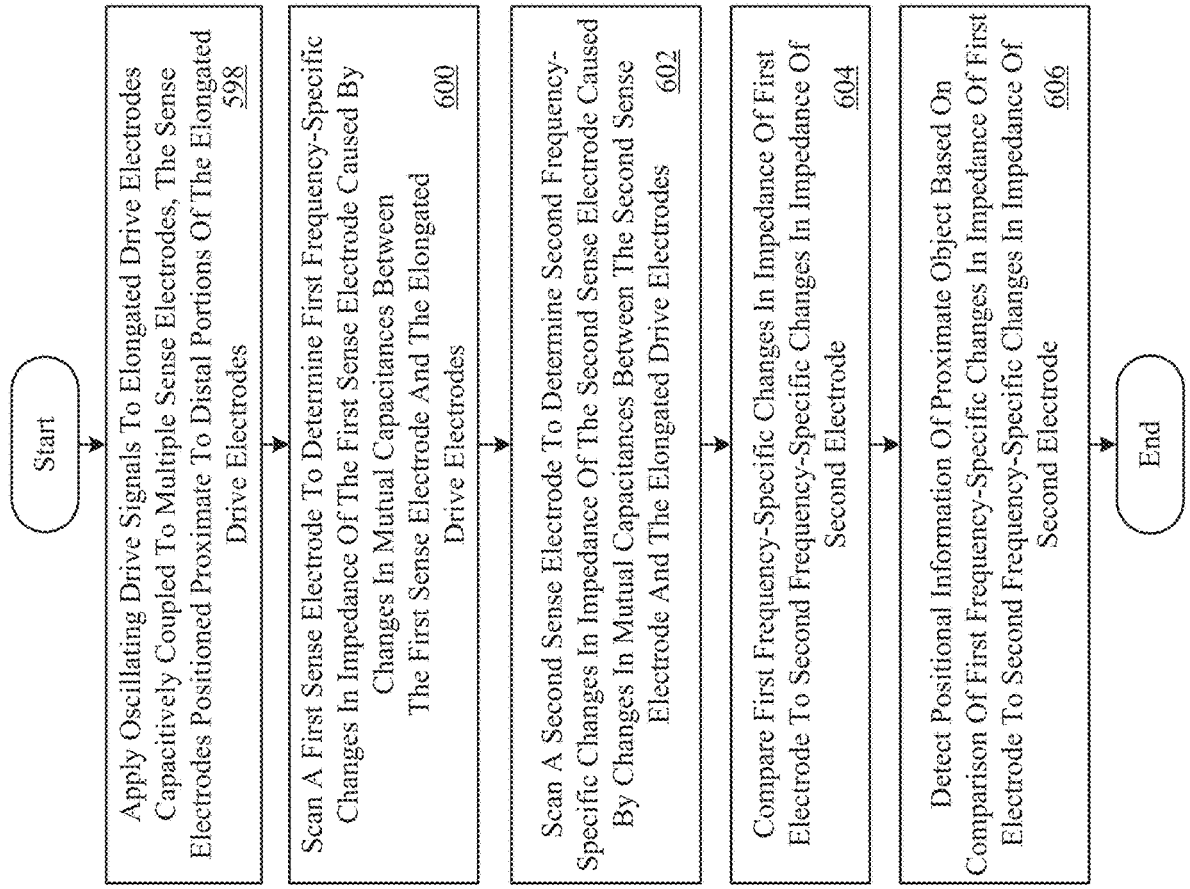
FIG. 55 is a flow chart illustrating a method of using multiple sense electrodes to sense changes in characteristics of other electrodes, and detecting positional information of proximal objects, in accordance with various embodiments of the present invention.

Referring next to FIG. 55, a method of using multiple sense electrodes to sense changes in characteristics of other electrodes, and detecting positional information of proximal objects will be discussed in accordance with various embodiments of the present invention. As illustrated by block 598, Oscillating drive signals are applied to elongated drive electrodes, which are capacitively coupled to multiple sense electrodes. The sense electrodes are positioned proximate to distal portions of the elongated drive electrodes.

As illustrated by block 600, a first sense electrode is scanned to determine first frequency-specific changes in impedance of the first sense electrode, where the first frequency-specific changes in impedance are attributable to changes in mutual capacitances between the first sense electrode and the elongated drive electrodes.

As illustrated by block 602, a second sense electrode is scanned to determine second frequency-specific changes in impedance of the second sense electrode, where the second frequency-specific changes in impedance are attributable to changes in mutual capacitances between the second sense electrode and the elongated drive electrodes.

As illustrated by block 604, the first frequency-specific changes in impedance of first electrode are compared to the second frequency-specific changes in impedance of second electrode.

As illustrated by block 606, positional information of a proximal object is detected based on comparison of first frequency-specific changes in impedance of first electrode to second frequency-specific changes in impedance of second electrode. Positional information can include information indicating that an object is within a detectable distance of a touch sensitive panel, such as a touch screen. Positional information can also include information about the location of the proximal object in 3 dimensional space relative to the touch sensitive panel. Knowledge of the location of the touch panel can be used to extend knowledge of the relative location to a geographic location. Movement of the proximal object from one location to another, and the position of one portion of an object with respect to another portion of the object. Hover detection is one example of how positional information can be used.

In one embodiment, the frequency-dependent changes in impedance can be used to detect positional information by taking into account that if an object is closer to an "intersection" of a drive electrode and a first sense electrode than the object is to the intersection of the drive electrode and the second sense electrode, the mutual capacitance of at the first intersection will change more than the mutual capacitance at the second intersection. In this example, the object can be determined to be closer to the first intersection than to the second intersection. The change in mutual capacitance at multiple different intersections associated with multiple different drive electrodes can provide additional information that describes the position of an object proximal to a touch screen more fully. In some embodiments, triangulation techniques can be used by a processing module to determine the position of an object in proximity of a touch sensitive panel.

Figure 56:
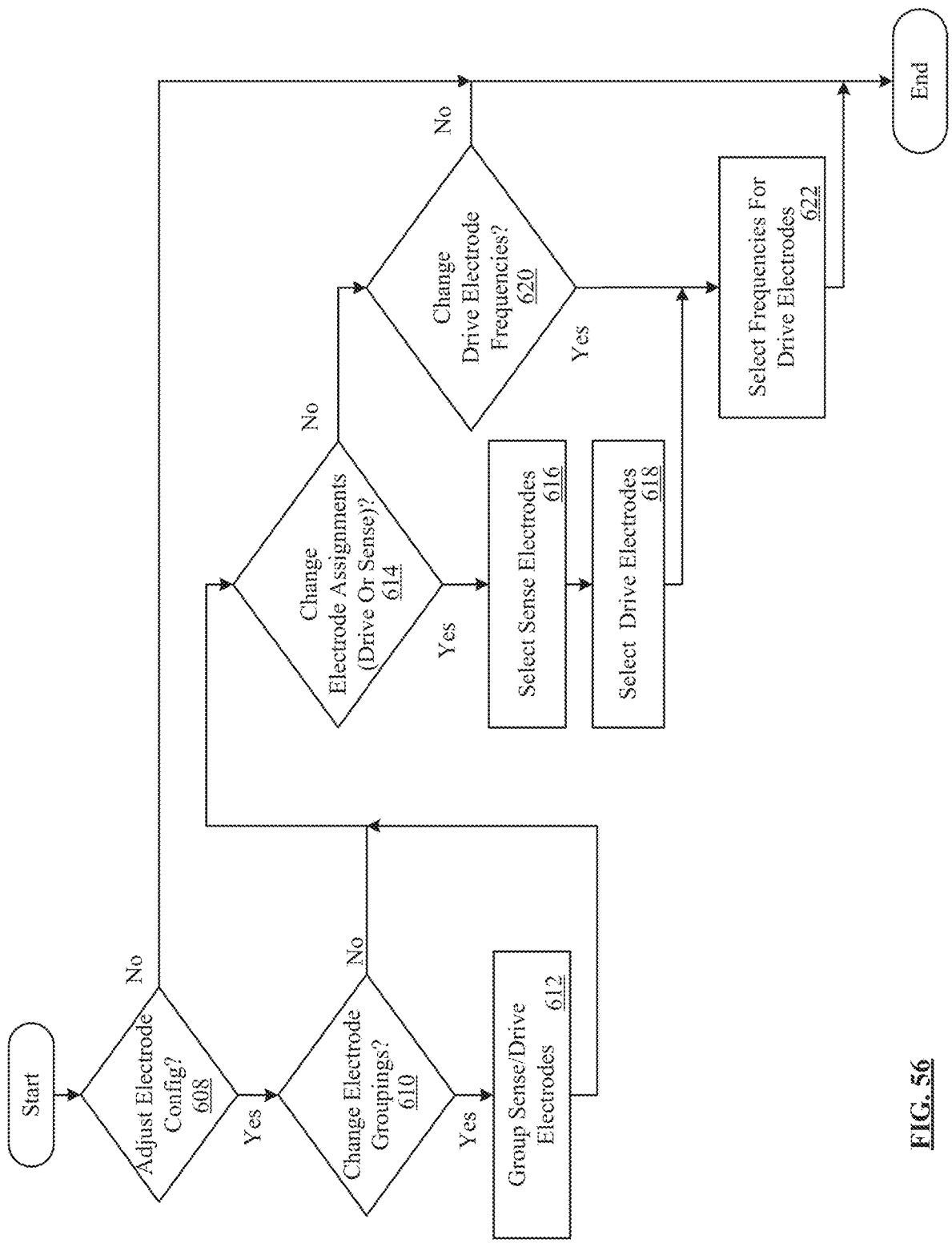
FIG. 56 is a flow chart illustrating a method of adjusting one or more of an electrode configuration, an electrode assignment, or an electrode drive frequency based on changes in electrode characteristics sensed by multiple sense electrodes, in accordance with various embodiments of the present invention.

Referring next to FIG. 56 a method of adjusting one or more of an electrode configuration, an electrode assignment, or an electrode drive frequency based on changes in electrode characteristics sensed by multiple sense electrodes will be discussed in accordance with various embodiments of the present invention.

As illustrated by block 608, a check is made to determine if the electrode configuration is to be adjusted. The determination can include comparing configuration parameters of a sensing circuit and load configuration parameters to determine if the current electrode configuration is suitable for an intended use. Consider, for example, a touch screen that includes a default electrode and sensing circuit configuration tuned for fine-granularity touch sensing. During a setup process, user input can be received indicating that the touch screen is to be used for course position sensing and proximity detection. A lookup table cross referencing preferred configuration parameters for different intended uses can be consulted to determine that the default configuration is to be altered. Various different configuration adjustments can be indicated, including a change in drive or sense frequencies, a change in which electrodes are active or inactive, a change in electrode groupings, a change in electrode assignment as either drive electrodes sense electrodes, or dual purpose electrodes, changes in sense circuit configurations, including but not limited to changes in filter parameters, type of regulated sources, type of reference sources, type of loop correction circuit(s), and the like. In some embodiments, the processing device can use the configuration parameters to determine if the electrodes are matched to the sensing circuitry. If not, the decision can be made to adjust the electrode configuration to have characteristics that work well with the sensing circuitry.

If no adjustments to the electrode configuration are to be made, the method ends. However, if the electrode configuration is to be adjusted, a check can be made to determine if the electrode groupings are to be changed, as illustrated by block 610. In some embodiments, the decision regarding electrode grouping can be made at block 608. A change to electrode groupings may be indicated to reduce a number of DSCs used, to change a size of an electrode so that a sensing area is made bigger or smaller, to change a vertical and/or horizontal touch resolution in all or part of a touch sensitive screen, to change the shape of an electrode group, or the like.

As illustrated by block 612, if the electrode grouping is to be changed, selected drive and or sense electrodes are grouped under control of a controller. Techniques and circuitry used for grouping electrodes are discussed in greater detail with reference to FIGS. 57-59.

As illustrated by block 614, a decision is made regarding whether to change electrode assignments from drive to sense, or from sense to drive. To change electrode assignments, the outputs of the electrode(s) to be assigned as sense electrode(s) are coupled to processing circuitry capable of analyzing the output in conjunction with other sense electrodes. In various embodiments, the necessary connections to the processing circuitry are always present, and the appropriate input to the processing circuitry need only be activated. In other embodiments, the processing circuitry includes inputs that are switched between electrodes as needed.

As illustrated by blocks 616 and 618, if electrodes are to be reassigned, particular drive and or sense electrodes are selected. Electrodes can be selected for reassignment based on the number of sense electrodes for a particular application, based on a number of different frequencies used in a particular application, electrode spacing, electrode location in relation to other electrodes, electrode shape, or the like.

Once the drive and sense electrodes are selected, frequencies of power signals to be applied to those electrodes are selected, as illustrated by block 622. Selection of frequencies can be based on previously stored configuration parameters, based on frequencies assigned to adjacent electrodes, based on a lookup table associating frequencies with specific configurations and/or intended uses of the touch screen, a size of the touch screen, power limitations, a number of unused frequencies, load configuration parameters, filter or analog to digital circuitry bandwidth limitations, or the like. In some embodiments, multiple electrodes can be assigned the same frequency to increase a capacitively coupled signal strength. In other embodiments, electrodes in different portions of a touch sensitive display can be assigned the same frequency if they will not interact.

As illustrated by block 620, a check is made to determine whether the drive frequencies need to be adjusted. If not, the method ends. If a change to the electrode drive frequencies is to be made, electrode frequencies are selected as illustrated by block 622.

Figure 57:
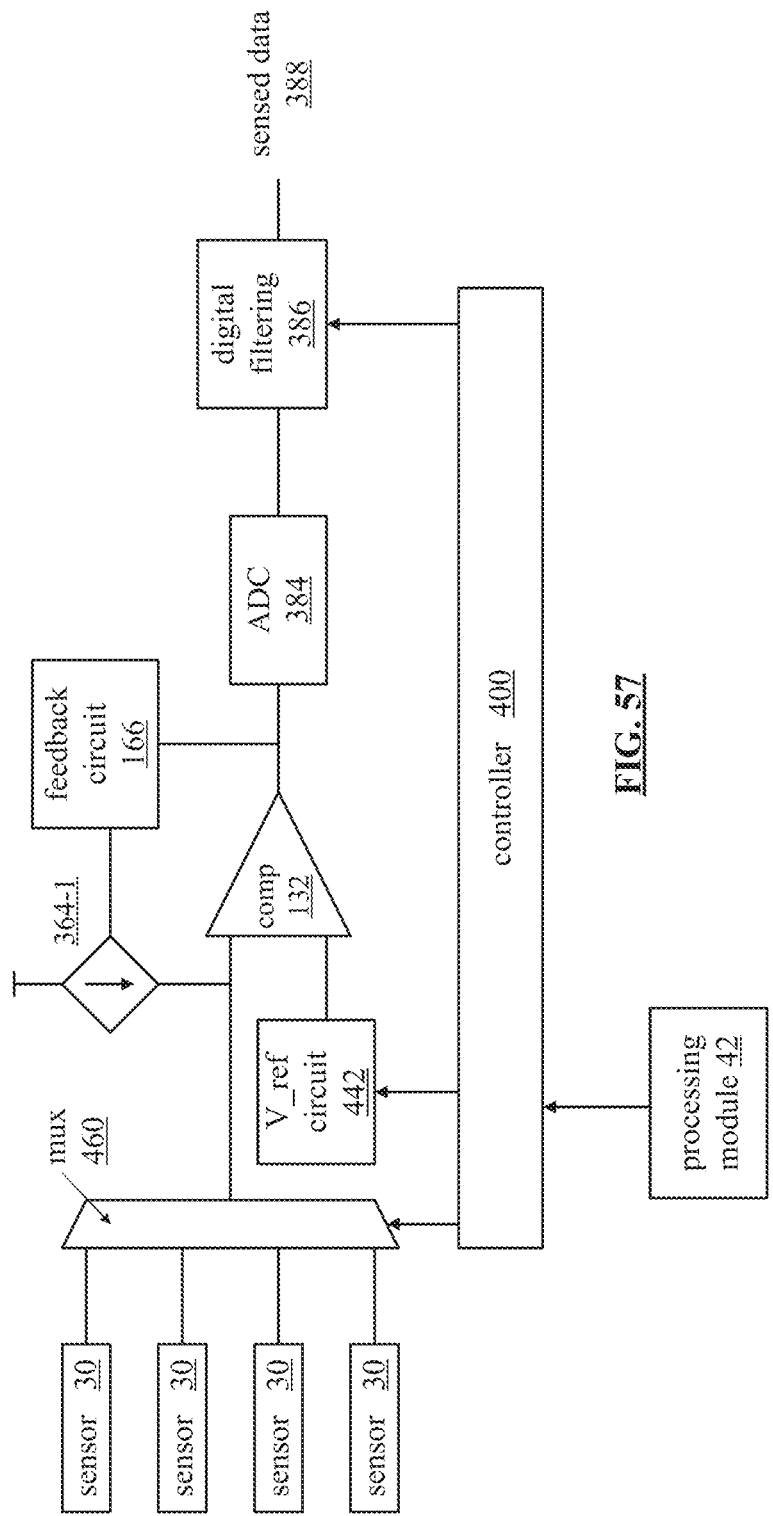
FIG. 57 is a schematic block diagram of a drive sense circuit module and associated controller that cooperate to multiplex multiple sensors signals to a sense input of a comparison circuit, in accordance with various embodiments of the present invention.

Referring next to FIG. 57 is a drive sense circuit module and associated controller, which cooperate to multiplex multiple sensors signals to a sense input of a comparison circuit will be discussed in accordance with various embodiments of the present invention. The drive sense circuit module shown in FIG. 57 includes a multiple sensors 30 coupled via multiplexer 460 to a sense input of comparator 132, a voltage reference circuit 442 coupled to provide a reference voltage to a reference input of comparator 132, a regulated current source 364-1 to provide a power signal to sensors 30 and to the sense input of comparator 132, a feedback circuit 166 to generate a regulation signal provided to regulated current source 634-1 from a comparison signal generated by comparator 132, an analog to digital converter 384 to digitize the comparison signal, and digital filtering module 386 to filter the digitized comparison signal to generate sensed data 388. Controller 400-*a* is coupled to multiplexer 460, to voltage reference circuit 442, and to digital filtering circuit 386.

Controller 400-*a* can receive configuration instructions from processing module 42, including information indicating selected sensors 30 to be grouped together, voltage references to be generated by voltage reference circuit 442 and filtering parameters to be employed by digital filtering module 386. Controller 400-*a* translates the information received from processing module 42 into the appropriate control signals, and transmits the control signal to the affected circuitry. For example, if all four sensors 30 are to be grouped together, controller 400-*a* controls multiplexer 460 to connect all four sensors 30 to the sense input of comparator 132. If the voltage reference circuit 442 is to be configured to supply an oscillating signal with a DC offset, controller 400-*a* transmits control signals to configure voltage reference circuit 442 in accordance with the information received from processing module 42. Similarly, controller 400-*a* transmits control signals to configure digital filtering module 386 in accordance with the information received from processing module 42.

Controller 400-*a* can generate control signals to configure electrode, or sensor, configurations by selectively coupling different sensors to particular DSCs, thereby forming different sensor/electrode configurations. When coupling multiple sensors to a single DSC, an electrical characteristic of the group sensors can be different than an electrical characteristic of any single sensor. For example, if each of the sensors is modeled as a capacitor, coupling the sensors through a mux has the effect of coupling multiple capacitors in parallel so that the effective capacitance of the group of electrodes will be the sum of the individual capacitances.

To account for this change in capacitance, or in some other electrical characteristic, configuration parameters characterizing various sensor configurations can be retrieved from storage, and used to determine adjustments of other sensing circuit components. For example, if the combined capacitance of all four sensors 30 is greater than the capacitance of the individual sensors, then the frequency of the reference signal produced by voltage reference circuit 442 can be changed to accommodate that change in capacitance, effectively tuning the sensing circuit to the load. If the reference frequency is changed, then a center frequency of a bandpass filter implemented by digital filtering module may also be adjusted by controller 400-*a*.

Referring next to FIG. 58, a method of combining multiple load signals to generate configuration parameters reflecting combined load characteristics will be discussed in accordance with various embodiments of the present invention. As illustrated by block 636, one or more loads are selected to be coupled together to yield a combined load characteristic. The loads to be coupled together can be selected based on a lookup table, based on a sensing circuit configuration, based on application requirements, or the like.

As illustrated by block 638, the selected loads are coupled to a sense input of a comparison circuit. The loads can be coupled to the sense input via a multiplexer or other switching circuit controlled by a controller based on configuration information associated with the loads and the sensing circuitry. As used in this context, a load can include a sensor, and electrode, an active load, or passive load.

As illustrated by block 640, a regulated drive signal is coupled to the selected loads and to the sense input of the comparison circuit. The regulated drive signal has regulated electrical characteristic and controlled electrical characteristic. As illustrated by block 642, a reference signal is applied to a reference input of the comparison circuit to establish reference value of the controlled electrical characteristic. As illustrated by block 644, the comparison circuit generates a comparison signal based on a comparison of a value of the controlled electrical characteristic present at the sense input of the comparison circuit to the reference value of the controlled electrical characteristic. As illustrated by block 646, the regulated drive signal is regulated based on the comparison signal.

As illustrated by block 648, sensed data is generated based on the comparison signal, where the sensed data indicates an effect of the combined load characteristic on the regulated drive signal. As illustrated by block 650, combined-load configuration parameters are generated based on sensed data. The configuration parameters are stored, as illustrated by block 652.

As illustrated by block 653, a check is made to determine whether additional combinations of loads are to be tested. For example, in at least one embodiment, there may be 6 different sensors that could be coupled together in different combinations. For example, each sensor could be coupled individually, each sensor could be coupled with one other sensor, each sensor could be coupled with two other sensors, and so on. Each different combination of sensors would yield one or more load characteristics associated with that combination. To fully characterize all potential sensor combinations, a controller can iteratively couple each potential sensor combination to the sense input of the comparison circuit, so that the combined load characteristic associated with that combination can be determined. Thus, if it is determined at block 653 that additional sensor combinations are to be characterized, the method proceeds back to block 636, and the method repeats.

If it is determined at block 653 that there are not more sensor combinations to evaluate, the method ends. At that point, configuration parameters associated with each of the different possible sensor combinations have been determined and stored for later use in configuring other sensing circuits for use with particular sensor combinations, or configuring sensor combinations for use with particular sensing circuit configurations.

Referring next to FIG. 59, a method of configuring a load and/or a drive sense circuit module based on previously characterized load combinations will be discussed in accordance with various embodiments of the present invention.

As illustrated by block 654, a processing module obtains configuration parameters associated with a present load and sensing circuit configuration from storage. In some embodiments, the processing module may also include information about an intended use of the load and sensing circuit. The information about intended use can be cross referenced with configuration parameters associated with the intended use to assist in making various configuration determinations.

As illustrated by block 656, the processing module determines whether more than one load is to be combined, or coupled together. The decision can be based on configuration parameters retrieved by the processing module, based on user input, based on a default configuration, or otherwise. For example, if the configuration parameters of the sensing circuit indicate that the sensing circuit is tuned for use with a sensor having an impedance of $Z_{ideal}$, and there is no single sensor whose impedance is $Z_{ideal}$, the decision can be made to combine multiple sensors.

As illustrated by block 658, if multiple loads are to be coupled together, particular loads are selected based on the configuration parameters to achieve a desired combined load characteristic. Continuing with the above example, the desired load characteristic is $Z_{ideal}$, the loads to be combined can be selected to achieve the combined impedance of $Z_{ideal}$, as indicated by the configuration parameters.

As illustrated by block 660, once the processing module has identified a combination of loads to combine, the processing module provides that information to a controller, which uses that information to generate a control signal. The control signal is sent to a switching circuit, such as a multiplexer, which connects the loads to the sense input of a comparator circuit.

As illustrated by block 662, if the determination at block 656 indicates that no loads are to be coupled together, the processing module determines whether a reference signal is to be configured. The check at block 662 is also performed after the selected loads have been coupled to the sense input. Thus, the decision at block 662 is made after the load characteristics have been established. The decision about whether to configure the reference signal can be made based on the configuration parameters associated with the load configuration parameters. For example, sense circuit configuration parameters can be associated with the load configuration parameters. So for example, a first set of sense circuit configuration parameters may specify that they are to be used with a first set of load configuration parameters. A different set of sense circuit configuration parameters may specify that they are to be used with a different set of load configuration parameters. Thus, the decision about whether the reference signal needs to be configured or adjusted can be based on both the load configuration parameters and the sense circuit configuration parameters. In some embodiments, the decision about whether to configure the reference signal is yes, by default.

As illustrated by block 664, if the reference signal is to be adjusted, a control signal is sent from the controller to the reference circuit based on the configuration parameters. For example, if the sense circuit configuration parameters indicate that a DC voltage level of the reference signal is to be set at 0.9 volts for the currently connected sensor, then the controller instructs the voltage reference circuit to produce a signal having a DC voltage level of 0.9 volts.

As illustrated by block 667, after the reference signal is configured at block 664, or if the reference voltage will not be configured, a determination is made regarding whether to configure the filter parameters. This decision can also be made based on the configuration parameters obtained by the processing module at block 654. For example, the configuration parameters may indicate that the filter coefficients should be adjusted to have a center frequency of 5 kHz when the frequency of the reference signal is 5 kHz. Similarly, the bandwidth of a bandpass filter may be wider for loads having a non-linear response at a given reference signal frequency.

If the decision to configure filter parameters is no, then the method ends. If the decision to configure filter parameters is yes, the method proceeds to block 668.

As illustrated by block 668, a control signal is sent from the controller to the filter circuit base on the configuration parameters. For example, the controller can send a control signal that alters the filter coefficients of the filter circuit to achieve a center frequency indicated by the configuration parameters.

As used in the preceding figures, a drive sense circuit has the general reference number of 28. When, in a particular figure, the drive sense circuit's reference number has a suffix (e.g., -a, -b, -c, etc.), the reference number with a suffix is referring to a specific embodiment of a drive sense circuit. A specific embodiment of a drive sense circuit includes some or all of the features and/or functions of drive sense circuits having no suffix to its reference number. Further, when a drive sense circuit has a suffix with a letter and a number, this is representative of different sub-embodiments of an embodiment of the drive sense circuit. The same applies for other components in the figures that have a reference number with a suffix.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provide an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items.

As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably" indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in the form of a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A drive-sense circuit module comprising:
at least one regulated source circuit including an output coupled to a load, and to a drive sense input of at least one loop correction circuit, wherein the at least one regulated source circuit generates a power signal, and wherein the power signal has a regulated characteristic and a controlled characteristic;
at least one reference circuit coupled to apply a reference signal to a reference input of the at least one loop correction circuit, wherein the reference signal establishes a reference value of the controlled characteristic;
the at least one loop correction circuit configured to:
sense an effect of one or more load characteristics on a sensed value of the controlled characteristic of the power signal at the drive sense input;
generate a comparison signal based on the sensed value of the controlled characteristic and the reference value of the controlled characteristic;
generate a regulation signal based on the comparison signal; and
apply the regulation signal to a regulation input of the at least one regulated source circuit, wherein the at least one regulated source circuit regulates the regulated characteristic of the power signal based on the regulation signal; and a control module including a processor, the control module configured to control the at least one regulated source circuit and the at least one loop correction circuit to iterate through a plurality of different regulated characteristics and different controlled characteristics.

2. The drive-sense circuit module of claim 1, further comprising:
a plurality of regulated source circuits, each of the plurality of regulated source circuits configured to generate a different regulated drive-signal having a different regulated characteristic and a different controlled characteristic; and
wherein the control module is configured to selectively activate different regulated source circuits during different iterations.

3. The drive-sense circuit module of claim 1, further comprising:
a plurality of reference circuits, each of the plurality of reference circuits configured to generate a different reference signal that establishes a different reference value of a different controlled characteristic; and
wherein the control module is configured to selectively activate different reference circuits during different iterations.

4. The drive-sense circuit module of claim 1, further comprising:
a plurality of loop-correction circuits, each of the plurality of loop-correction circuits configured to generate a different regulation signal; and
wherein the control module is configured to selectively activate different loop-correction circuits during different iterations.

5. The drive-sense circuit module of claim 1, further comprising:
a processing module configured to generate response parameters based on the comparison signal; and
store the response parameters.

6. The drive-sense circuit module of claim 5, further comprising:
an analog-to-digital converter configured to convert the comparison signal to a digital data;
a digital filter configured to filter the digital data; and
wherein the processing module is further configured to adjust the digital filter based on the response parameters.

7. The drive-sense circuit module of claim 5, wherein:
the load includes a sensor; and
the processing module is further configured to select a sensing configuration based on the response parameters.

8. The drive-sense circuit module of claim 1, wherein:
the different regulated characteristics, the different controlled characteristics, and the one or more load characteristics are selected from a group consisting essentially of current, voltage, resistance, reactance, impedance, and frequency.

9. A method comprising:
(a) applying a regulated drive-signal to a sense input of a drive-sense circuit module and to a load, wherein the regulated drive-signal has a regulated electrical characteristic controlled by a controlled electrical characteristic;
(b) applying a reference signal to a reference input of the drive-sense circuit module, wherein the reference signal establishes a reference value of the controlled electrical characteristic;
(c) generating a comparison signal based on a comparison of a value of the controlled electrical characteristic present at the sense input of the drive-sense circuit module with the reference value of the controlled electrical characteristic;
(d) generating a regulation signal based on the comparison signal;
(e) regulating the regulated drive-signal based on the regulation signal; and
(f) repeating (a)-(e) using a plurality of different regulated electrical characteristics and different controlled electrical characteristics; and
(g) determining effects of the plurality of different regulated electrical characteristics on one or more load electrical characteristics.

10. The method of claim 9, further comprising:
selecting a load configuration based on the effects of the plurality of different regulated electrical characteristics on the one or more load electrical characteristics.

11. The method of claim 9, further comprising:
tuning the drive-sense circuit module based on the effects of the plurality of different regulated electrical characteristics on the one or more load electrical characteristics.

12. The method of claim 9, further comprising:
generating adjustment parameters based on the effects of the plurality of different regulated electrical characteristics on the one or more load electrical characteristics; and
applying the adjustment parameters to other circuits including other loads having electrical characteristics matching the one or more load electrical characteristics.

13. The method of claim 9, wherein:
wherein the load includes a sensor, and the drive-sense circuit module outputs sensed data;
generating sensor parameters based on the effects of the plurality of different regulated electrical characteristics on the one or more load electrical characteristics; and
evaluating the sensed data based, at least in part, on the sensor parameters.

14. The method of claim 9, further comprising:
generating filter parameters based on the effects of the plurality of different regulated electrical characteristics on the one or more load electrical characteristics; and
filtering outputs of the drive-sense circuit module based on the filter parameters.

15. The method of claim 9, wherein:
the different regulated electrical characteristics, the different controlled electrical characteristics, and the one or more load electrical characteristics are selected from a group consisting essentially of current, voltage, resistance, reactance, impedance, and frequency.

16. A sensing circuit comprising:
a load having load electrical characteristics; and
a drive-sense circuit module including a sense input coupled to the load, the drive-sense circuit module configured to provide a regulated drive-signal to the load via the sense input, wherein the regulated drive-signal has a regulated electrical characteristic controlled by a controlled electrical characteristic, and wherein the load electrical characteristics, the regulated electrical characteristic and the controlled electrical characteristic are interdependent;

the drive-sense module circuit further including a reference input configured to receive a reference signal that establishes a reference value of the controlled electrical characteristic;

the drive-sense circuit module is further configured to generate an output signal based on a comparison of a value of the controlled electrical characteristic at the sense input with the reference value of the controlled electrical characteristic;

a controller, including a processor, coupled to the drive-sense circuit module and configured to control the drive-sense circuit module to iteratively generate different regulated drive-signals using different combinations of regulated electrical characteristics and controlled electrical characteristics, wherein the different combinations of regulated electrical characteristics and controlled electrical characteristics cause the drive-sense circuit module to generate different output signals during different iterations; and a processing module configured to:
  generate response parameters based on the different output signals; and
  store the response parameters.

17. The sensing circuit of claim 16, further comprising:
  an analog-to-digital converter coupled to an output of the drive-sense circuit module, and configured to convert the different output signals to digital data;
  a digital filter configured to filter the digital data; and
  wherein the processing module is further configured to adjust the digital filter based on the response parameters.

18. The sensing circuit of claim 16, wherein the processing module is further configured to:
  select a sensing configuration to use with the load, based on the response parameters.

19. The sensing circuit of claim 18, wherein selecting the sensing configuration to use with the load includes:
  selecting a particular regulated electrical characteristic and a particular controlling electrical characteristic corresponding to a particular output signal having a lowest signal to noise ratio.

20. The sensing circuit of claim 16, wherein the processing module is further configured to:
  evaluating a particular output signal using response parameters associated with a current configuration of the sensing circuit.

* * * * *